(12) United States Patent
Matsuoka et al.

(10) Patent No.: US 7,050,331 B2
(45) Date of Patent: May 23, 2006

(54) SEMICONDUCTOR MEMORY DEVICE AND PORTABLE ELECTRONIC APPARATUS

(75) Inventors: Nobuaki Matsuoka, Tenri (JP); Masaru Nawaki, Nara (JP); Yoshinao Morikawa, Ikoma (JP); Hiroshi Iwata, Nara (JP); Akihide Shibata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/851,709

(22) Filed: May 20, 2004

(65) Prior Publication Data

US 2005/0041472 A1 Feb. 24, 2005

(30) Foreign Application Priority Data

May 20, 2003 (JP) .............................. 2003-141752

(51) Int. Cl.
*G11C 16/04* (2006.01)
(52) U.S. Cl. .................... 365/185.05; 365/189.05; 257/315; 257/316
(58) Field of Classification Search ........... 365/185.05, 365/189.05, 189.01; 257/315, 316
See application file for complete search history.

(56) References Cited

U.S. PATENT DOCUMENTS

| | | | | |
|---|---|---|---|---|
| 5,424,979 A | * | 6/1995 | Morii | ..................... 365/185.28 |
| 5,509,134 A | | 4/1996 | Fandrich et al. | |
| 5,541,886 A | * | 7/1996 | Hasbun | .................. 365/185.03 |
| 5,692,138 A | * | 11/1997 | Fandrich et al. | ............ 710/305 |

* cited by examiner

*Primary Examiner*—Son T. Dinh
(74) *Attorney, Agent, or Firm*—Morrison & Foerster LLP

(57) ABSTRACT

The present invention provides a semiconductor memory device including a memory cell array in which a plurality of memory cells are arranged, a user interface circuit including a command queue having a logic circuit for accepting commands issued by an external user and generating a program memory address, and an array control circuit having a microcontroller and a program memory for storing therein an execution code, and executing an operation on the memory cell array, wherein the memory cell includes a gate electrode formed over a semiconductor layer via a gate insulating film, a channel region disposed below the gate electrode, diffusion regions disposed on both sides of the channel region and having a conductive type opposite to that of the channel region, and memory functional elements formed on both sides of the gate electrode and having the function of retaining charges.

12 Claims, 30 Drawing Sheets

| command code | offset vector | operation |
|---|---|---|
| 20 | 17 | erasing one block |
| 40 | 1F | byte/word program |

FIG.25

SEMICONDUCTOR MEMORY DEVICE AND PORTABLE ELECTRONIC APPARATUS

BACKGROUND OF THE INVENTION

1. Field of the Invention

The present invention relates to a semiconductor memory device, a display and a portable electronic apparatus. More specifically, the present invention relates to a semiconductor memory device in which field-effect transistors each including a memory functional element having the function of retaining charges or polarization are arranged, and to a display and a portable electronic apparatus each having such a semiconductor memory device.

2. Description of the Related Art

Conventionally, a flash memory is typically used as a nonvolatile memory.

In a flash memory, as shown in FIG. 29, a floating gate 902, an insulating film 907 and a word line (control gate) 903 are formed in this order on a semiconductor substrate 901 via a gate insulating film. On both sides of the floating gate 902, a source line 904 and a bit line 905 are formed by a diffusion region, thereby configuring a memory cell. A device isolation region 906 is formed around the memory cell (see, for example, JP-A 05-304277 (1993)).

The memory cell stores information in accordance with an amount of charges in the floating gate 902. In a memory cell array configured by arranging memory cells, by selecting a specific word line and a specific bit line and applying a predetermined voltage, an operation of rewriting/reading a desired memory cell can be performed.

In such a flash memory, when the amount of charges in the floating gate changes, a drain current (Id)-gate voltage (Vg) characteristic as shown in FIG. 30 is exhibited. When the amount of negative charges in the floating gate increases, the threshold increases and the Id-Vg curve shifts almost in parallel in the Vg increasing direction.

In such a flash memory, however, the insulting film 907 which separates the floating gate 902 from the word line 903 is necessary from the viewpoint of functions and, in order to prevent leakage of charges from the floating gate 902, it is difficult to reduce the thickness of the gate insulating film. Consequently, it is difficult to effectively reduce the thickness of the insulating film 907 and the gate insulating film, and it disturbs reduction in the size of the memory cell.

SUMMARY OF THE INVENTION

The present invention has been achieved in consideration of the problems, and its object is to provide a finer semiconductor memory device and a portable electronic apparatus.

In order to achieve the above object, a semiconductor memory device according to the present invention includes: a memory cell array in which memory cells are arranged in a matrix; a user interface circuit for accepting a command issued by an external user; and an array control circuit for executing an operation on the memory cell array, wherein the user interface circuit includes a command queue having a storage circuit for storing therein the accepted command and a logic circuit for generating a program memory address, the array control circuit is connected to the user interface circuit to receive the program memory address from the user interface circuit, and includes a microcontroller and a program memory, the program memory can be programmed by the external user to construct a code which can be selectively executed by the microcontroller, the program memory address specifies location of a code to be executed by the microcontroller in the program memory, the microcontroller executes an operation corresponding to the code in the program memory onto the memory cell array, and the memory cell includes a gate electrode formed over a semiconductor layer via a gate insulating film, a channel region disposed below the gate electrode, diffusion regions disposed on both sides of the channel region and having a conductive type opposite to that of the channel region, and memory functional elements formed on both sides of the gate electrode and having the function of retaining charges.

Further, in the semiconductor memory device according to the present invention, the user interface circuit includes a command state machine for accepting the command to be executed, and the command state machine activates the array control circuit to receive the program memory address for executing the command and the code.

In the semiconductor memory device according to the present invention, the user interface circuit includes a jump table for specifying an offset vector into the program memory in the array control circuit for each of commands executed by the array control circuit, and the offset vector instructs the location of the code to be executed in response to the command.

Further, the semiconductor memory device according to the present invention further includes at least one page buffer for receiving a code to be executed by the array control circuit in order to update the program memory and temporarily storing the code.

In the semiconductor memory device according to the present invention, the commands include at least a command related to operation of programming/erasing data to/from the memory cell array.

In the semiconductor memory device according to the present invention, the memory cell includes a gate electrode formed over a semiconductor layer via a gate insulating film, a channel region disposed below the gate electrode, diffusion regions disposed on both sides of the channel region and having a conductive type opposite to that of the channel region, and memory functional elements formed on both sides of the gate electrode and having the function of retaining charges. A memory function of the memory functional element and a transistor operation function of the gate insulating film are separated from each other. Consequently, it is easy to suppress the short channel effect by thinning the gate insulating film while maintaining the sufficient memory function. Further, a value of current flowing between the diffusion regions changes by rewriting more largely than that in the case of an EEPROM. Therefore, it facilitates discrimination between the programming state and the erasing state of the semiconductor memory device.

Further, the memory cell in the semiconductor memory device according to the present invention can be formed by a process which is very compatible with a normal transistor forming process on the basis of the configuration. Therefore, as compared with the case of using a conventional flash memory as a nonvolatile memory cell and configuring the semiconductor memory device having a peripheral circuit which is usually made by a transistor, the number of masks and the number of processes can be dramatically reduced. Consequently, the yield in manufacturing of the semiconductor memory device having both the memory cell and the peripheral circuit can be improved. Accordingly, the manufacturing cost is reduced and a very-reliable, cheap semiconductor memory device can be obtained.

Further, the present invention can provide a semiconductor memory device having the high degree of freedom in use and application and realizing largely improved throughput of operations to be processed as a whole. Overhead of a microprocessor using the semiconductor memory device according to the present invention can be minimized, and there is no fear of erroneous operations and over-erasure of a memory cell array. Components of the semiconductor memory device according to the present invention cooperate with each other, thereby providing all of functions for operations of the memory cell array.

The user interface circuit of the semiconductor memory device according to the present invention receives an address, a command and data information from an external user such as a microprocessor via a bus and issues a command to the array control circuit. The array control circuit executes an erasing/programming operation specified by the command issued by the user interface circuit. The array control circuit controls voltages (program voltage, erase voltage and the like) for executing the memory cell array operation and a specified operation independently of the user interface circuit. As a result, a very high degree of freedom is achieved, and the user interface circuit can accept various user commands and can control a sequence of a command transferred to the array control circuit so as to be executed. Commands can be pipeline-processed, so that the maximum throughput can be provided. Further, the array control circuit executes an operation on the basis of the code stored in the program memory. Therefore, by simply correcting a microcode in the program memory, a new command can be added and an existing command can be changed without changing hardware.

The present invention also provides a display and a portable electronic apparatus each having the semiconductor memory device.

With such a configuration, in the case of using the semiconductor memory device of the present invention for storing information for correcting variations in display after a display panel is manufactured, uniform picture quality can be obtained in products of the displays. Moreover, the process of simultaneously forming the memory cell and the logic circuit is simple, so that the manufacturing cost can be suppressed and the operation speed can be improved by high-speed reading operation. Thus, the cheap and high-performance display and the portable electronic apparatus can be obtained.

BRIEF DESCRIPTION OF THE DRAWINGS

FIG. 25 is a table showing correspondence among a command (extract), an offset vector of an array control circuit, and corresponding operation in the semiconductor memory device (eleventh embodiment) of the present invention;

DETAILED DESCRIPTION OF THE INVENTION

Figure 1:
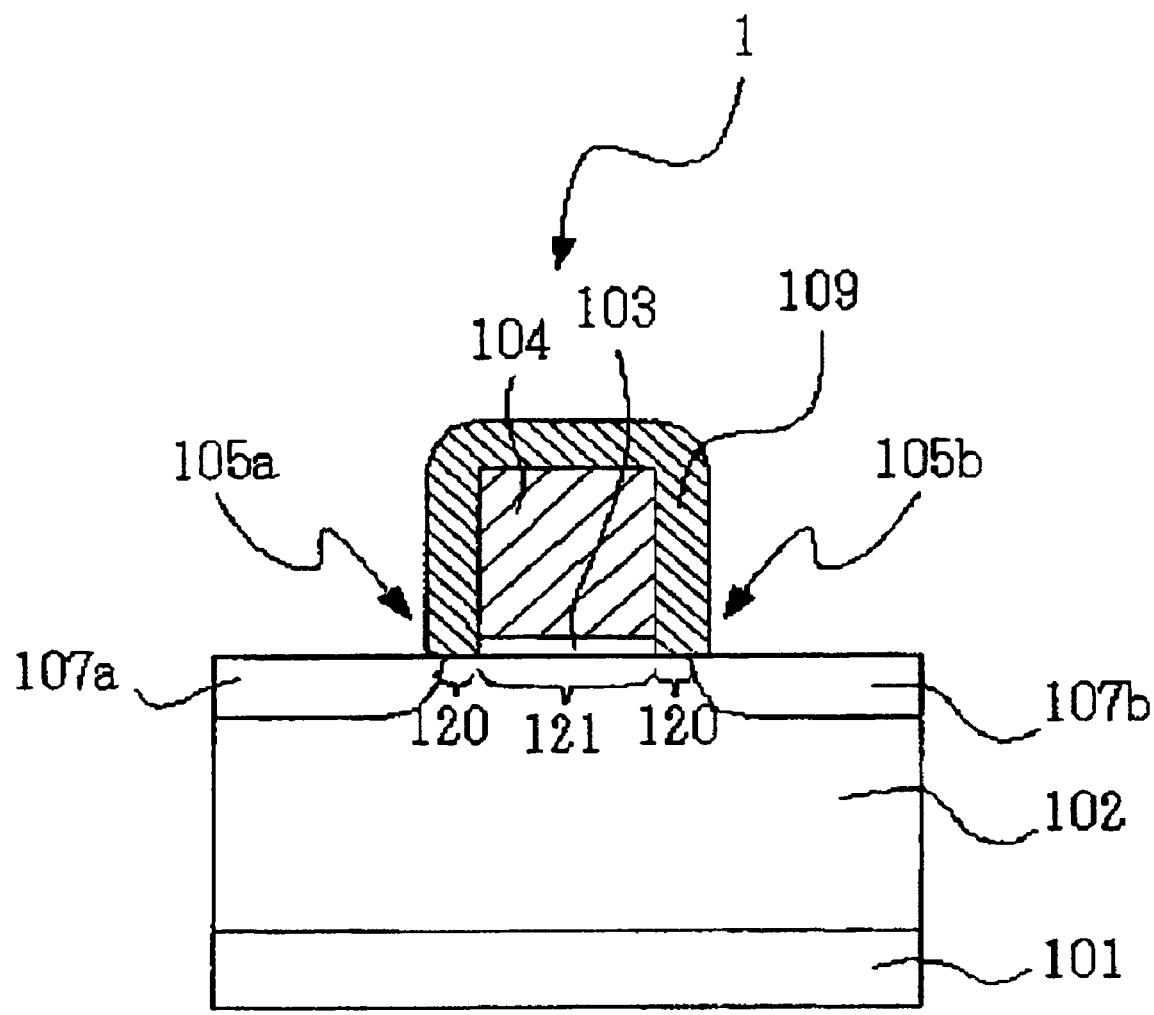
FIG. 1 is a schematic sectional view showing a main part of a memory cell (first embodiment) in a semiconductor memory device of the present invention.

A semiconductor memory device according to the present invention is mainly configured by a memory cell array in which memory cells are arranged in a matrix, a user interface circuit for accepting commands issued by an external user, and an array control circuit for executing an operation on the memory cell array.

A memory cell is mainly configured by a semiconductor layer, a gate insulating film, a gate electrode, a channel region, a diffusion region and a memory functional element. Herein, the channel region is usually a region having the same conductive type as that of the semiconductor layer and denotes a region immediately below the gate electrode. The diffusion region denotes a region having a conductive type opposite to that of the channel region.

Specifically, although the memory cell of the present invention may be configured by a region of a first conductive type as a diffusion region, a region of a second conductive type as a channel region, a memory functional element disposed across the boundary of the regions of the first and second conductive types, and an electrode provided via a gate insulating film, it is proper that the nonvolatile memory cell of the present invention is configured by a gate electrode formed on a gate insulating film, two memory functional elements formed on both sides of the gate electrode, two diffusion regions disposed on the sides of the gate electrode opposite to the memory functional elements, and a channel region disposed below the gate electrode.

Preferably, the semiconductor device of the present invention is formed as the semiconductor layer on the semiconductor substrate, more preferably, on a well region of the first conductive type formed in the semiconductor substrate.

The semiconductor substrate is not particularly limited as long as it can be used for a semiconductor device. For example, a bulk substrate made of an element semiconductor such as silicon or germanium or a compound semiconductor such as silicon germanium, GaAs, InGaAs, ZnSe, or GaN can be mentioned. As a substrate having a semiconductor layer on its surface, various substrates such as an SOI (Silicon on Insulator) substrate, an SOS substrate and a multilayer SOI substrate, or a glass or plastic substrate having thereon a semiconductor layer may be used. In particular, a silicon substrate and an SOI substrate having a silicon layer on its surface are preferable. The semiconductor substrate or semiconductor layer may be single crystal (formed by, for example, epitaxial growth), polycrystal, or amorphous although an amount of current flowing therein varies a little.

On the semiconductor layer, preferably, a device isolation region is formed. Further, a single layer or multilayer structure may be formed by a combination of devices such as a transistor, a capacitor and a resistor, a circuit formed by the devices, a semiconductor device, and an interlayer insulating film. The device isolation region can be formed by any of various device isolation films such as an LOCOS film, a trench oxide film and an STI film. The semiconductor layer may be of the P or N conductive type. In the semiconductor layer, preferably, at least one well region of the first conductive type (P or N type) is formed. As impurity concentration in the semiconductor layer and the well region, impurity concentration which is within a known range in this field can be used. In the case of using the SOI substrate as the semiconductor layer, the well region may be formed in the surface semiconductor layer or a body region may be provided below a channel region.

The gate insulating film is not particularly limited as long as it can be usually used for a semiconductor device. For example, a single-layer film or a multilayer film of an insulating film such as a silicon oxide film or a silicon nitride film, and a high-dielectric-constant film such as an aluminum oxide film, a titanium oxide film, a tantalum oxide film, or a hafnium oxide film can be used. Particularly, a silicon oxide film is preferred. A proper thickness of the gate insulating film is, for example, about 1 to 20 nm, preferably, about 1 to 6 nm. The gate insulating film may be formed only immediately below the gate electrode or formed so as to be larger (wider) than the gate electrode.

The gate electrode is formed in a shape which is usually used for a semiconductor device or a shape having a recess in a lower end on the gate insulating film. Although it is preferable that the gate electrode be formed in an integral form without being separated by a single-layer or multilayer conductive film, the gate electrode may be also disposed in a state where it is separated by a single-layered or multilayer conductive film. The gate electrode may have a sidewall insulating film on its sidewalls. The gate electrode is not particularly limited as long as it is used for a semiconductor device. The gate electrode is formed by a single-layer or multilayer film made by a conductive film, for example, polysilicon, a metal such as copper or aluminum, a high-refractory metal such as tungsten, titanium or tantalum, and a silicide or the like with the high refractory metal. A proper film thickness of the gate electrode is, for example, about 50 to 400 nm. Under the gate electrode, a channel region is formed.

Preferably, the gate electrode is formed only on the sidewalls of the memory functional element or does not cover the top portion of the memory functional element. By such arrangement, a contact plug can be disposed closer to the gate electrode, so that reduction in the size of the memory cell is facilitated. It is easy to manufacture the memory cell having such simple arrangement, so that the yield in manufacturing can be improved.

The memory functional element has at least the function of retaining charges (hereinafter, described as "charge retaining function"). In other words, the memory functional element has the function of accumulating and retaining charges, the function of trapping charges, or the function of holding a charge polarization state. The function is exhibited, for example, when the memory functional element includes a film or region having the charge retaining function. Elements having the function are: silicon nitride; silicon; a silicate glass including impurity such as phosphorus or boron; silicon carbide; alumina; a high dielectric material such as hafnium oxide, zirconium oxide or tantalum oxide; zinc oxide; ferroelectric; metals, and the like. Therefore, the memory functional element can be formed by, for example, a single-layer or multilayer structure of: an insulating film including a silicon nitride film; an insulating film having therein a conductive film or a semiconductor layer; an insulating film including at least one conductor or semiconductor dot; or an insulating film including a ferroelectric film of which inner charge is polarized by an electric field and in which the polarized state is held. Particularly, the silicon nitride film is preferable for the reasons that the silicon nitride film can obtain a large hysteretic characteristic since a number of levels of trapping charges exist. In addition, the charge retention time is long and a problem of charge leakage due to occurrence of a leak path does not occur, so that the retaining characteristics are good. Further, silicon nitride is a material which is normally used in an LSI process.

By using the insulating film including a film having the charge retaining function such as a silicon nitride film as the memory functional element, reliability of retention of information can be increased. Since the silicon nitride film is an insulator, even in the case where a charge leak occurs in part of the silicon nitride film, the charges in the whole silicon nitride film are not lost immediately. In the case of arranging a plurality of sidewall memory cells, even if the distance between the memory cells is shortened and neighboring memory functional elements come into contact with each other, unlike the case where the memory functional elements are made of conductors, information stored in the memory functional elements is not lost. Further, a contact plug can be disposed closer to the memory functional element. In some cases, the contact plug can be disposed so as to overlap with the memory functional element. Thus, reduction in the size of the memory cell is facilitated.

In order to increase the reliability of retention of information, the film having the charge retaining function does not always have to have a film shape. Preferably, films having the charge retaining function exist discretely in an insulating film. Specifically, it is preferable that the films having the charge retaining function in the shape of dots be spread in a material which is hard to retain charges, for example, in a silicon oxide.

In the case of using a conductive film or semiconductor layer as the charge retaining film, preferably, the conductive film or semiconductor layer is disposed via an insulating film so that the charge retaining film is not in direct contact with the semiconductor layer (semiconductor substrate, well region, body region, source/drain regions or diffusion region) or a gate electrode. For example, a lamination structure of the conductive film and the insulating film, a structure in which conductive films in the form of dots are spread in the insulating film, a structure in which the conductive film is disposed in a part of a sidewall insulating film formed on sidewalls of the gate, and the like can be mentioned.

It is preferable to use the insulating film having therein the conductive film or semiconductor layer as a memory functional element for the reason that an injection amount of charges into the conductor or semiconductor can be freely controlled and multiple values can be easily obtained.

Further, it is preferable to use the insulating film including at least one conductor or semiconductor dot as the memory functional element for the reason that it becomes easier to perform programming and erasing by direct tunneling of charges, and reduction in power consumption can be achieved.

Alternatively, as a memory functional element, a ferroelectric film such as PZT or PLZT in which the polarization direction changes according to the electric field may be used. In this case, charges are substantially generated in the surface of the ferroelectric film by the polarization and are held in that state. It is therefore preferable since the ferroelectric film can obtain a hysteresis characteristic similar to that of a film to which charges are supplied from the outside of the film having the memory function and which traps charges. In addition, it is unnecessary to inject charges from the outside of the film in order to retain charges in the ferroelectlic film, and the hysteresis characteristic can be obtained only by the polarization of the charge in the film, so that programming/erasing can be performed at high speed.

As the insulating film configuring the memory functional element, a film having a region of suppressing escape of charges or the function of suppressing escape of charges is appropriate. One of films having the function of suppressing escape of charges is a silicon oxide film.

The charge retaining film included in the memory functional element is disposed on both sides of the gate electrode directly or via an insulating film, and is disposed on the semiconductor layer (semiconductor substrate, well region, body region or source/drain region or diffusion region) directly or via a gate insulating film. Preferably, the charge retaining film on both sides of the gate electrode is formed so as to cover all or part of the sidewails of the gate electrode directly or via the insulating film. In an application example, in the case where the gate electrode has a recess in its lower end, the charge retaining film may be formed so as to completely or partially bury the recess directly or via an insulating film.

The diffusion regions can function as source and drain regions and have the conductive type opposite to that of the semiconductor layer or well region. In the junction between the diffusion region and the semiconductor layer or well region, preferably, impurity concentration is high for the reason that hot electrons or hot holes are generated efficiently with low voltage, and high-speed operation can be performed with lower voltage. The junction depth of the diffusion region is not particularly limited but can be properly adjusted in accordance with the performance or the like of a semiconductor memory device to be obtained. In the case of using an SOI substrate as a semiconductor substrate, the diffusion region may have a junction depth smaller than the thickness of the surface semiconductor layer. Preferably, the diffusion region has junction depth almost the same as the thickness of the surface semiconductor layer.

The diffusion region may be disposed so as to overlap an end of the gate electrode, so as to match an end of the gate electrode, or so as to be offset from the gate electrode end. The case where the diffusion region is offset is particularly preferable because easiness of inversion of the offset region below the charge retaining film largely changes in accordance with an amount of charges accumulated in the memory functional element when voltage is applied to the gate electrode, the memory effect increases, and a short channel effect is reduced. However, when the diffusion region is offset too much, drive current between the diffusion regions (source and drain) decreases conspicuously. Therefore, it is preferable that the offset amount, that is, the distance from one of the gate electrode terminals to the closer diffusion area in the gate length direction be shorter than the thickness of the charge retaining film extending in the direction parallel with the gate length direction. It is particularly important that at least a part of the film or region having the charge retaining function in the memory functional element overlaps with a part of the diffusion region. This is because the essence of the memory cell as a component of the semiconductor memory device of the present invention is to rewrite stored information by an electric field which is applied across the memory functional element in accordance with the voltage difference between the gate electrode which exists only in the sidewall portion of the memory functional element and the diffusion region.

A part of the diffusion region may extend at a level higher than the surface of the channel region, that is, the lower face of the gate insulating film. In this case, it is proper that, on the diffusion region formed in the semiconductor substrate, the conductive film is laminated so as to be integrated with the diffusion region. The conductive film is made of a semiconductor such as polysilicon or amorphous silicon, silicide, the above-mentioned metals, high-refractory metals, or the like. In particular, polysilicon is preferred. Since impurity diffusion speed of polysilicon is much faster than that of the semiconductor layer, it is easy to make the junction depth of the diffusion region in the semiconductor layer shallow and to suppress the short channel effect. In this case, preferably, a part of the diffusion region is disposed so as to sandwich at least a part of the memory functional element in cooperation with the gate electrode.

The memory cell of the present invention can be formed by a normal semiconductor process in accordance with, for example, a method similar to the method of forming the sidewall spacer having the single-layer or multilayer structure on the sidewalls of the gate electrode. Specific examples are: a method of forming the gate electrode, after that, forming a single-layer film or multilayer film including the charge retaining film such as a film having the function of retaining charges (hereinafter, described as "charge retaining film"), charge retaining film/insulating film, insulating film/charge retaining film, or insulating film/charge retaining film/insulating film, and etching back the formed film under proper conditions so as to leave the films in a sidewall spacer shape; a method of forming an insulating film or charge retaining film, etching back the film under proper conditions so as to leave the film in the sidewall spacer shape, further forming the charge retaining film or insulating film, and similarly etching back the film so as to leave the film in the sidewall spacer shape; a method of applying or depositing an insulating film material in which particles made of a charge retaining material are spread on the semiconductor layer including the gate electrode, and etching back the material under proper conditions so as to leave the insulating film material in a sidewall spacer shape; and a method of forming a gate electrode, after that, forming the single-layer film or multilayer film, and patterning the film with a mask. According to another method, before the gate electrode is formed, the charge retaining film, charge retaining film/insulating film, insulating film/charge retaining film, insulating film/charge retaining film/insulating film, or the like is formed. An opening is formed in a region which becomes the channel region of the films, a gate electrode material film is formed on the entire surface, and the gate electrode material film is patterned in a shape including the opening and larger than the opening.

In the case of configuring the memory cell array by arranging memory cells of the present invention, the best mode of the memory cell satisfies all of the following requirements: (1) the gate electrodes of a plurality of memory cells are integrated and have the function of a word line, (2) the memory functional elements are formed on both sides of the word line, (3) an insulator, particularly, a silicon nitride film retains charges in the memory functional element, (4) the memory functional element is configured by an ONO (Oxide Nitride Oxide) film and the silicon nitride film has a surface almost parallel with the surface of the gate insulating film, (5) a silicon nitride film in the memory functional element is isolated from a word line and a channel region by a silicon oxide film, (6) the silicon nitride film in the memory functional element and a diffusion region overlap with each other, (7) the thickness of the insulating film separating the silicon nitride film having the surface which is almost parallel with the surface of the gate insulating film from the channel region or semiconductor layer and the thickness of the gate insulating film are different from each other, (8) an operation of programming/erasing one memory cell is performed by a single word line, (9) there is no electrode (word line) having the function of assisting the programming/erasing operation on the memory functional element, and (10) in a portion in contact with the diffusion region immediately below the memory functional element, a region of high concentration of impurity whose conductive type is opposite to that of the diffusion region is provided. It may be sufficient for the memory cell to satisfy at least one of the requirements.

A particularly preferable combination of the requirements is that, for example, (3) an insulator, particularly, a silicon nitride film holds charges in the memory functional element, (6) the insulating film (silicon nitride film) in the memory functional element and the diffusion region overlap with each other, and (9) there is no electrode (word line) having the function of assisting the programming/erasing operation on the memory functional element.

In the case where the memory cell satisfies the requirements (3) and (9), it is very useful for the following reasons. First, the bit line contact can be disposed closer to the memory functional element on the word line sidewall or even when the distance between memory cells is shortened, a plurality of memory functional elements do not interfere with each other, and stored information can be held. Therefore, reduction in the size of the memory cell is facilitated. In the case where the charge retaining region in the memory functional element is made of a conductor, as the distance between memory cells decreases, interference occurs between the charge retaining regions due to capacitive coupling, so that stored information cannot be held.

In the case where the charge retaining region in the memory functional element is made of an insulator (for example, a silicon nitride film), it becomes unnecessary to make the memory functional element independent for each memory cell. For example, the memory functional elements formed on both sides of a single word line shared by a plurality of sidewall memory cells do not have to be isolated for each memory cell. The memory functional elements formed on both sides of one word line can be shared by a plurality of memory cells sharing the word line. Consequently, a photo etching process for isolating the memory functional element becomes unnecessary, and the manufacturing process is simplified. Further, a margin for positioning in the photolithography process and a margin for film reduction by etching become unnecessary, so that the margin between neighboring memory cells can be reduced. Therefore, as compared with the case where the charge retaining region in the memory functional element is made of a conductor (for example, polysilicon film), even when the memory functional element is formed at the same microfabrication level, a memory cell occupied area can be reduced. In the case where the charge retaining region in the memory functional element is made of a conductor, the photo etching process for isolating the memory functional element for each memory cell is necessary, and a margin for positioning in the photolithography process and a margin for film reduction by etching are necessary.

Moreover, since the electrode having the function of assisting the programming and erasing operations does not exist on the memory functional element and the device structure is simple, the number of processes decreases, so that the yield in manufacturing can be increased. Therefore, it facilitates formation with a transistor as a component of a logic circuit or an analog circuit, and a cheap semiconductor memory device can be obtained.

The present invention is more useful in the case where not only the requirements (3) and (9) but also the requirement (6) are satisfied. Specifically, by overlapping the charge retaining region in the memory functional element with the diffusion region, programming and erasing can be performed with a very low voltage. Specifically, with a low voltage of 5 V or less, the programming and erasing operations can be performed. The action produces a very large effect also from the viewpoint of circuit designing. Since it becomes unnecessary to generate a high voltage in a chip unlike a flash memory, a charge pumping circuit requiring a large occupation area can be omitted or its scale can be reduced. Particularly, when a memory of small-scale capacity is provided for adjustment in a logic LSI, as for an occupied area in a memory, an occupation area of peripheral circuits for driving a memory cell is dominant more than that of a memory cell. Consequently, omission or down sizing of the charge pumping circuit for a memory cell is most effective to reduce the chip size.

On the other hand, in the case where the requirement (3) is not satisfied, that is, in the case where a conductor retains charges in the memory functional element, even if the requirement (6) is not satisfied, specifically, even if the conductor in the memory functional element and the diffusion region do not overlap with each other, programming operation can be performed. This is because that the conductor in the memory functional element assists programming operation by capacitive coupling with the gate electrode.

In the case where the requirement (9) is not satisfied, specifically, in the case where the electrode having the function of assisting the programming and erasing operations exists on the memory functional element, even if the requirement (6) is not satisfied, specifically, even if the insulator in the memory functional element and the diffusion region do not overlap with each other, programming operation can be performed.

In the semiconductor memory device of the present invention, a transistor may be connected in series with one of or both sides of a memory cell, or the memory cell may be mounted on the same chip with a logic transistor. In such a case, the semiconductor device of the present invention, particularly, the memory cell can be formed by a process having high compatibility with a process of forming a normal standard transistor such as a transistor or a logic transistor, so that they can be formed simultaneously. Therefore, a process of forming both the memory cell and a transistor or a logic transistor is very simple and, as a result, a cheap embedding device can be obtained.

In the semiconductor memory device of the present invention, the memory cell can store information of two or more values in one memory functional element. Thus, the memory cell can function as a memory cell for storing information of four or more values. The memory cell may store binary data only. The memory cell is also allowed to function as a memory cell having the functions of both a selection transistor and a memory transistor by a variable resistance effect of the memory functional element.

The semiconductor memory device of the present invention can be widely applied by being combined with a logic device, a logic circuit or the like to: a data processing system such as a personal computer, a note-sized computer, a laptop computer, a personal assistant/transmitter, a mini computer, a workstation, a main frame computer, a multiprocessor/ computer, or a computer system of any other type; an electronic component configuring the data processing system, such as a CPU, a memory or a data memory device; a communication apparatus such as a telephone, a PHS, a modem or a router; an image display apparatus such as a display panel or a projector; a business apparatus such as a printer, a scanner or a copier; an image pickup apparatus such as a video camera or a digital camera; an entertainment apparatus such as a game machine or a music player; an information apparatus such as a portable information terminal, a watch or an electronic dictionary; a vehicle-mounted apparatus such as a car navigation system or a car audio system; an AV apparatus for recording/reproducing information such as a motion picture, a still picture or music; an appliance such as a washing machine, a microwave, a refrigerator, a rice cooker, a dish washer, a vacuum cleaner or an air conditioner; a health managing apparatus such as a massage machine, a bathroom scale or a manometer; and an electronic apparatus such as a portable memory device such as an IC card or a memory card. Particularly, it is effective to apply the semiconductor memory device to portable electronic apparatuses such as portable telephone, portable information terminal, IC card, memory card, portable computer, portable game device, digital camera, portable motion picture player, portable music player, electronic dictionary and watch. The semiconductor memory device of the present invention may be provided as at least a part of a control circuit or a data storing circuit of an electronic apparatus or, if necessary, detachably assembled.

Embodiments of the semiconductor memory device, the display and the portable electronic apparatus according to the present invention will be described below with reference to the drawings.

FIRST EMBODIMENT

A semiconductor memory device of a first embodiment has a memory cell 1 as shown in FIG. 1.

The memory cell 1 has a gate electrode 104 formed on a P-type well region 102 formed on the surface of a semiconductor substrate 101 via a gate insulating film 103. On the top face and side faces of the gate electrode 104, a silicon nitride film 109 having a trap level of retaining charges and serving as a charge retaining film is disposed. In the silicon nitride film 109, parts of both sidewalls of the gate electrode 104 serve as memory functional elements 105*a* and 105*b* for actually retaining charges. The memory functional element refers to a part in which charges are actually accumulated by rewriting operation in the memory functional element or the charge retaining film. In the P-type well region 102 on both sides of the gate electrode 104, N-type diffusion regions 107*a* and 107*b* functioning as a source region and a drain region, respectively, are formed. Each of the diffusion regions 107*a* and 107*b* has an offset structure. Specifically, the diffusion regions 107*a* and 107*b* do not reach a region 121 below the gate electrode 104, and offset regions 120 below the charge retaining film configure a part of the channel region.

Figure 2A:
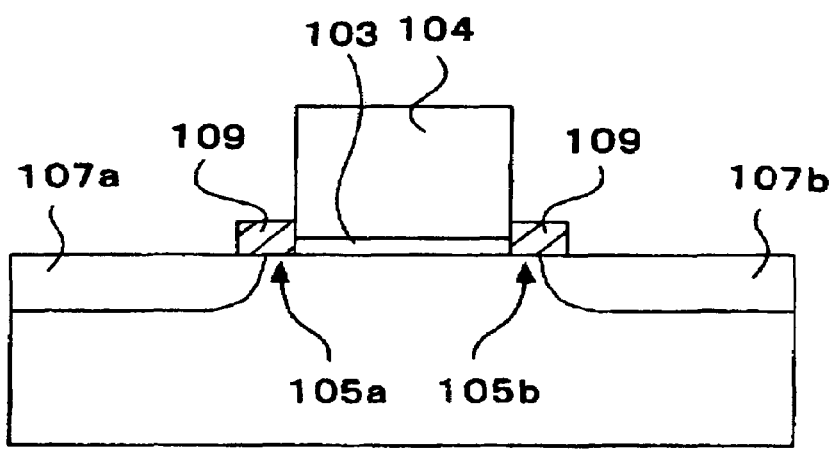
FIGS. 2A and 2B are schematic sectional views each showing a main part of a modification of the memory cell (first embodiment) in the semiconductor memory device of the present invention.
Figure 2B:
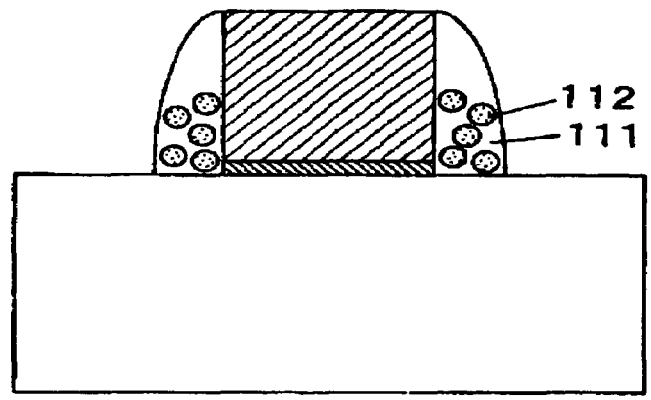

The memory functional elements 105*a* and 105*b* for substantially retaining charges are side wall parts of the gate electrode 104. Therefore, it is sufficient that the silicon nitride film 109 is formed only in regions corresponding to the parts (see FIG. 2A). The memory functional elements 105*a* and 105*b* may have a structure in which particles 111 made of conductor or semiconductor having a nanometer size are distributed in an insulating film 112 (see FIG. 2B). When the size of the particle 111 is less than 1 nm, the quantum effect is too large and it becomes difficult for charges to tunnel dots. When the size exceeds 10 nm, however, a noticeable quantum effect does not appear at room temperature. Therefore, the diameter of the particle 111 lies preferably in the range from 1 nm to 10 nm. Further, the silicon nitride film 109 serving as a charge retaining film may be formed in the side wall spacer shape on side faces of the gate electrode (see FIG. 3).

The principle of the programming operation of the memory cell will be described with reference to FIGS. 3 and 4. The case where whole memory functional elements 131a and 131b have the function of retaining charges will be described. "Programming" denotes here injection of electrons into the memory functional elements 131a and 131b when the memory cell is of the N channel type. Hereinafter, on assumption that the memory cell is of the N channel type, description will be given.

Figure 3:
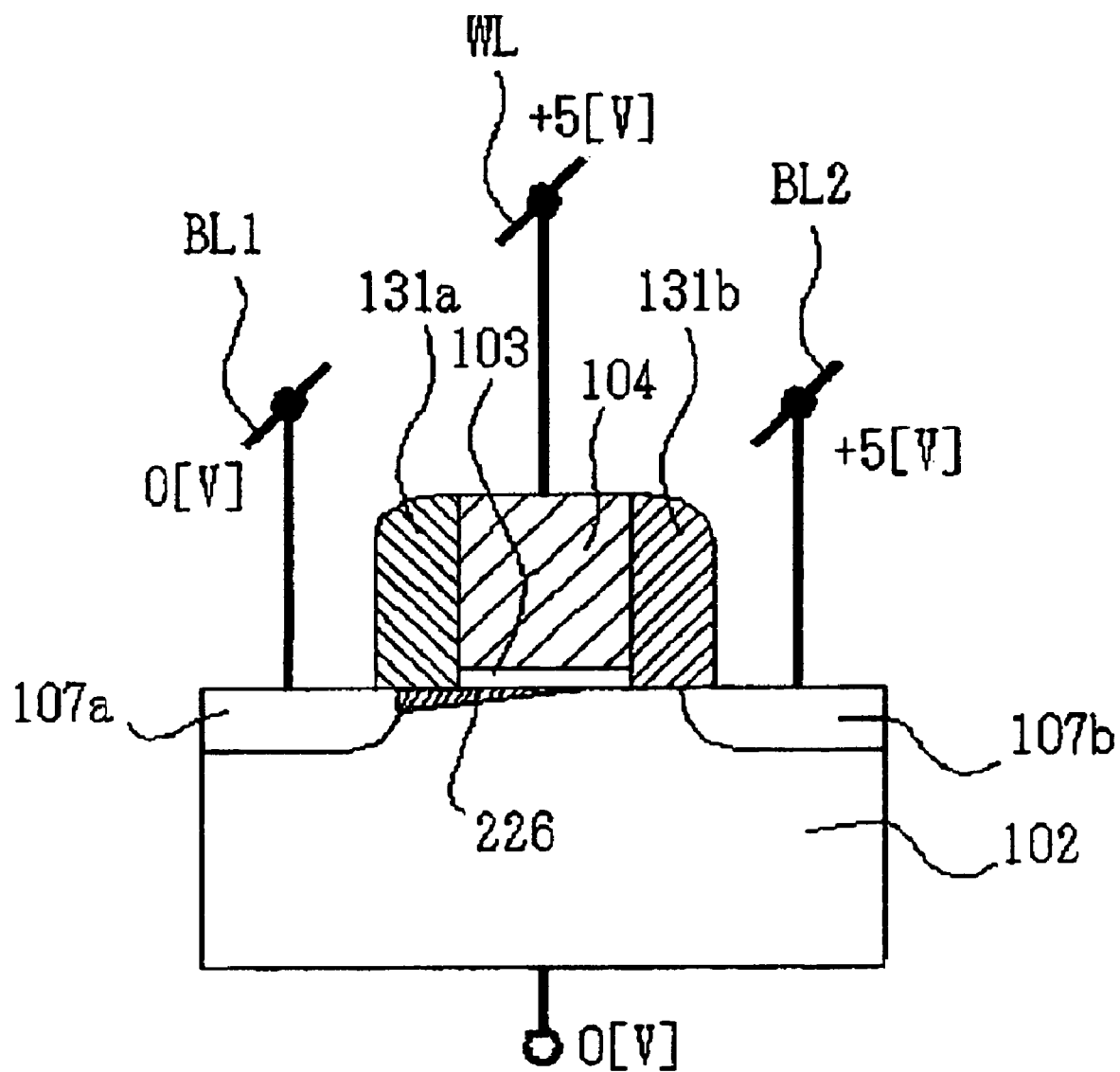
FIG. 3 is a diagram showing a programming operation of the memory cell (first embodiment) in the semiconductor memory device of the present invention.

In order to inject electrons (to program) into the second memory functional element 131b, as shown in FIG. 3, the first diffusion region 107a of the N-type is set as the source electrode, and the second diffusion region 107b of the N-type is set as the drain electrode. For example, 0 V is applied to the first diffusion region 107a and the P-type well region 102, +5 V is applied to the second diffusion region 107b, and +5 V is applied to the gate electrode 104. With such voltage parameters, an inversion layer 226 extends from the first diffusion region 107a (source electrode), but does not reach the second diffusion region 107b (drain electrode), so that a pinch-off point is generated. Electrons are accelerated from the pinch-off point to the second diffusion region 107b (drain electrode) by high electric field and become so-called hot electrons (conductive electrons of high energy). The hot electrons are injected into the second memory functional element 131b, thereby performing programming. Since hot electrons are not generated in the vicinity of the first memory functional element 131a, programming is not performed.

Figure 4:
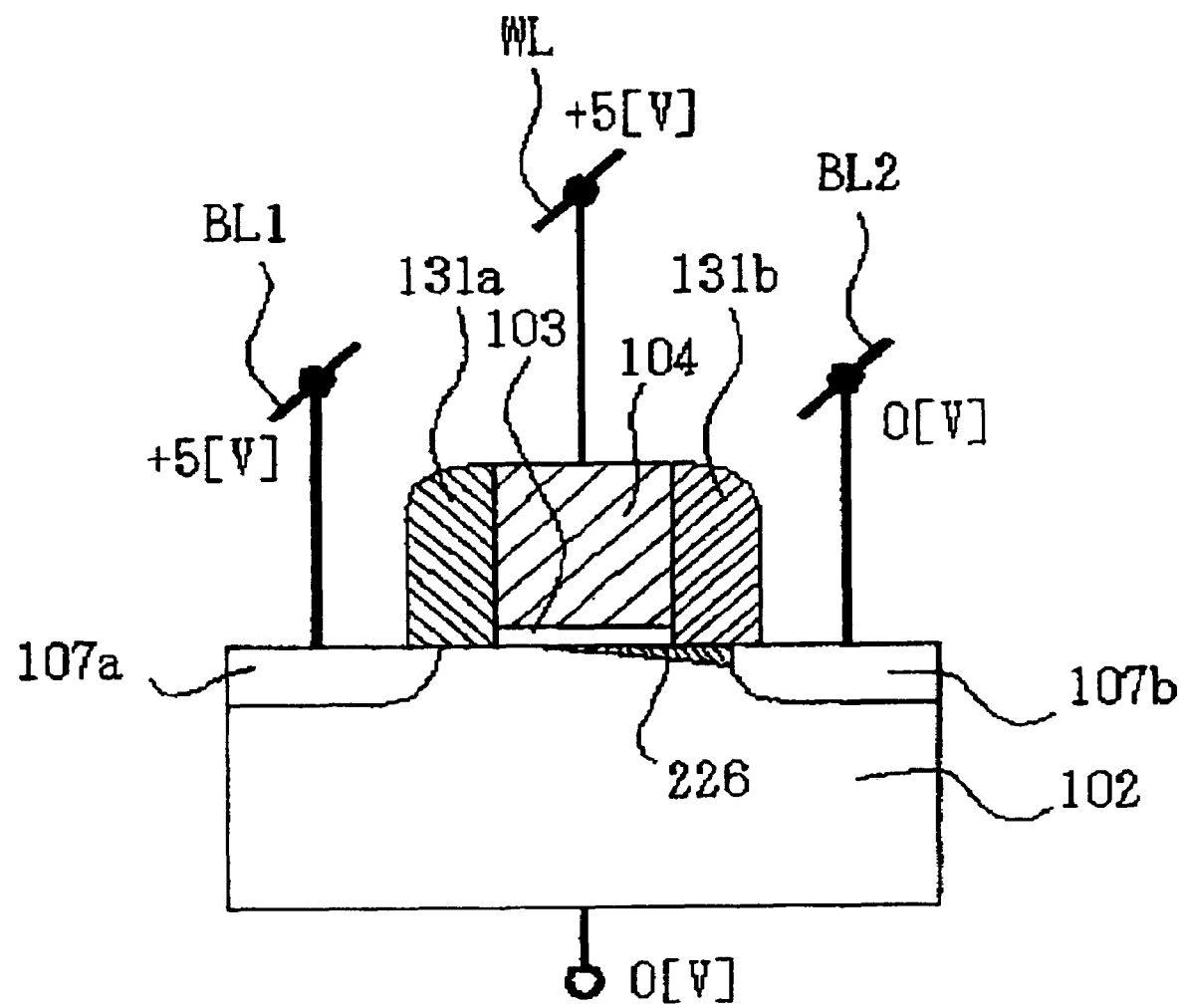
FIG. 4 is a diagram showing the programming operation of the memory cell (first embodiment) in the semiconductor memory device of the present invention.

On the other hand, in order to inject electrons (to program) into the first memory part 131a, as shown in FIG. 4, the second diffusion region 107b is set as the source electrode, and the first diffusion region 107a is set as the drain electrode. For example, 0 V is applied to the second diffusion region 107b and the P-type well region 102, +5 V is applied to the first diffusion region 107a, and +5 V is applied to the gate electrode 104. As described above, by interchanging the source and drain regions in the case of injecting electrons into the second memory functional element 131b, programming can be performed by injecting electrons into the first memory functional element 131a.

The principle of erasing operation of the memory cell will now be described with reference to FIGS. 5 and 6.

Figure 5:
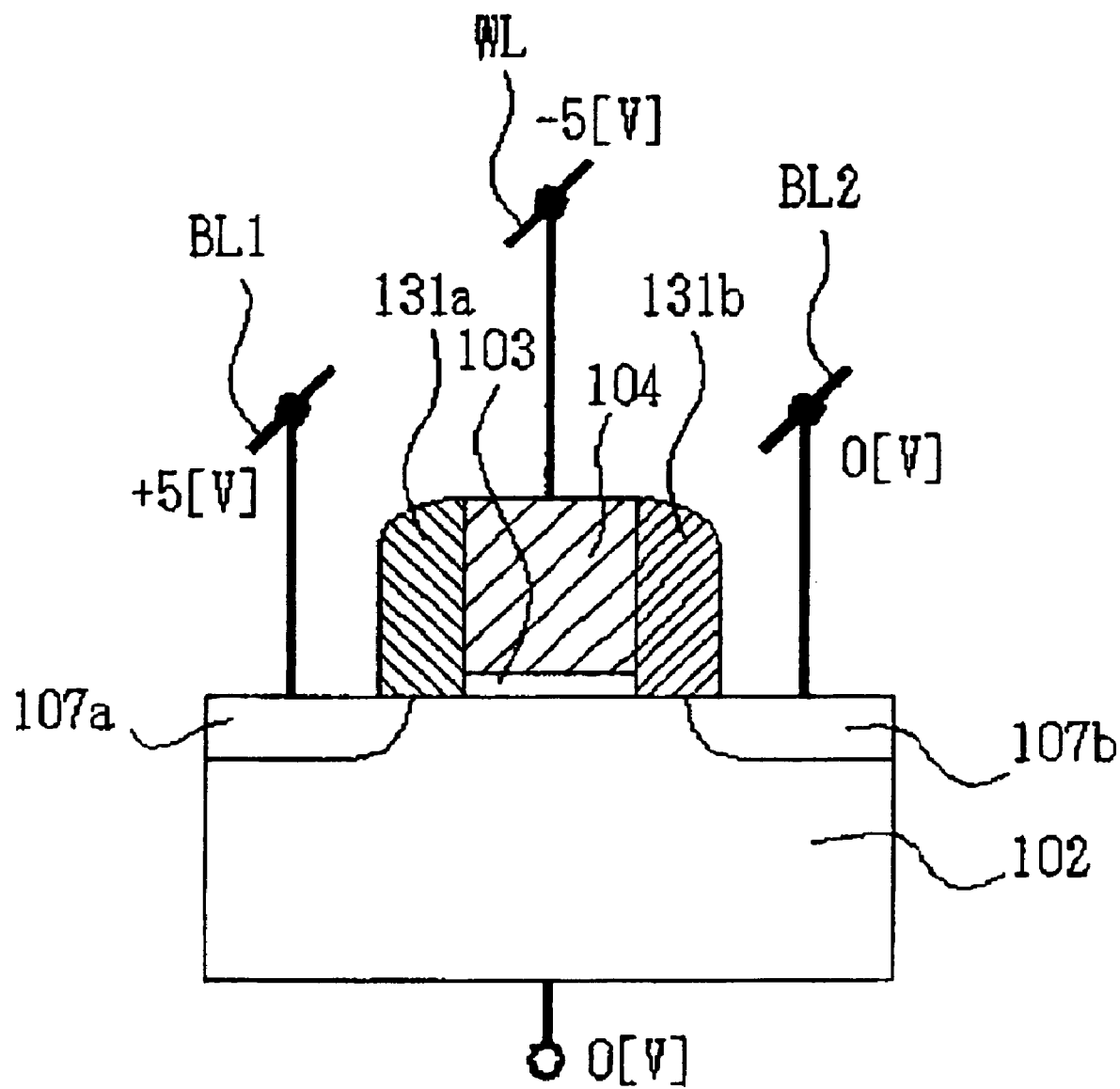
FIG. 5 is a diagram showing an erasing operation of the memory cell (first embodiment) in the semiconductor memory device of the present invention.

In a first method of erasing information stored in the first memory functional element 131a, as shown in FIG. 5, a positive voltage (for example, +5 V) is applied to the first diffusion region 107a, 0 V is applied to the P-type well region 102, a backward bias is applied to the PN junction between the first diffusion region 107a and the P-type well region 102, and a negative voltage (for example, −5 V) is applied to the gate electrode 104. At this time, in the vicinity of the gate electrode 104 in the PN junction, due to the influence of the gate electrode to which the negative electrode is applied, the gradient of potential becomes particularly sharp. Due to this, hot holes (positive holes of high energy) are generated on the side of the P-type well region 102 in the PN junction by interband tunneling. The hot holes are attracted by the gate electrode 104 having the negative potential and, as a result, holes are injected into the first memory functional element 131a. In such a manner, information in the first memory functional element 131a is erased. At this time, it is sufficient to apply 0 V to the second diffusion region 107b.

In the case of erasing information stored in the second memory functional element 131b, it is sufficient to interchange the potential in the first diffusion region and the potential in the second diffusion region in the above example.

Figure 6:
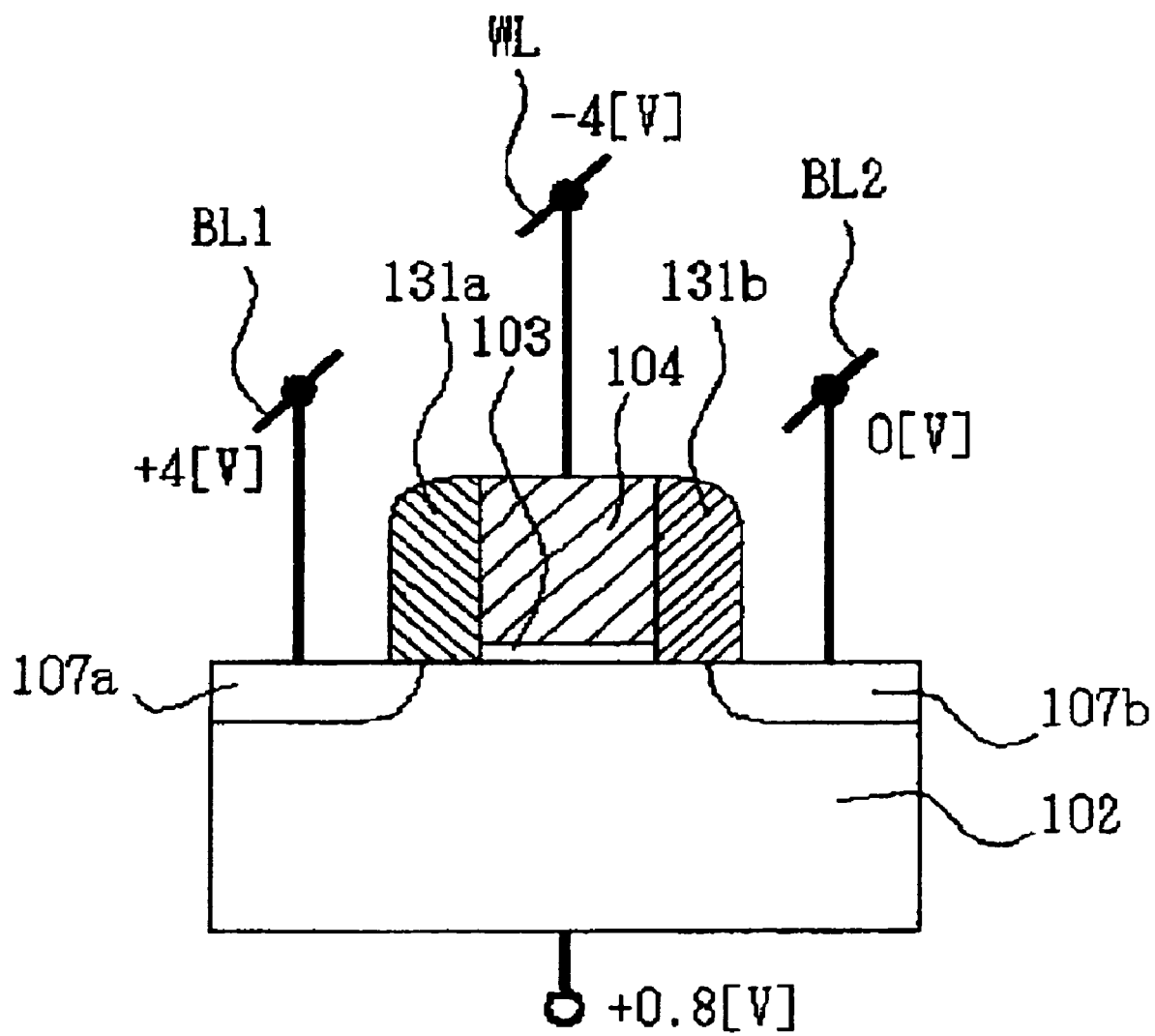
FIG. 6 is a diagram showing the erasing operation of the memory cell (first embodiment) in the semiconductor memory device of the present invention.

According to a second method of erasing information stored in the first memory functional element 131a, as shown in FIG. 6, a positive voltage (for example, +4 V) is applied to the first diffusion region 107a, 0 V is applied to the second diffusion region 107b, a negative voltage (for example, −4 V) is applied to the gate electrode 104, and a positive voltage (for example, +0.8 V) is applied to the P-type well region 102. At this time, a forward voltage is applied between the P-type well region 102 and the second diffusion region 107b, and electrons are injected into the P-type well region 102. The injected electrons are diffused to the PN junction between the P-type well region 102 and the first diffusion region 107a and accelerated by the high electric field, thereby becoming hot electrons. The hot electrons generate electron-hole pairs in the PN junction. To be specific, by applying a forward voltage between the P-type well region 102 and the second diffusion region 107b, electrons injected in the P-type well region 102 become a trigger and hot holes are generated in the PN junction positioned on the opposite side. The hot holes generated in the PN junction are attracted by the gate electrode 104 and, as a result, positive holes are injected into the first memory functional element 131a.

According to the method, also in the case where only a voltage insufficient to generate hot holes by interband tunneling is applied in the PN junction between the P-type well region and the first diffusion region 107a, electrons injected in the second diffusion region 107b become a trigger of generating the electron-hole pairs in the PN junction, and hot holes can be generated. Therefore, a voltage in the erasing operation can be decreased. Particularly, when the offset region 120 (see FIG. 1) exists, an effect that the gradient of potential in the PN junction becomes sharp by the gate electrode to which a negative potential is applied is small. Consequently, it is difficult to generate hot holes by the interband tunneling. The second method overcomes the drawback and can realize the erasing operation with a low voltage.

In the case of erasing information stored in the first memory functional element 131a, according to the first erasing method, +5 V has to be applied to the first diffusion region 107a. According to the second erasing method, +4 V is sufficient. As described above, according to the second method, the voltage in the erasing operation can be decreased, so that power consumption can be reduced and deterioration in the memory cell due to hot carriers can be suppressed.

In any of the erasing methods, over-erasure does not occur easily in the memory cell. The over-erasure here denotes a phenomenon that as the amount of positive holes accumulated in the memory functional element increases, the threshold decreases without saturation. The over-erasure is a big issue in an EEPROM typified by a flash memory. Particularly, in the case where the threshold becomes negative, critical malfunctioning that selection of a memory cell becomes impossible occurs. On the other hand, in the memory cell in the semiconductor memory device of the present invention, also in the case where a large amount of positive holes are accumulated in the memory functional element, only electrons are induced below the memory functional element, but an influence is hardly exerted to the potential in the channel region below the gate insulating film. Since the threshold at the time of erasing is determined by the potential below the gate insulating film, occurrence of over-erasure is suppressed.

Figure 7:
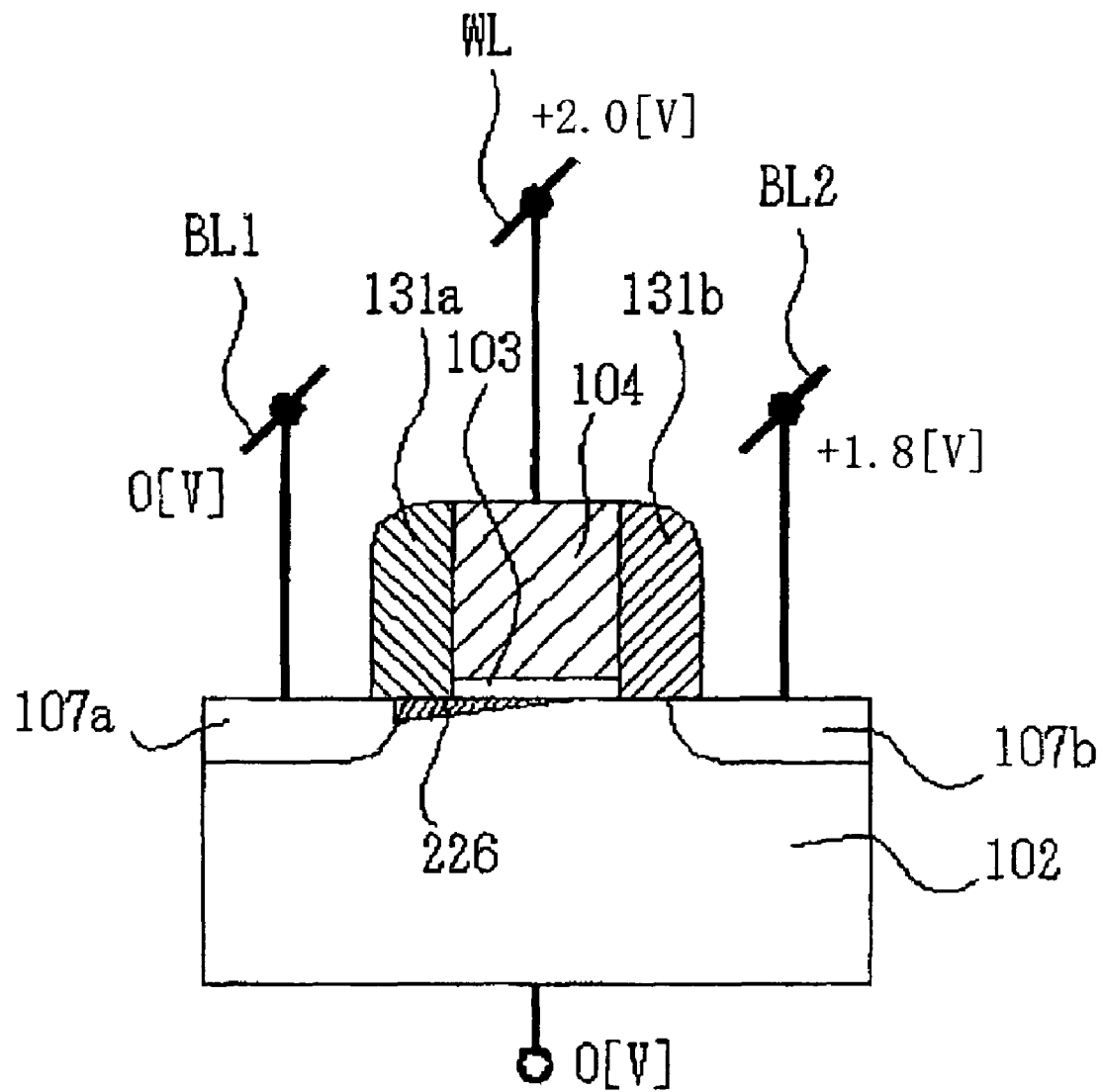
FIG. 7 is a diagram showing a reading operation of the memory cell (first embodiment) in the semiconductor memory device of the present invention.

Further, the principle of reading operation of the memory cell will be described with reference to FIG. 7.

In the case of reading information stored in the first memory functional element 131a, a transistor is operated in a saturation region by using the first diffusion region 107a as a source electrode and using the second diffusion region 107b as a drain electrode. For example, 0 V is applied to the first diffusion region 107a and the P-type well region 102, +1.8 V is applied to the second diffusion region 107b, and +2 V is applied to the gate electrode 104. In the case where no electrons are accumulated in the first memory functional element 131a at this time, drain current tends to flow. On the other hand, in the case where electrons are accumulated in the first memory functional element 131a, an inversion layer is not easily formed in the vicinity of the first memory functional element 131a, so that the drain current does not easily flow. Therefore, by detecting the drain current, information stored in the first memory functional element 131a can be read. Since the pinch off occurs in the vicinity of the drain at this time, whether charges are accumulated in the second memory functional element 131b or not does not exert an influence on the drain current.

In the case of reading information stored in the second memory functional element 131b, the transistor is operated in a saturation region by using the second diffusion region 107b as a source electrode and using the first diffusion region 107a as a drain electrode. It is sufficient to apply, for example, 0 V to the second diffusion region 107b and the P-type well region 102, +1.8 V to the first diffusion region 107a, and +2 V to the gate electrode 104. By interchanging the source and drain regions of the case of reading information stored in the first memory functional element 131a, information stored in the second memory functional element 131b can be read.

In the case where there is a channel region (offset region 120) which is not covered with the gate electrode 104, an inversion layer is dissipated or formed according to the presence/absence of excessive charges in the memory functional elements 131a and 131b in the channel region which is not covered with the gate electrode 104. As a result, a large hysteresis (change in the threshold) can be obtained. However, if the offset region 120 is too wide, the drain current largely decreases and the reading speed becomes much lower. Therefore, it is preferable to determine the width of the offset region 120 so that a sufficient hysteresis and reading speed can be obtained.

Even in the case where the diffusion regions 107a and 107b extend to the ends of the gate electrode 104, that is, the diffusion regions 107a and 107b overlap with the gate electrode 104, the threshold of the transistor is hardly changed by the programming operation. However, parasitic resistance at ends of the source and drain largely changes and the drain current greatly decreases (by one digit or more). Therefore, the reading operation can be performed by detecting the drain current, and the function of a memory can be obtained. In the case where a larger memory hysteresis effect is necessary, preferably, the diffusion regions 107a and 107b do not overlap with the gate electrode 104 (the offset region 120 exists).

By the above operating method, selective programming/erasing of two bits per one transistor can be realized. By connecting a word line WL to the gate electrode 104 of the memory cell, connecting a first bit line BL1 to the first diffusion region 107a, connecting a second bit line BL2 to the second diffusion region 107b, and arranging memory cells, a memory cell array can be configured.

In the above-described operating method, by interchanging the source electrode and the drain electrode, programming and erasing of two bits per one transistor is performed. Alternatively, the memory cell can also operate as a 1-bit memory by fixing the source electrode and the drain electrode. In this case, a common fixed voltage can be applied to one of the source and drain regions and the number of bit lines connected to the source and drain regions can be reduced to the half.

As obvious from the above description, in the memory cell in the semiconductor memory device of the present invention, the memory functional element is formed independently of the gate insulating film, and is formed on both sides of the gate electrode, so that 2-bit operation is possible. Since each memory functional element is isolated by the gate electrode, interference at the time of rewriting is effectively suppressed. Further, since the gate insulating film is isolated from the memory functional element, the memory cell can be formed thinly and a short channel effect can be suppressed. Therefore, reduction in size of the memory cell and, accordingly, the semiconductor memory device can be achieved easily.

SECOND EMBODIMENT

Figure 8:
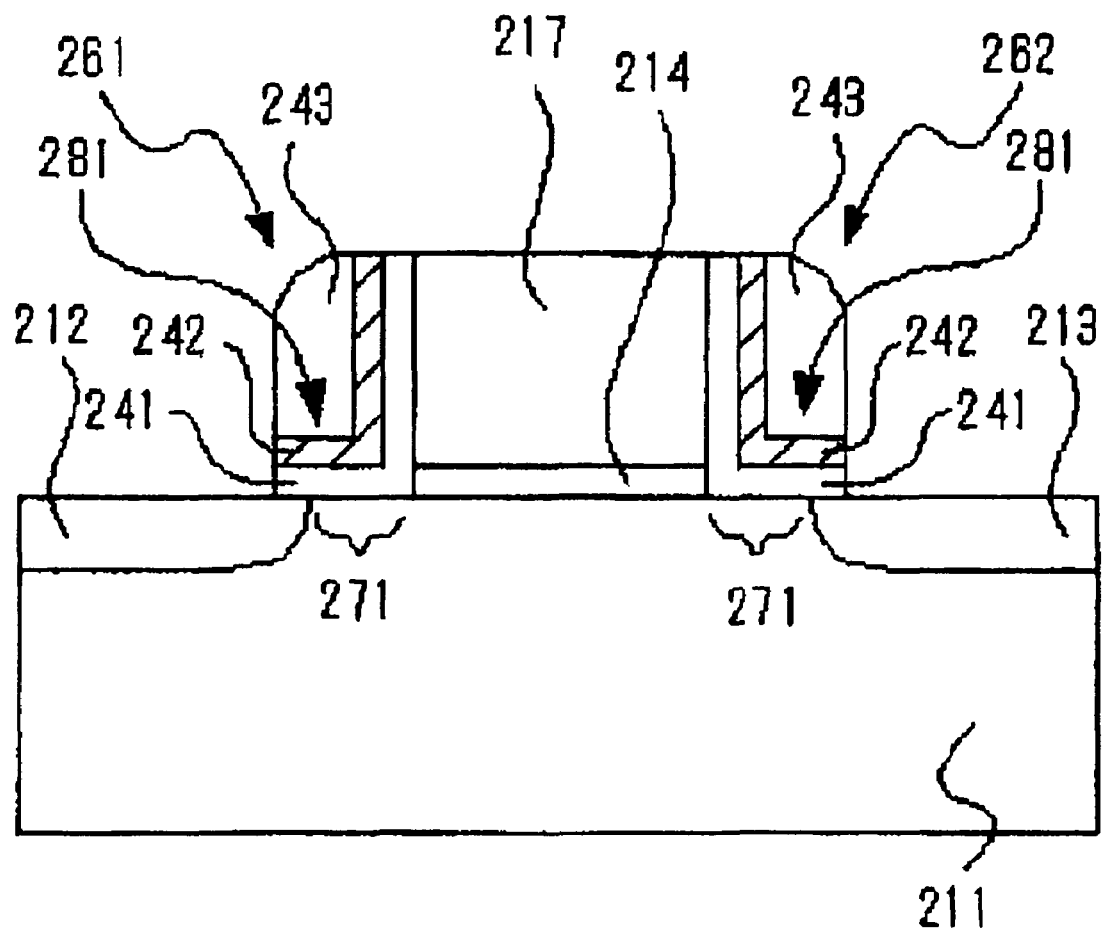
FIG. 8 is a schematic sectional view showing a main part of a memory cell (second embodiment) in the semiconductor memory device of the present invention.

A memory cell in a semiconductor memory device according to a second embodiment has a configuration substantially similar to that of the memory cell 1 of FIG. 1 except that, as shown in FIG. 8, each of memory functional elements 261 and 262 is configured by a charge retaining region (which is a charge accumulating region and may be a film having the function of retaining charges) and a region for suppressing escape of charges (or a film having the function of suppressing escape of charges).

Preferably, from the viewpoint of improving the retaining characteristic of the memory, the memory functional element includes a charge retaining film having the function of retaining charges and an insulating film. In the embodiment, a silicon nitride film 242 having a level of trapping charges is used as the charge retaining film and silicon oxide films 241 and 243 having the function of preventing escape of charges accumulated in the charge retaining film are used as the insulating films. When the memory functional element includes the charge retaining film and the insulating film, escape of charges is prevented and the retaining characteristic can be improved. As compared with the case where the memory functional element is configured only by the charge-retaining film, the volume of the charge retaining film can be reduced properly and, by regulating movement of charges in the charge retaining film, occurrence of a change in the characteristics due to movement of charges during retention of information can be suppressed. Further, by employing the structure in which the silicon nitride film 242 is sandwiched by the silicon oxide films 241 and 243, the charge injection efficiency at the time of rewriting operation becomes high and the operation can be performed at higher speed. In the memory cell, the silicon nitride film 242 may be replaced with a ferroelectric.

The regions of retaining charges (silicon nitride film 242) in the memory functional elements 261 and 262 overlap with diffusion regions 212 and 213. Overlap means here that at least a part of the charge retaining region (silicon nitride film 242) exists over at least a part of the diffusion regions 212 and 213. 211 denotes a semiconductor substrate, 214 denotes a gate insulating film, 217 indicates a gate electrode, and 271 expresses offset regions between the gate electrode 217 and the diffusion regions 212 and 213. Although not shown, the uppermost surface of the semiconductor substrate 211 below the gate insulating film 214 is a channel region.

A method of forming a memory cell of the present invention will now be described by using the memory cell shown in FIG. 8 as an example. First, the gate insulating film 214 and the gate electrode 217 are formed over the semiconductor substrate 211 by a known procedure. Subsequently, on the entire surface of the semiconductor substrate 211, the silicon oxide film 241 having a thickness of 0.8 to 20 nm, more preferably 3 to 10 nm is formed by thermal oxidation or deposited by CVD (Chemical Vapor Deposition). Next, on the entire surface of the silicon oxide film 241, the silicon nitride film 242 having a thickness of 2 to 15 nm, more preferably 3 to 10 nm is deposited by CVD. Further, on the entire surface of the silicon nitride film, the silicon oxide film 243 having a thickness of 20 to 70 nm is deposited by CVD.

Subsequently, by etching back the silicon oxide film/ silicon nitride film/silicon oxide film by anisotropic etching, a memory functional element which is optimum to store information is formed in a sidewall spacer shape on side walls of the gate electrode.

After that, ions are implanted by using the gate electrode 217 and the memory functional element having the sidewall spacer shape as a mask, thereby forming the diffusion layer regions (source and drain regions) 212 and 213. After that, a silicide process and an upper wiring process may be performed by a known procedure.

Effects produced by the overlap between the silicon nitride films 242 as the charge retaining regions in the memory functional elements 261 and 262 and the diffusion regions 212 and 213 will now be described.

Figure 9:
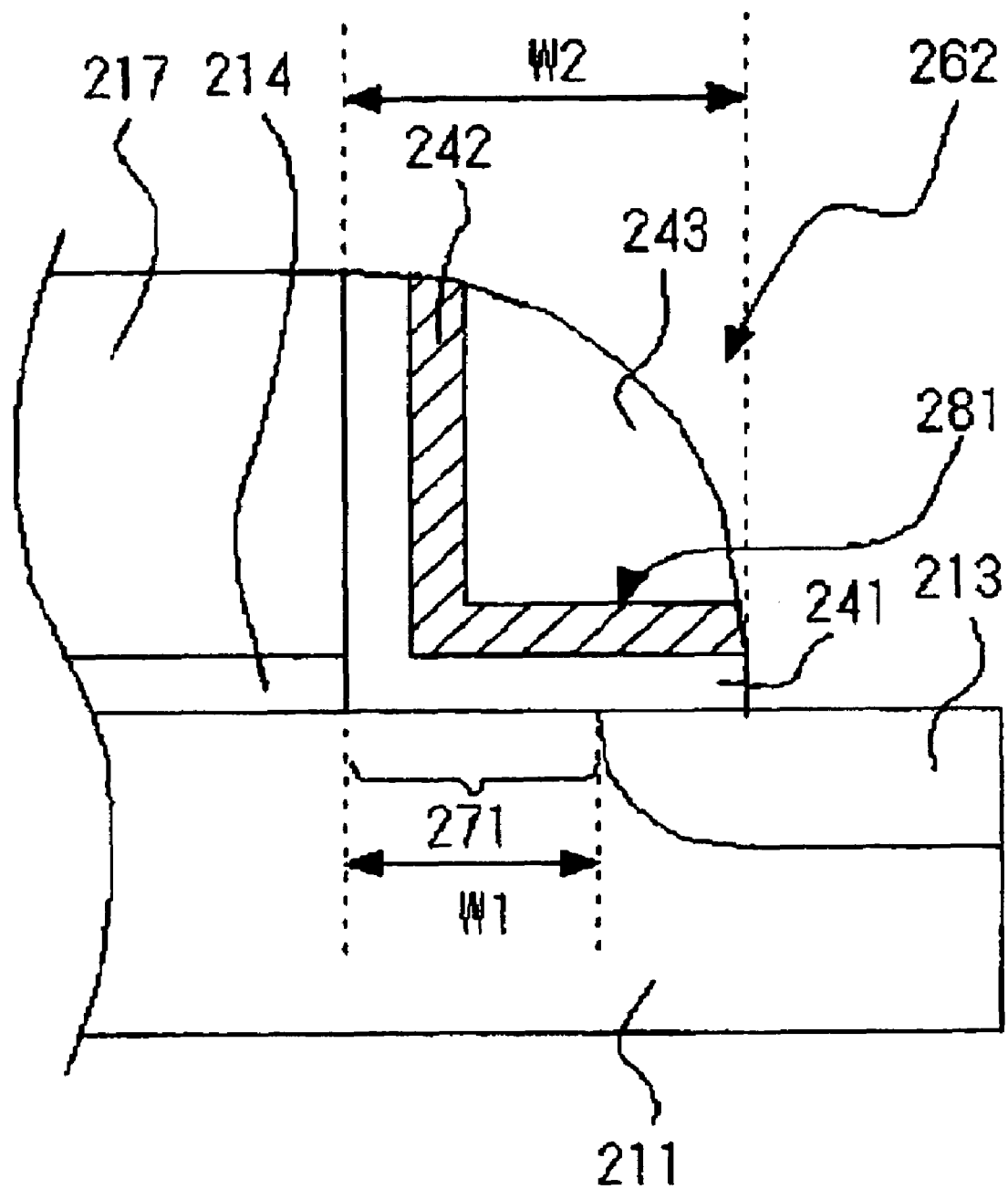
FIG. 9 is an enlarged schematic sectional view showing a main part of FIG. 8.

As shown in FIG. 9, in the area around the memory functional element 262, when an offset amount between the gate electrode 217 and the diffusion region 213 is W1 and the width of the memory functional element 262 in a cutting plane in the channel length direction of the gate electrode is W2, an overlap amount between the memory functional element 262 and the diffusion region 213 is expressed by "W2−W1". It is important that the silicon nitride film 242 in the memory functional element 262 overlaps the diffusion region 213, that is, the relation of "W2>W1" is satisfied.

In FIG. 9, since the end on the side apart from the gate electrode 217, of the silicon nitride film 242 in the memory functional element 262 coincides with the end of the memory functional element 262 on the side apart from the gate electrode 217, the width of the memory functional element 262 is defined as W2.

Figure 10:
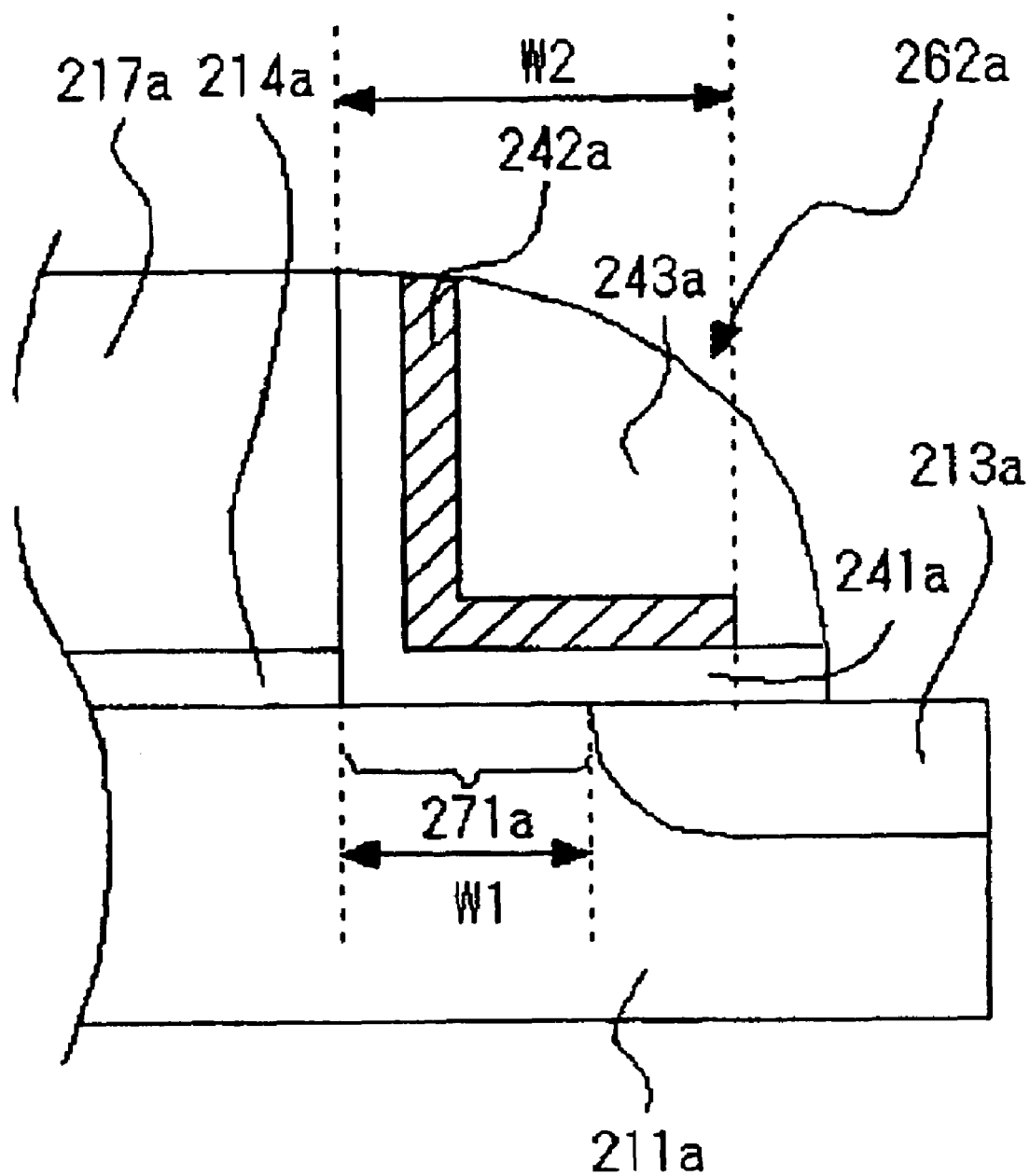
FIG. 10 is an enlarged schematic sectional view showing a main part of a modification of FIG. 8.

As shown in FIG. 10, when the end on the side apart from a gate electrode 217a, of a silicon nitride film 242a in a memory functional element 262a does not coincide with the end of the memory functional element 262a on the side apart from the gate electrode 217a, W2 may be defined as a width from the end of the gate electrode to the end on the side apart from the gate electrode of the silicon nitride film 242a.

Figure 11:
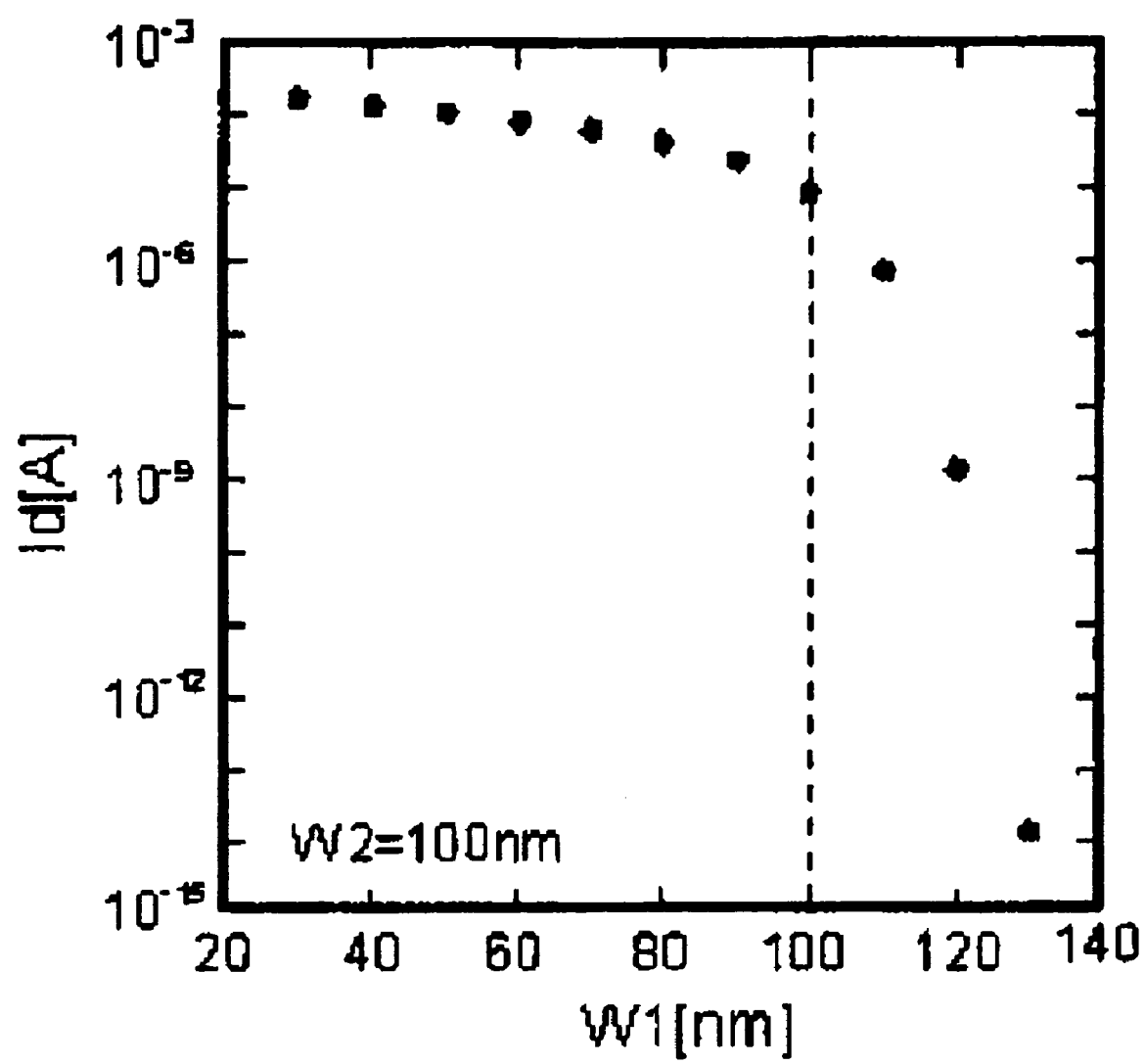
FIG. 11 is a graph showing electric characteristics of the memory cell (second embodiment) in the semiconductor memory device of the present invention.

FIG. 11 shows drain current Id when the width W2 of the memory functional element 262 is fixed to 100 nm and the offset amount W1 is changed in the structure of the memory cell of FIG. 9. The drain current was obtained by device simulation on assumption that the memory functional element 262 is in erasing state (holes are accumulated), and the diffusion regions 212 and 213 serve as the source electrode and the drain electrode, respectively.

As obvious from FIG. 11, when W1 is 100 nm or more (that is, the silicon nitride film 242 and the diffusion region 213 do not overlap with each other), the drain current sharply decreases. Since the drain current value is almost proportional to the read operation speed, the performance of the memory sharply deteriorates when W1 is 100 nm or more. On the other hand, in the range where the silicon nitride film 242 and the diffusion region 213 overlap with each other, decrease in the drain current is gentle. Therefore, in the case of considering also variations in mass production, without overlap between at least a part of the silicon nitride film 242 as the film having the function of retaining charges and the source and drain regions, it is difficult to actually obtain the memory function.

On the basis of the result of the device simulation, by fixing W2 to 100 nm and setting W1 to 60 nm and 100 nm as design values, memory cell arrays were produced. In the case where W1 is 60 nm, the silicon nitride film 242 and each of the diffusion regions 212 and 213 overlap with each other by 40 nm as a design value. In the case where W1 is 100 nm, there is no overlap as a design value. Reading time of the memory cell arrays was measured and worst cases in which variations were considered were compared with each other. In the case where W1 was set to 60 nm as a design value, read access time was 100 times as fast as that of the other case. In practice, the read access time is preferably 100 n/sec or less per one bit. When W1=W2, this condition cannot be satisfied. In the case of considering manufacture variations as well, it is more preferable that (W2−W1)>10 nm be satisfied.

In reading of information stored in the memory functional element 261 (region 281), in a manner similar to the first embodiment, it is preferable to set the diffusion region 212 as a source region, set the diffusion region 213 as a drain region, and form a pinch-off point on the side closer to the drain region in the channel region. Specifically, at the time of reading information stored in one of two memory functional elements, it is preferable to form a pinch-off point in a region close to the other memory functional element in the channel region. With the configuration, irrespective of the storage state of the memory functional element 262, information stored in the memory functional element 261 can be detected with high sensitivity, and it enables a 2-bit operation to be performed.

On the other hand, in the case of storing information in only one of two memory functional elements or in the case of using two memory functional elements in the same storage state, it is not always necessary to form a pinch-off point at the time of reading.

Although not shown in FIG. 8, it is preferable to form a well region (P-type well in the case of an N-channel device) in the surface of the semiconductor substrate 211. By forming the well region, while optimizing the impurity concentration in the channel region to memory operations (rewriting operation and reading operation), the other electric characteristics (withstand voltage, junction capacitance and short channel effect) can be controlled more easily.

Figure 12:
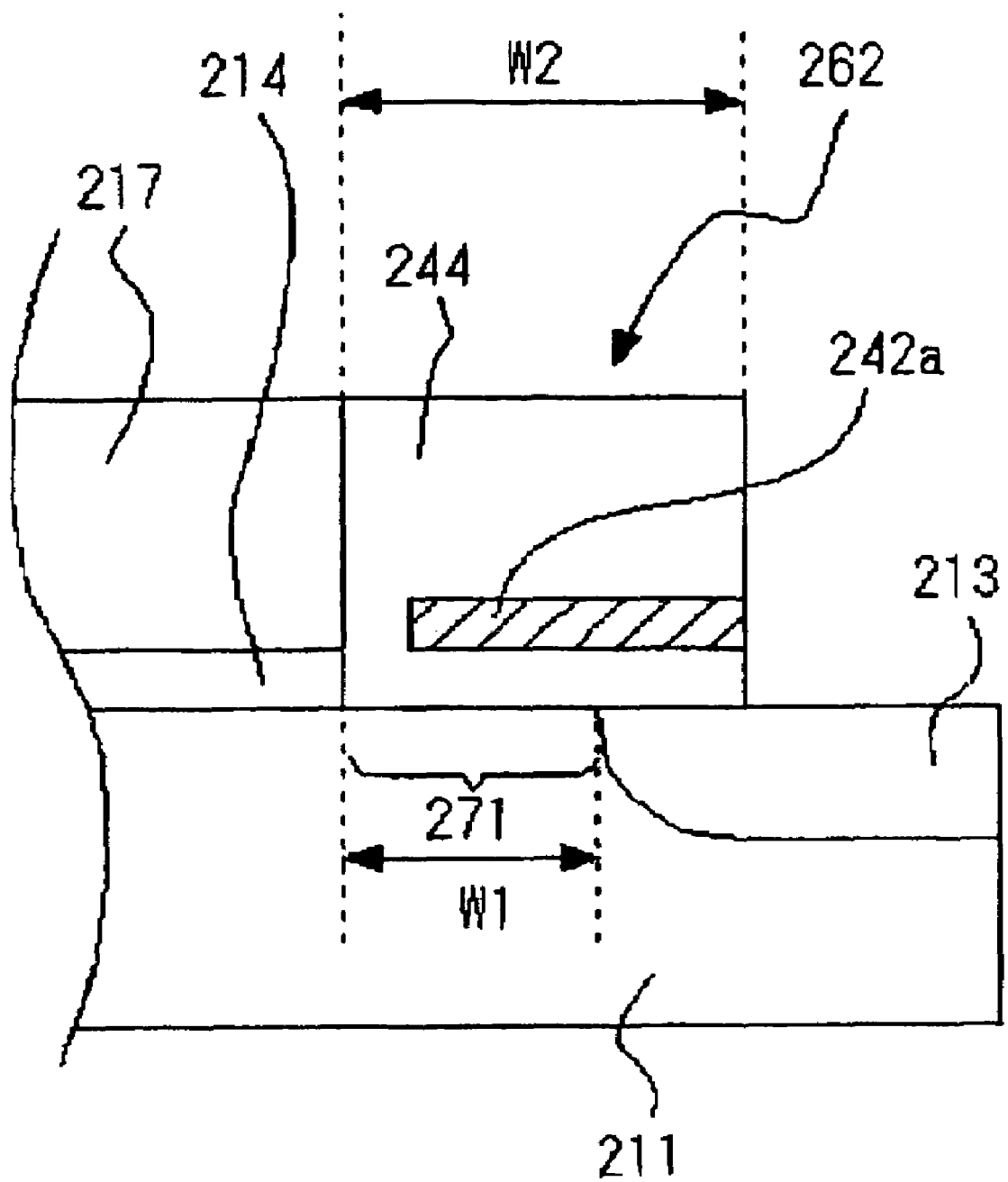
FIG. 12 is a schematic sectional view showing a main part of a modification of the memory cell (second embodiment) in the semiconductor memory device of the present invention.

Preferably, the memory functional element includes the charge retaining film which is disposed almost parallel with the surface of the gate insulating film. In other words, it is preferable to dispose the memory functional element so that the top surface of the charge retaining film in the memory functional element is positioned in a distance equal from the top surface of the gate insulating film. Specifically, as shown in FIG. 12, the silicon nitride film 242a as the charge retaining film in the memory functional element 262 has a surface almost parallel with the surface of the gate insulating film 214. In other words, it is preferable that the silicon nitride film 242a be formed at a constant level from the level of the surface of the gate insulating film 214.

Because of the existence of the silicon nitride film 242a which is almost parallel with the surface of the gate insulating film 214 in the memory functional element 262, easiness of formation of an inversion layer in the offset region 271 can be effectively controlled in accordance with the amount of charges accumulated in the silicon nitride film 242a and, moreover, the memory effect can be increased. By forming the silicon nitride film 242a almost parallel with the surface of the gate insulating film 214, even in the case where the offset amount (W1) varies, a change in the memory effect can be maintained to be relatively small and variations in the memory effect can be suppressed. Moreover, movement of charges to the upper portion in the silicon nitride film 242a is suppressed and occurrence of a characteristic change due to movement of charges during retention of information can be suppressed.

Further, it is preferable that the memory functional element 262 include an insulating film (or example, a portion over the offset region 271 in the silicon oxide film 244) for separating the silicon nitride film 242a which is almost parallel to the surface of the gate insulating film 214 from the channel region (or well region). By the insulating film, dissipation of the charges accumulated in the charge retaining film is suppressed and a memory cell having a better retaining characteristic can be obtained.

By controlling the thickness of the silicon nitride film 242a and controlling the thickness of the insulating film below the silicon nitride film 242a (portion over the offset region 271 in the silicon oxide film 244) to be constant, the distance from the surface of the semiconductor substrate to charges accumulated in the charge retaining film can be maintained almost constant. To be specific, the distance from the surface of the semiconductor substrate to the charges accumulated in the charge retaining film can be controlled to be in a range from the minimum thickness value of the insulating film under the silicon nitride film 242a to the sum of the maximum thickness value of the insulating film under the silicon nitride film 242a and the maximum thickness value of the silicon nitride film 242a. Consequently, density of electric lines of force generated by the charges accumulated in the silicon nitride film 242a can be almost controlled, and variations in the memory effect of the memory cell can be reduced very much.

THIRD EMBODIMENT

Figure 13:
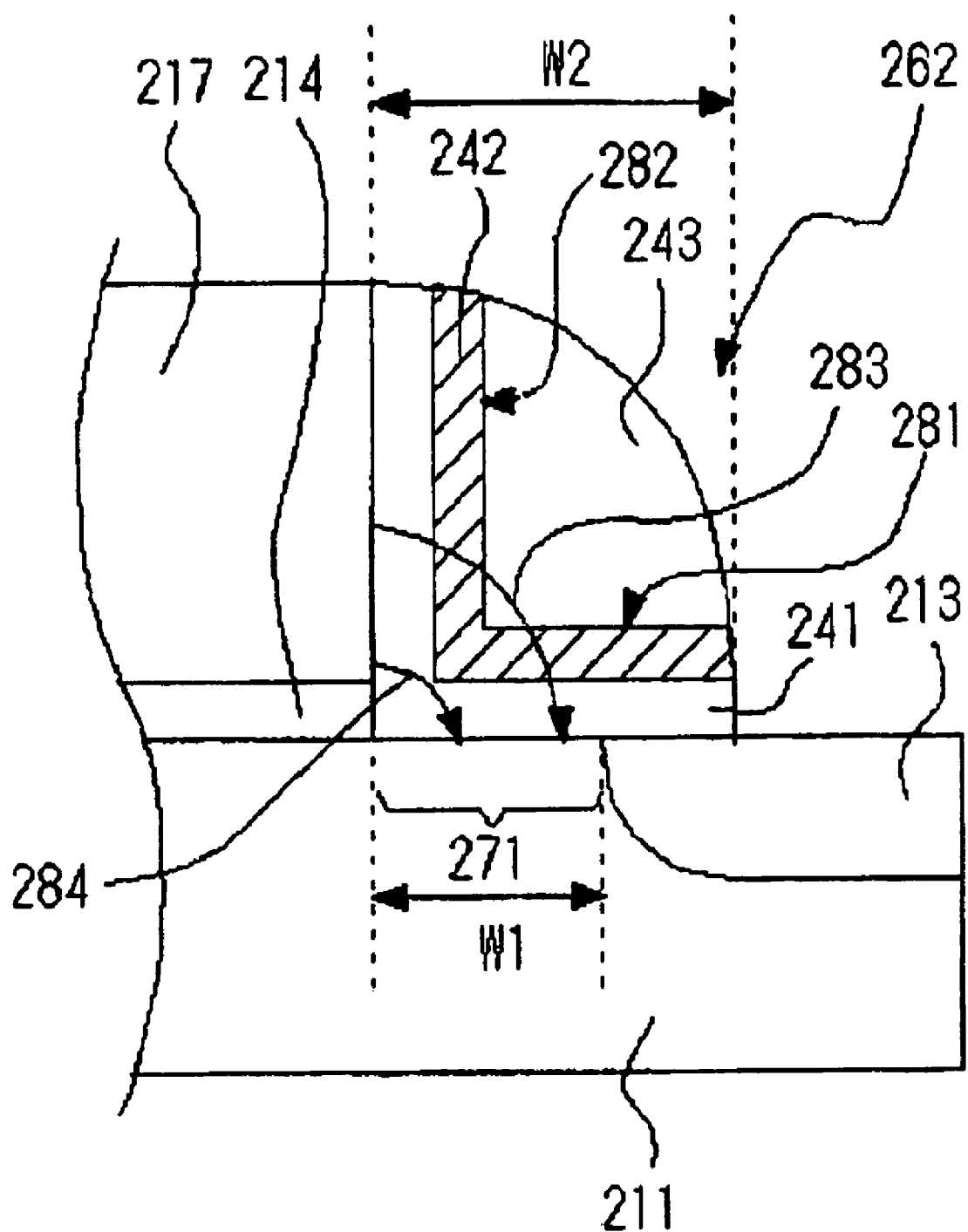
FIG. 13 is a schematic sectional view showing a main part of a memory cell (third embodiment) in the semiconductor memory device of the present invention.

The memory functional element 262 in a semiconductor memory device of a third embodiment has a shape in which, as shown in FIG. 13, the silicon nitride film 242 as the charge retaining film has an almost constant thickness and is disposed almost parallel with the surface of the gate insulating film 214 (region 281) and, further, disposed almost parallel with a side surface of the gate electrode 217 (region 282).

In the case where a positive voltage is applied to the gate electrode 217, an electric line 283 of force in the memory functional element 262 passes through the silicon nitride film 242 twice (portions corresponding to the regions 282 and 281) as shown by the arrows. When a negative voltage is applied to the gate electrode 217, the direction of the electric line of force is reversed. The dielectric constant of the silicon nitride film 242 is about 6 and the dielectric constant of the silicon oxide films 241 and 243 is about 4. Therefore, as compared with the case where only the region 281 of the charge regaining film exists, the effective dielectric constant of the memory functional element 262 in the direction of the electric line 283 of force becomes high and the potential difference at both ends of the electric line of force can be reduced. That is, the most of the voltage applied to the gate electrode 217 is used to increase the electric field in the offset region 271.

The reason why charges are injected into the silicon nitride film 242 at the time of the rewriting operation is because generated charges are attracted by the electric field in the offset region 271. Therefore, by including the charge retaining film indicated by the arrow 282, charges injected into the memory functional element 262 increases in the rewriting operation, and the rewrite speed increases.

In the case where the portion of the silicon oxide film 243 is also a silicon nitride film, specifically, when the charge retaining film is not constant with respect to the level of the surface of the gate insulating film 214, movement of charges to the upper portion of the silicon nitride film becomes conspicuous and the retaining characteristic deteriorates.

More preferably, in place of the silicon nitride film, the charge retaining film is made of a high dielectric such as hafnium oxide having a very high dielectric constant.

Preferably, the memory functional element further includes an insulating film (portion over the offset region 271 in the silicon oxide film 241) for separating the charge retaining film which is almost parallel with the surface of the gate insulating film from the channel region (or well region). By the insulating film, dissipation of charges accumulated in the charge retaining film is suppressed and the retaining characteristic can be further improved.

Preferably, the memory functional element further includes an insulating film (a portion in contact with the gate electrode 217 in the silicon oxide film 241) for separating the gate electrode from the charge retaining film extended almost parallel with the side face of the gate electrode. The insulating film prevents injection of charges from the gate electrode into the charge retaining film and, accordingly, prevents a change in the electric characteristics. Thus, the reliability of the memory cell can be improved.

Further, in a manner similar to the second embodiment, it is preferable to control the thickness of the insulating film under the silicon nitride film 242 (the portion over the offset region 271 of the silicon oxide film 241) to be constant and to control the thickness of the insulating film disposed on the side surface of the gate electrode (the portion in contact with the gate electrode 217 in the silicon oxide film 241) to be constant. By the operation, the density of electric lines of force generated by the charges accumulated in the silicon nitride film 242 can be controlled more or less and leakage of charges can be prevented.

FOURTH EMBODIMENT

In a fourth embodiment, optimization of distances among the gate electrode, the memory functional element, and the source and drain regions of a memory cell in a semiconductor memory device will be described.

Figure 14:
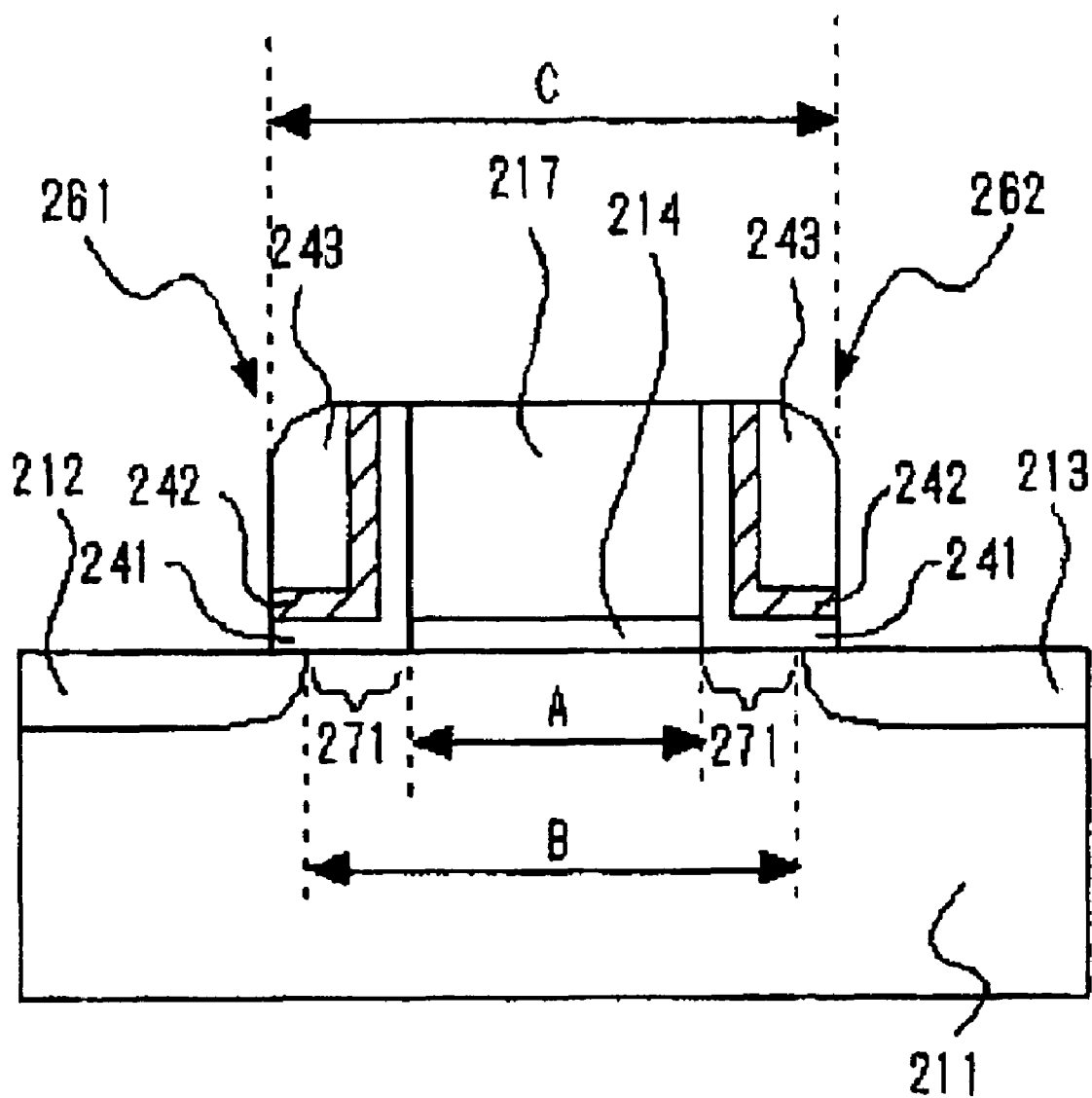
FIG. 14 is a schematic sectional view showing a main part of a memory cell (fourth embodiment) in the semiconductor memory device of the present invention.

As shown in FIG. 14, A indicates the length of the gate electrode in a cutting plane in the channel length direction, B indicates the distance from the source and drain regions (channel length), and C indicates the distance between an end of one of memory functional elements to an end of the other memory functional element, that is, the distance from an end (on the side apart from the gate electrode) of the film having the function of retaining charges in one of the memory functional elements in a cutting plane in the channel length direction to an end (on the side apart from the gate electrode) of the film having the function of retaining charges in the other memory functional element.

In such a memory cell, B<C is preferable. By satisfying such a relation, the offset regions 271 exist between the portion under the gate electrode 217 in the channel region and each of the diffusion regions 212 and 213. Consequently, easiness of inversion effectively fluctuates in the whole offset regions 271 by charges accumulated in the memory functional elements 261 and 262 (silicon nitride films 242). Therefore, the memory effect increases and, particularly, higher-speed reading operation is realized.

In the case where there is an offset between the gate electrode 217 and each of the diffusion regions 212 and 213, that is, in the case where the relation of A<B is satisfied, easiness of inversion of the offset region when a voltage is applied to the gate electrode largely changes according to an amount of charges accumulated in the memory functional element, the memory effect increases, and a short channel effect can be reduced.

As long as the memory effect is produced, the offset region 271 does not always have to exist. Even in the case where the offset region 271 does not exist, if the impurity concentration in the diffusion regions 212 and 213 is sufficiently low, the memory effect can be produced in the memory functional elements 261 and 262 (silicon nitride film 242).

Thus, A<B<C is the most preferred.

FIFTH EMBODIMENT

Figure 15:
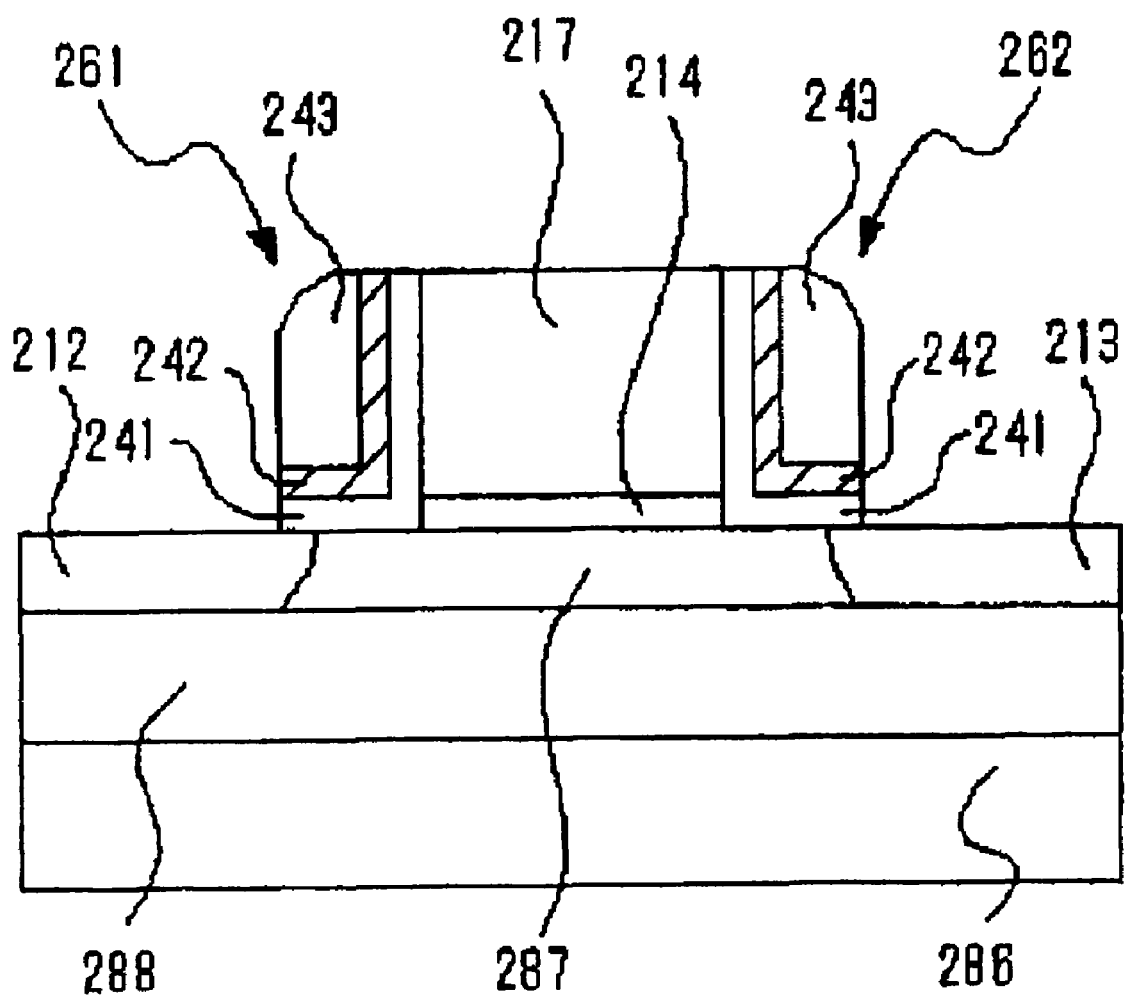
FIG. 15 is a schematic sectional view showing a main part of a memory cell (fifth embodiment) in the semiconductor memory device of the present invention.

A memory cell of a semiconductor memory device in a fifth embodiment has a substantially similar configuration to that of the second embodiment except that an SOI substrate is used as the semiconductor substrate in the second embodiment as shown in FIG. 15.

In the memory cell, a buried oxide film 288 is formed on a semiconductor substrate 286, and an SOI layer is formed on the buried oxide film 288. In the SOI layer, the diffusion regions 212 and 213 are formed and the other region selves as a body region 287.

By the memory cell as well, action and effect similar to those of the memory cell of the second embodiment are produced. Further, junction capacitance between the diffusion regions 212 and 213 and the body region 287 can be remarkably reduced, so that higher-speed operation and lower power consumption of the device can be achieved.

SIXTH EMBODIMENT

Figure 16:
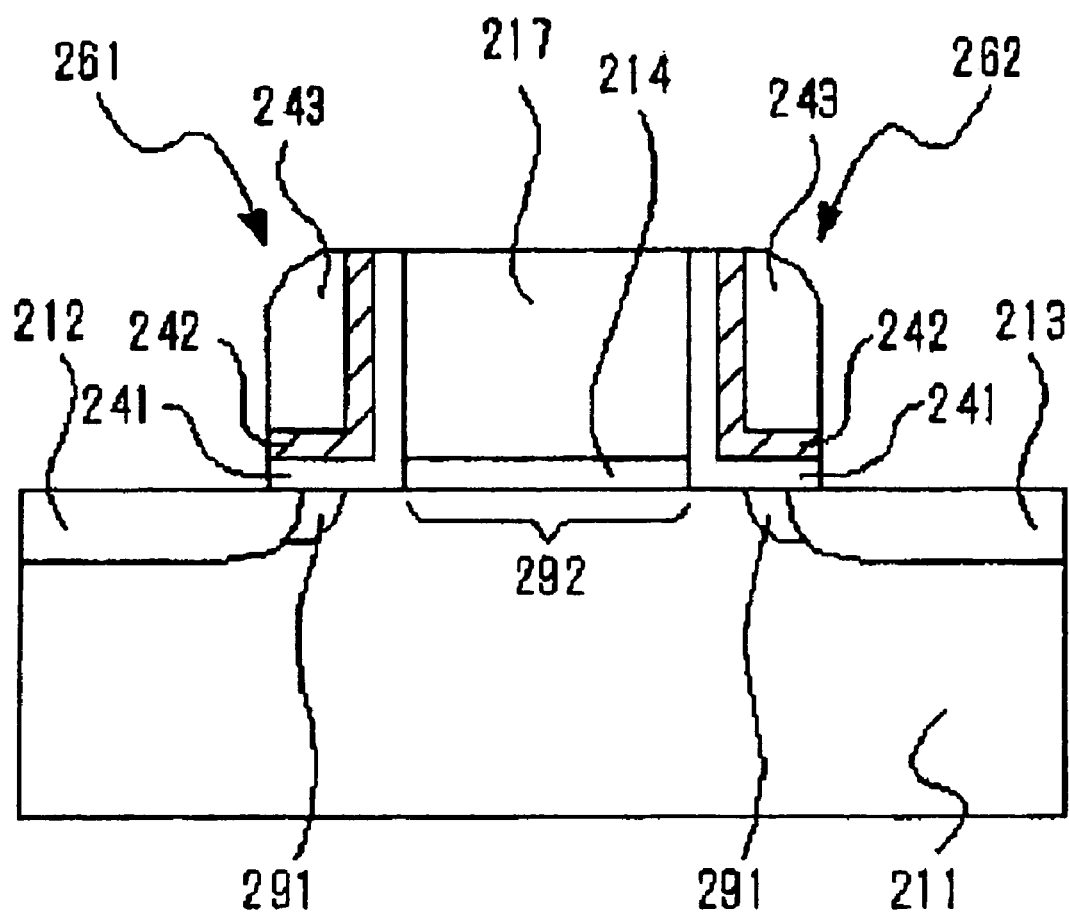
FIG. 16 is a schematic sectional view showing a main part of a memory cell (sixth embodiment) in the semiconductor memory device of the present invention.

A memory cell in a semiconductor memory device in a sixth embodiment has, as shown in FIG. 16, a configuration substantially similar to that of the memory cell of the second embodiment except that P-type high-concentration regions 291 are added adjacent to the channel sides of the N-type diffusion regions 212 and 213.

Specifically, the concentration of P-type impurity (for example, boron) in the P-type high-concentration region 291 is higher than that in a region 292. Proper P-type impurity concentration in the P-type high-concentration region 291 is, for example, about $5 \times 10^{17}$ to $1 \times 10^{19}$ cm$^{-3}$. The P-type impurity concentration in the region 292 can be, for example, $5 \times 10^{16}$ to $1 \times 10^{18}$ cm$^{-3}$.

By providing the P-type high-concentration region 291 as described above, the gradient of potential in the junction between the diffusion regions 212 and 213 and the semiconductor substrate 211 becomes sharp immediately below the memory functional elements 261 and 262. Consequently, hot carriers are easily generated in the programming and erasing operations, and voltages in the programming and erasing operations are decreased, or the programming and erasing operations can be performed at high speed. Further, the impurity concentration in the region 292 is relatively low, so that the threshold when the memory is an erased state is low, and the drain current increases. Consequently, reading speed is improved. Therefore, the memory cell in which the rewriting voltage is low or rewriting speed is high and the reading speed is high can be obtained.

In FIG. 16, by providing the P-type high-concentration region 291 in the vicinity of the source/drain region and below the memory functional element (that is, not immediately below the gate electrode), the threshold of the transistor as a whole increases noticeably. The degree of increase is much higher as compared with the case where the P-type high-concentration region 291 exists immediately below the gate electrode. In the case where program charges (electrons in the case where the transistor is of the N-channel type) are accumulated in the memory functional element, the difference becomes much larger. On the other hand, when sufficient erase charges (positive holes in the case where the transistor is of the N channel type) are accumulated in the memory functional element, the threshold of the transistor as a whole decreases to the threshold determined by the impurity concentration in the channel region (region 292) below the gate electrode. That is, the threshold at the time of erasing does not depend on the impurity concentration in the P-type high-concentration region 291. On the other hand, the threshold at the time of programming is largely influenced by the impurity concentration. Therefore, by disposing the P-type high-concentration region 291 below the memory functional element and in the vicinity of the source/drain region, only the threshold at the time of programming fluctuates very largely and the memory effect (the difference between the threshold at the time of programming and the threshold at the time of erasing) can be remarkably increased.

SEVENTH EMBODIMENT

Figure 17:
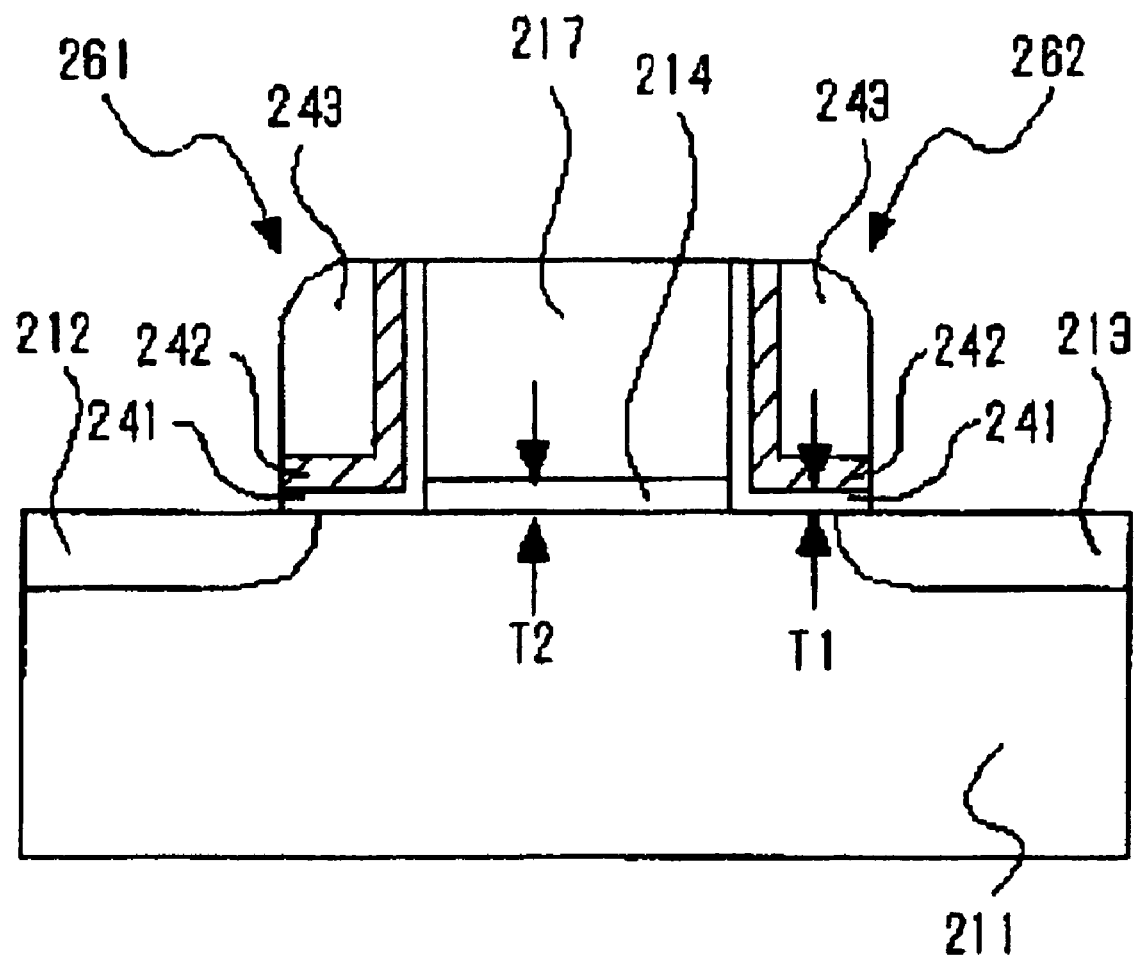
FIG. 17 is a schematic sectional view showing a main part of a memory cell (seventh embodiment) in the semiconductor memory device of the present invention.

A memory cell in a semiconductor memory device of a seventh embodiment has a configuration substantially similar to that of the second embodiment except that, as shown in FIG. 17, the thickness (T1) of an insulating film for separating the charge retaining film (silicon nitride film 242) from the channel region or well region is smaller than the thickness (T2) of the gate insulating film.

The lower limit value exists in the thickness T2 of the gate insulating film 214 due to the demand for a withstand voltage at the time of memory rewriting operation. In contrast, the thickness T1 of the insulating film can be made smaller than the thickness T2 irrespective of the demand for a withstand voltage.

The flexibility of designing with respect to T1 is high in the memory cell for the following reason.

In the memory cell, the insulating film for separating the charge retaining film from the channel region or well region is not sandwiched by the gate electrode and the channel region or well region. Consequently, to the insulating film for separating the charge retaining film from the channel region or well region, a high electric field acting between the gate electrode and the channel region or well region does not directly act, but a relatively low electric field spreading from the gate electrode in the lateral direction acts. Consequently, irrespective of the demand for a withstand voltage to the gate insulating film, T1 can be made smaller than T2.

By making T1 thinner, injection of charges into the memory functional element becomes easier, and the voltage of the programming operation and the erasing operation can be decreased or the programming operation and erasing operation can be performed at high speed. Since the amount of charges induced by the channel region or well region when charges are accumulated in the silicon nitride film 242 increases, the memory effect can be increased.

The electric lines of force in the memory functional element include a short one which does not pass through the silicon nitride film 242 as shown by an arrow 284 in FIG. 13. On the relatively short-electric line of force, electric field intensity is relatively high, so that the electric field along the electric line of force plays a big role in the rewriting operation. By reducing T1, the silicon nitride film 242 is shifted downward in the diagram, and the electric line of force indicated by the arrow 283 passes through the silicon nitride film. Consequently, the effective dielectric constant in the memory functional element along the electric line 284 of force increases, and the potential difference at both ends of the electric line of force can be further decreased. Therefore, a large part of the voltage applied to the gate electrode 217 is used to increase the electric field in the offset region, and the programming operation and the erasing operation become faster.

In contrast, for example, in an EEPROM typified by a flash memory, the insulating film for separating the floating gate from the channel region or well region is sandwiched by the gate electrode (control gate) and the channel region or well region, so that a high electric field from the gate electrode directly acts. Therefore, in an EEPROM, the thickness of the insulating film for separating the floating gate from the channel region or well region is regulated, and optimization of the function of the memory cell is inhibited.

As obvious from the above, by satisfying the relation of T1<T2, without deteriorating the performance of the withstand voltage of the memory, the voltage in the programming and erasing operations can be decreased or the programming and erasing operations can be performed at high speed and, further, the memory effect can be increased. The thickness T1 of the insulating film is preferably 0.8 nm or more as a limit at which the uniformity and the film quality in the manufacturing process can maintain a predetermined level and the retaining characteristic does not deteriorate extremely.

Specifically, in the case of a liquid crystal driver LSI requiring high withstand voltage in a design rule, in order to drive the liquid crystal panel TFT, a voltage of 15 to 18 V at the maximum is required, so that the gate oxide film cannot be usually thinned. In the case of mounting a nonvolatile memory of the present invention for image adjustment on the liquid crystal driver LSI, in the memory cell of the present invention, the thickness of the insulating film for separating the charge retaining film (silicon nitride film 242) from the channel region or well region can be optimally designed independently of the thickness of the gate insulating film. For example, the thickness can be individually set as T1=20 nm and T2=10 nm for a memory cell having a gate electrode length (word line width) of 250 nm, so that a memory cell having high programming efficiency can be realized (the reason why the short channel effect is not produced when T1 is larger than the thickness of a normal logic transistor is because the source and drain regions are offset from the gate electrode).

EIGHTH EMBODIMENT

Figure 18:
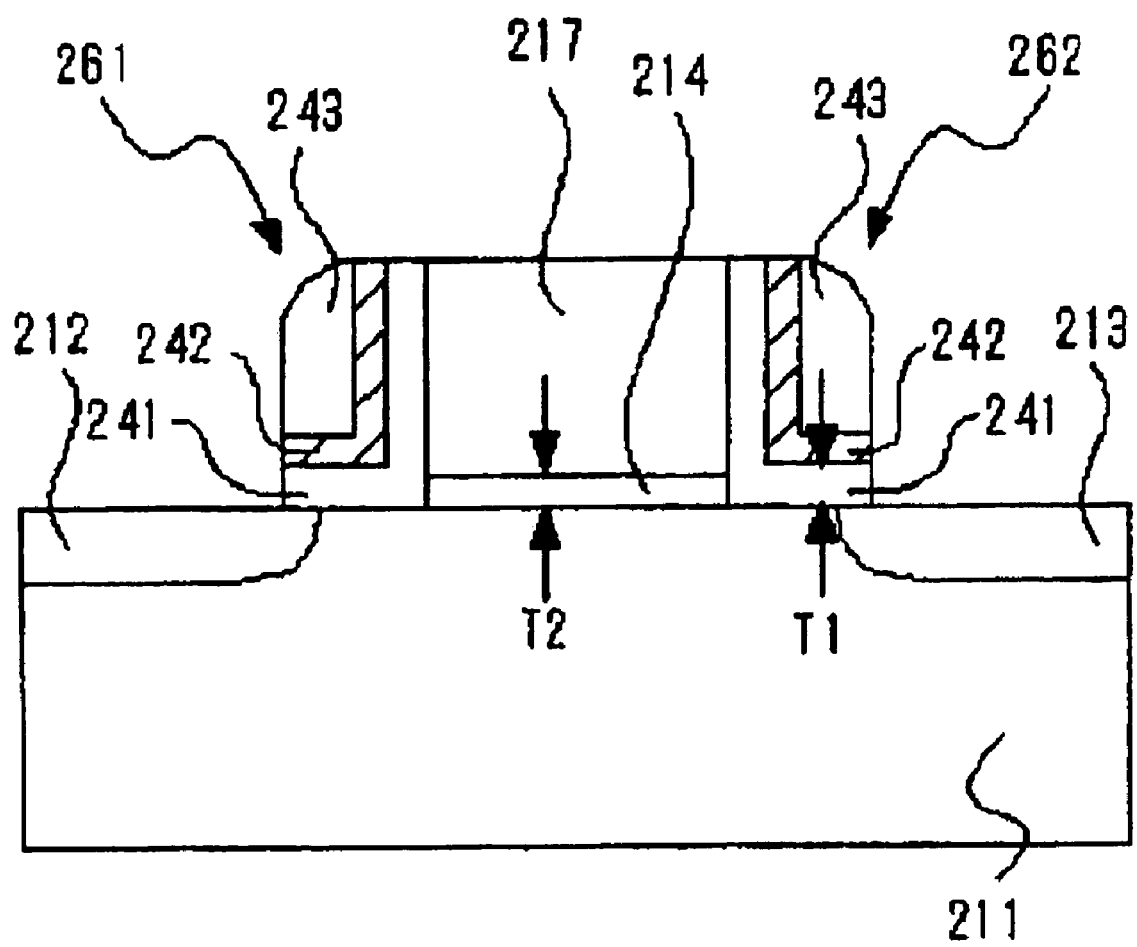
FIG. 18 is a schematic sectional view showing a main part of a memory cell (eighth embodiment) in the semiconductor memory device of the present invention.

A memory cell in a semiconductor memory device of an eighth embodiment has a configuration substantially similar to that of the second embodiment except that, as shown in FIG. 18, the thickness (T1) of the insulating film for separating the charge retaining film (silicon nitride film 242) from the channel region or well region is larger than the thickness (T2) of the gate insulating film.

The upper limit value exists in the thickness T2 of the gate insulating film 214 due to the demand for preventing a short channel effect of the device. In contrast, the thickness T1 of the insulating film can be made larger than the thickness T2 irrespective of the demand for preventing a short channel effect. Specifically, when microfabrication scaling advances (when thinning of the gate insulating film advances), the thickness of the insulating film for separating the charge retaining film (silicon nitride film 242) from the channel or well region can be optimally designed independently of the thickness of the gate insulating film. Thus, an effect that scaling is not disturbed by the memory functional element is produced.

The reason why flexibility of designing of T1 is high in the memory cell is that, as described already, the insulating film for separating the charge retaining film from the channel region or well region is not sandwiched by the gate electrode and the channel region or well region. Consequently, irrespective of the demand for preventing the short channel effect for the gate insulating film, T1 can be made larger than T2. By making T1 thicker, dissipation of charges accumulated in the memory functional element can be prevented and the retaining characteristic of the memory can be improved.

Therefore, by satisfying the relation of T1>T2, the retaining characteristic can be improved without deteriorating the short channel effect of the memory.

The thickness T1 of the insulating film is preferably 20 nm or less in consideration of decrease in the rewriting speed.

Specifically, in a conventional nonvolatile memory typified by a flash memory, a selection gate electrode serves as a program/erase gate electrode, and a gate insulating film including a floating gate) corresponding to the program/erase gate electrode also serves as a charge accumulating film. Since a demand for size reduction (thinning of a film is indispensable to suppress short channel effect) and a demand for assuring reliability (to suppress leak of retained charges, the thickness of the insulating film for separating the floating gate from the channel region or well region cannot be reduced to about 7 nm or less) are contradictory, it is difficult to reduce the size. Actually, according to the ITRS (International Technology Roadmap for Semiconductors), there is no prospect of reduction in a physical gate length of about 0.2 micron or less. In the memory cell, since T1 and T2 can be individually designed as described above, size reduction is made possible.

For example, for a memory cell having a gate electrode length (word line width) of 45 nm, T2=4 nm and T1=7 nm are individually set, thereby enabling a memory cell in which the short channel effect is not produced to be realized. The reason why the short channel effect is not produced even when T2 is set to be larger than the thickness of a normal logic transistor is because the source/drain regions are offset from the gate electrode.

Since the source/drain regions are offset from the gate electrode in the memory cell, as compared with a normal logic transistor, reduction in size is further facilitated.

Since the electrode for assisting programming and erasing does not exist in the upper portion of the memory functional element, a high electric field acting between the electrode for assisting programming and erasing and the channel region or well region does not directly act on the insulating film for separating the charge retaining film from the channel region or well region, but only a relatively low electric field which spreads in the lateral direction from the gate electrode acts. Consequently, the memory cell having a gate length which is reduced to be equal to or less than the gate length of a logic transistor of the same process generation can be realized.

NINTH EMBODIMENT

A ninth embodiment relates to a change in the electric characteristic at the time of rewriting a memory cell of a semiconductor memory device.

Figure 19:
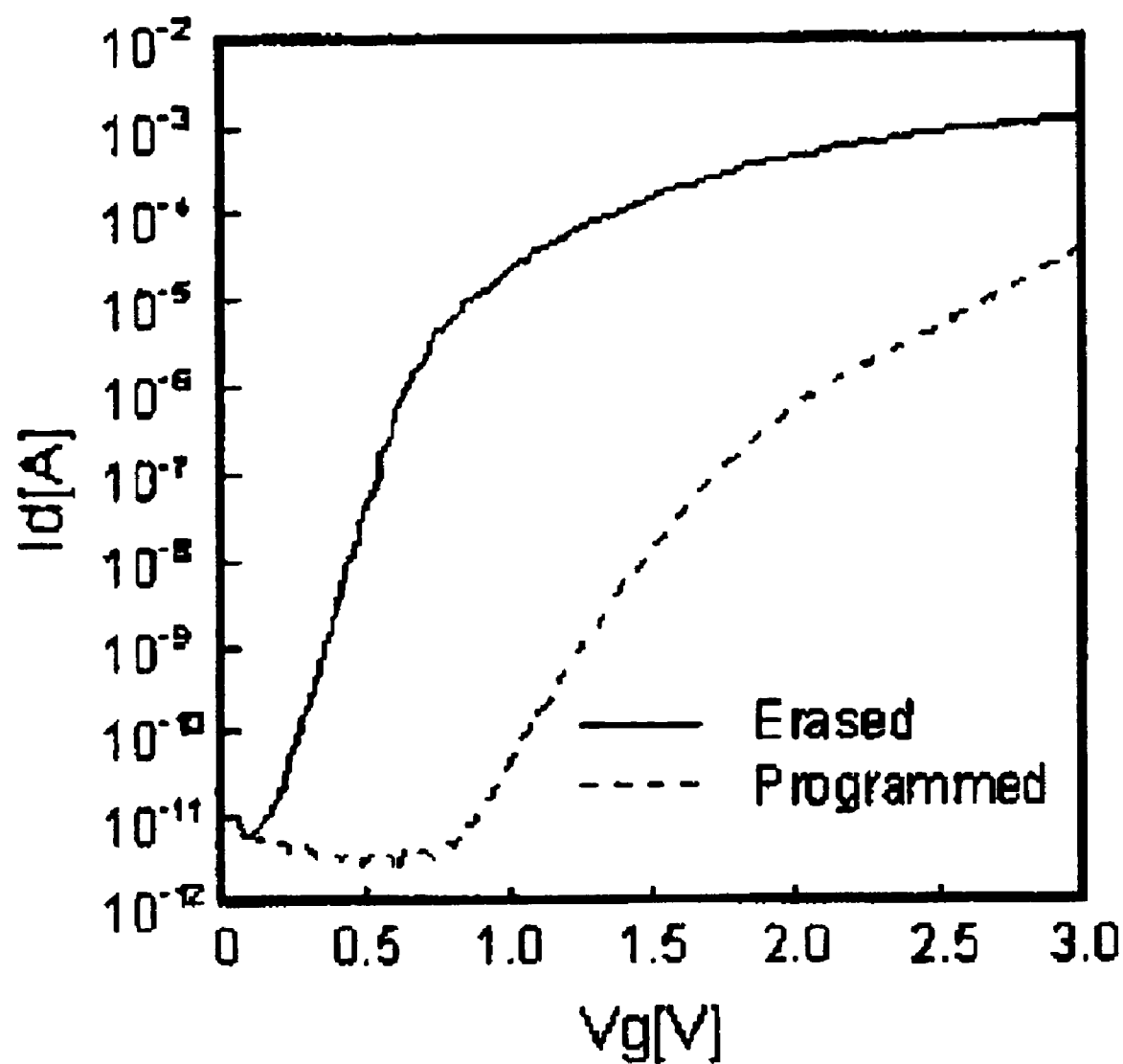
FIG. 19 is a graph showing electric characteristics of a memory cell (ninth embodiment) in the semiconductor memory device of the present invention.

In an N-channel type memory cell, when an amount of charges in a memory functional element changes, a drain current (Id)-gate voltage (Vg) characteristic (actual measurement value) as shown in FIG. 19 is exhibited.

Figure 30:
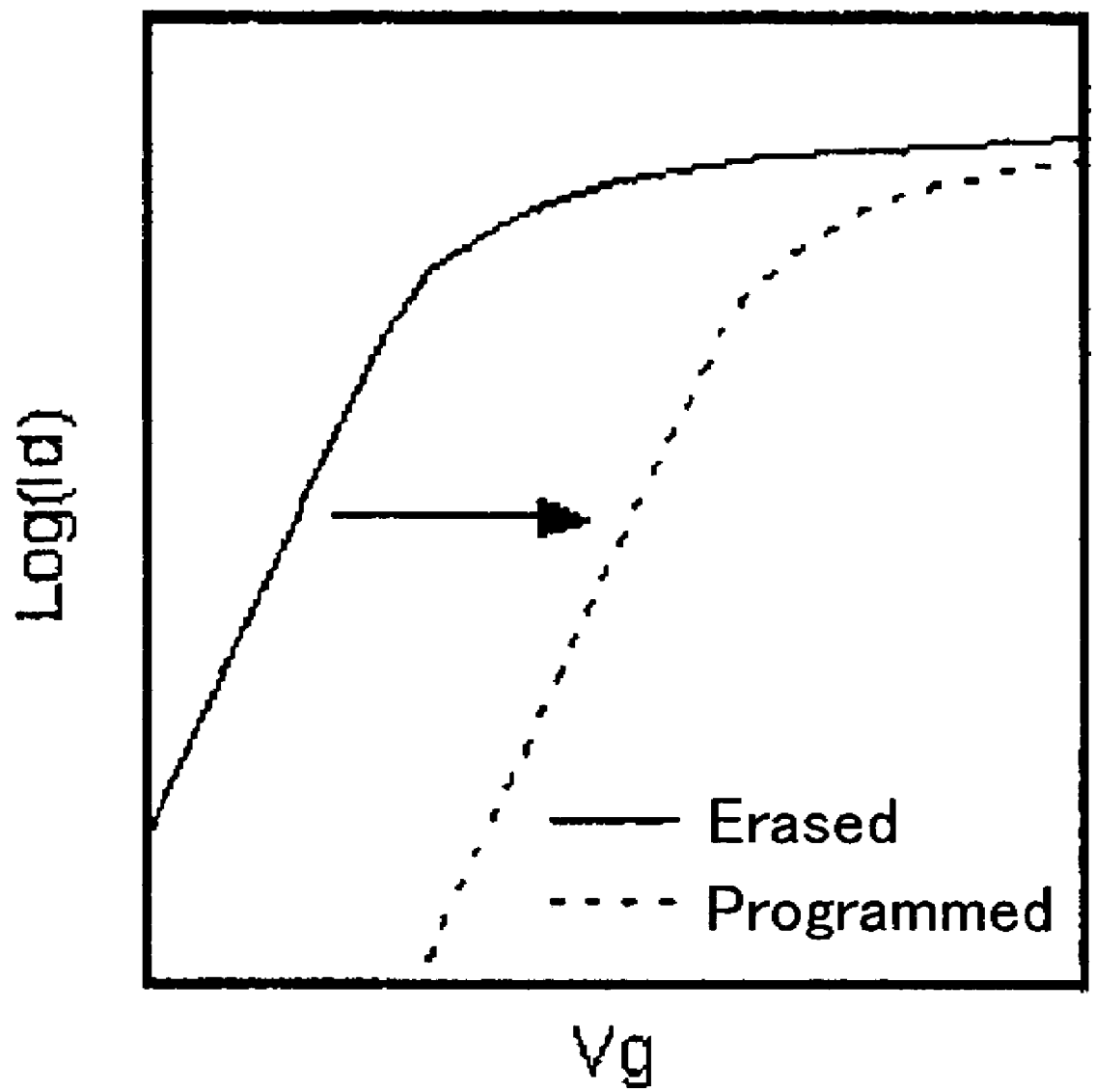
FIG. 30 is a graph showing electric characteristics of the conventional flash memory.

As obvious from FIG. 19, in the case of performing a programming operation in an erasing state (solid line), not only the threshold simply increases, but the gradient of a graph remarkably decreases in a sub-threshold region. Consequently, also in a region where a gate voltage (Vg) is relatively high, the drain current ratio between the erasing state and the programming state is high. For example, also at Vg=2.5 V, the current ratio of two digits or more is maintained. The characteristic is largely different from that in the case of a flash memory (FIG. 30).

The appearance of such a characteristic is a peculiar phenomenon which occurs when the gate electrode and the diffusion regions are offset from each other and the gate electric field hardly acts on the offset region. When the memory cell is in a programming state, even if a positive voltage is applied to the gate electrode, an inversion layer is hardly generated in the offset region below the memory functional element. This is the cause that the gradient of the Id-Vg curve in the sub-threshold region becomes gentle in the programming state.

On the other hand, when the memory cell is in the erasing state, electrons of high density are induced in the offset region. Further, when 0 V is applied to the gate electrode (that is, when the gate electrode is in an off state), no electrons are induced in the channel below the gate electrode (consequently, an off-state current is small). This is the cause that the gradient of the Id-Vg curve is sharp in the sub-threshold region in the erasing state, and current increasing rate (conductance) is high also in the region of the threshold or more.

As obviously understood from the above, in the memory cell in the semiconductor memory device of the present invention, the drain current ratio between the programming operation and the erasing operation can be particularly made high.

TENTH EMBODIMENT

A tenth embodiment relates to a configuration of a memory cell array obtained by arranging a plurality of the memory cells of any of the first to eighth embodiments in a matrix of rows and columns.

Figure 20:
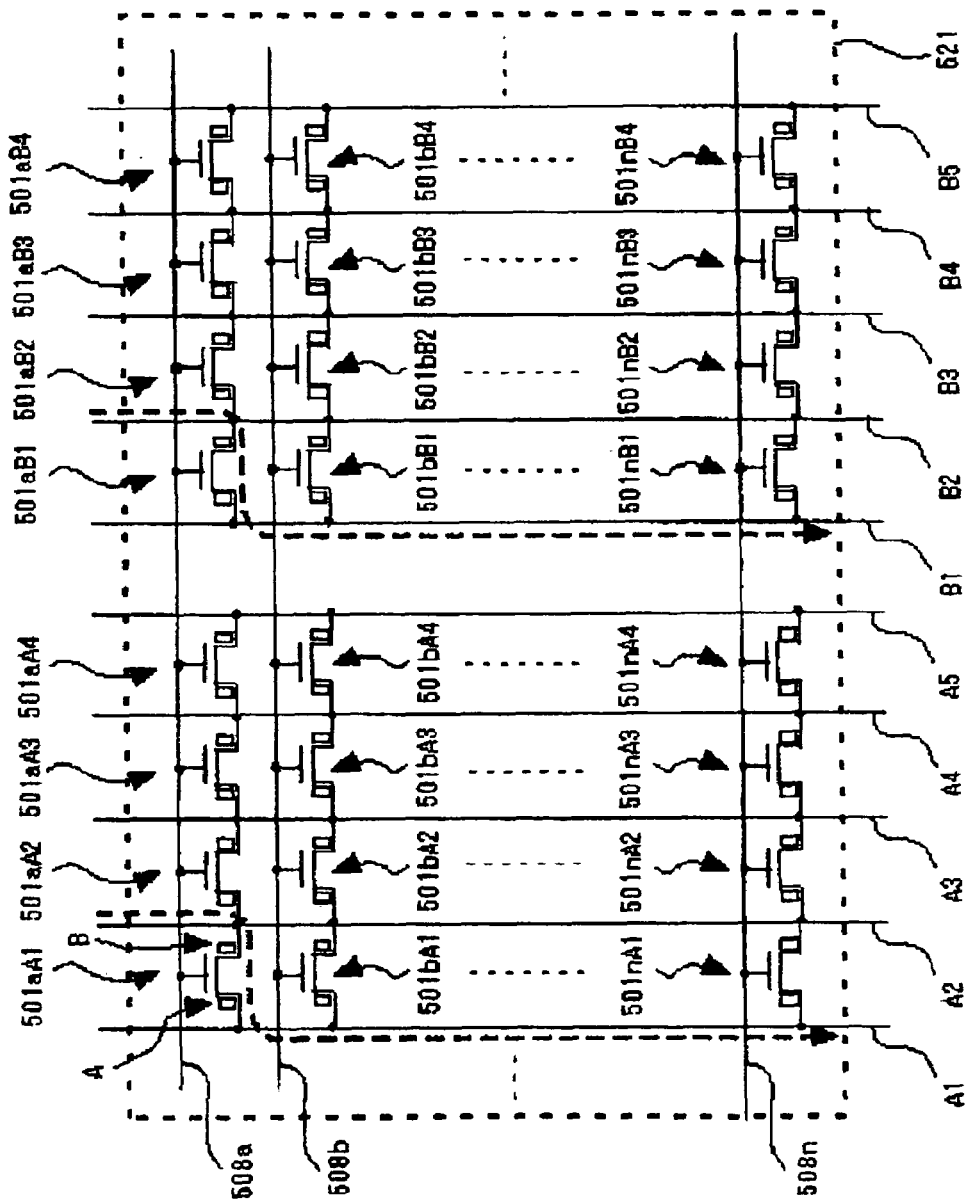
FIG. 20 is a circuit diagram showing a configuration example of a memory cell array in a semiconductor memory device (tenth embodiment) of the present invention.

FIG. 20 shows an example of the configuration of a memory cell array 521. In FIG. 20, 501aA1 to 501aA4, 501aB1 to 501aB4, ..., and 501nB1 to 501nB4 denote memory cells, 508a to 508n denote word lines, and A1 to A5 and B1 to B5 denote bit lines. Each memory cell has two memory functional elements. In order to identify the memory functional elements, the arrows A and B are designated to the memory functional elements of only the memory cell 501aA1, but are omitted to the other memory cells.

In the memory cell array configuration of FIG. 20, a bit line is shared by memory cells belonging to neighboring columns, so that memory cells can be arranged at high packing density, and the configuration is adapted to an increase in the storage capacity. Specifically, the bit lines A2 to A4 and B2 to B4 are shared. Although memory cells in four columns construct one block in the embodiment, the present invention is not limited to the number of columns.

The bit lines correspond to first and second bit lines used for the programming, erasing and reading operations of the memory cell described with reference to FIGS. 3 to 7 in the first embodiment. Depending on the programming, erasing or reading operation performed on the two memory functional elements of a selected memory cell, one of the two bit lines connected to the selected memory cell serves as the first bit line and the other bit line serves as the second bit line. In each of the programming, erasing and reading operations, voltages applied to the word line and two bit lines connected to the selected memory cell are as described in the first embodiment and their description will not be repeated. In order to set the memory cell in a not-selected state, that is, to prevent the programming, erasing and reading operations from being performed, 0 V (the gate voltage by which a channel is not formed below the gate insulating film of the memory cell) is applied as the voltage on the word line and/or the voltage difference between the two bit lines connected to the memory cell is set to a voltage difference by which the programming, erasing and reading operations are not performed. Therefore, in the case of a not-selected memory cell connected to the same word line as the selected memory cell, a not-selected state is set by the latter method. In the case of a not-selected memory cell connected to the same bit line as the selected memory cell, a not-selected state is set by the former method. In the case of a not-selected memory cell which is not connected to the same word line and the same bit line as the selected memory cell, a not-selected state is set by both of the methods.

Although not shown, a circuit for driving a word line is connected to a word line so as to selectively apply a proper voltage to each of a selected memory cell and a not-selected memory cell in each of the programming, erasing and reading operations. To a bit line, a circuit for driving the bit line to selectively apply a proper voltage to each of the selected memory cell and the not-selected memory cell in each of the programming, erasing and reading operations, and a sense amplifier for sensing a drain current flowing in the second bit line and reading a storage state of the memory functional element in the reading operation are connected. The sense amplifier can be realized by applying a known differential amplifier or the like.

In the semiconductor memory device of the embodiment, as described above, a bit line is shared by memory cells belonging to neighboring columns, so that the packing density can be largely improved. As a result, the manufacturing cost is largely reduced and a cheap semiconductor memory device can be obtained. The configuration of the memory cell array in the semiconductor memory device of the present invention is not limited to the configuration shown in FIG. 20.

Preferably, in the semiconductor memory device of the embodiment, a logic transistor is also mounted on the same semiconductor chip.

Figure 21:
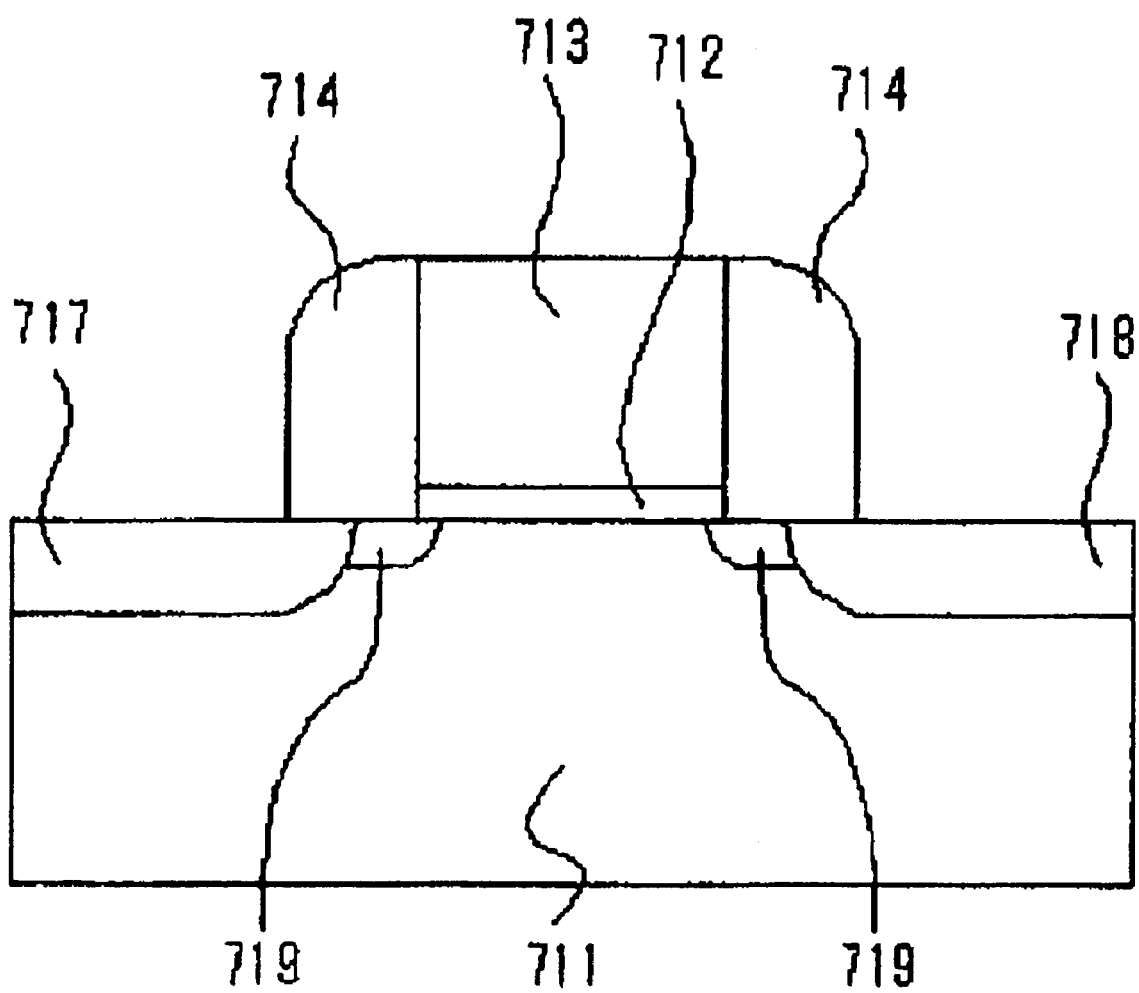
FIG. 21 is a schematic sectional view showing a main part of a normal transistor.

Since the procedure for forming the memory cell of the embodiment is very compatible with a normal standard transistor forming process, a process of forming both the semiconductor memory device or the memory cell and a logic transistor is very simple. In a standard transistor as a component of a logic circuit part and an analog circuit part, as shown in FIG. 21, usually, a gate electrode 713 having sidewall spacers 714 made by an insulating film on its side walls is formed over a semiconductor substrate 711 via a gate insulating film 712. A source region 717 and a drain region 718 are formed on both sides of the gate electrode 713. Each of the source region 717 and the drain region 718 has an LDD (Lightly Doped Drain) region 719. Therefore, the standard transistor has a configuration similar to that of a memory cell in the semiconductor memory device. In order to change the standard transistor to the memory cell, for example, the function of a memory functional element is given to the sidewall spacer 714 and it is unnecessary to form the LDD region 719.

More specifically, it is sufficient to change the sidewall spacer 714 to have a structure similar to, for example, the memory functional elements 261 and 262 in FIG. 8. At this time, the ratio of thicknesses among the silicon oxide films 241 and 243 and the silicon nitride film 242 can be properly adjusted so that the memory cell performs a proper operation. Even when the sidewall spacers of a transistor as a component of the standard logic part have a structure, for example, similar to those of the memory functional elements 261 and 262 of FIG. 8, as long as the width of the sidewall spacer (that is, the total film thickness of the silicon oxide films 241 and 243 and the silicon nitride film 242) is proper and the operation is performed in a voltage range in which the rewriting operation is not performed, the transistor performance does not deteriorate.

In order to form an LDD region in a transistor as a component of a standard logic part, it is sufficient to inject impurity for forming the LDD region after formation of a gate electrode and before formation of a memory functional element (sidewall spacer). Therefore, a memory cell and a standard transistor can be formed simultaneously and easily only by masking the memory cell with a photoresist at the time of injecting impurity for forming the LDD region.

A process of forming the conventional flash memory is largely different from that of a standard logic. Accordingly, as compared with the conventional case of using the flash memory as a nonvolatile memory and forming the flash memory simultaneously with a logic circuit and an analog circuit, in the semiconductor memory device of the present invention, the number of masks and the number of processes can be dramatically reduced. Consequently, the yield in manufacturing of a chip on which a logic circuit and an analog circuit are formed simultaneously with the nonvolatile memory cell is improved. Because of this, the manufacturing cost is reduced and, moreover, a very-reliable, cheap semiconductor memory device can be obtained.

ELEVENTH EMBODIMENT

An eleventh embodiment of a semiconductor memory device according to the present invention will now be described. The semiconductor memory device having a memory cell array obtained by arranging a plurality of memory cells, for example, as described in the first to eighth embodiments in a row direction and a column direction so as to form a matrix as described in the tenth embodiment includes: a user interface circuit for accepting commands issued by an external user; and an array control circuit for executing an operation on the memory cell array. Herein, the external user denotes an external device (such as a CPU or another memory device) connected to the semiconductor memory device according to the present invention (hereinafter, appropriately referred to as "the inventive device") via an external data bus and an external address bus to use the inventive device.

Figure 22:
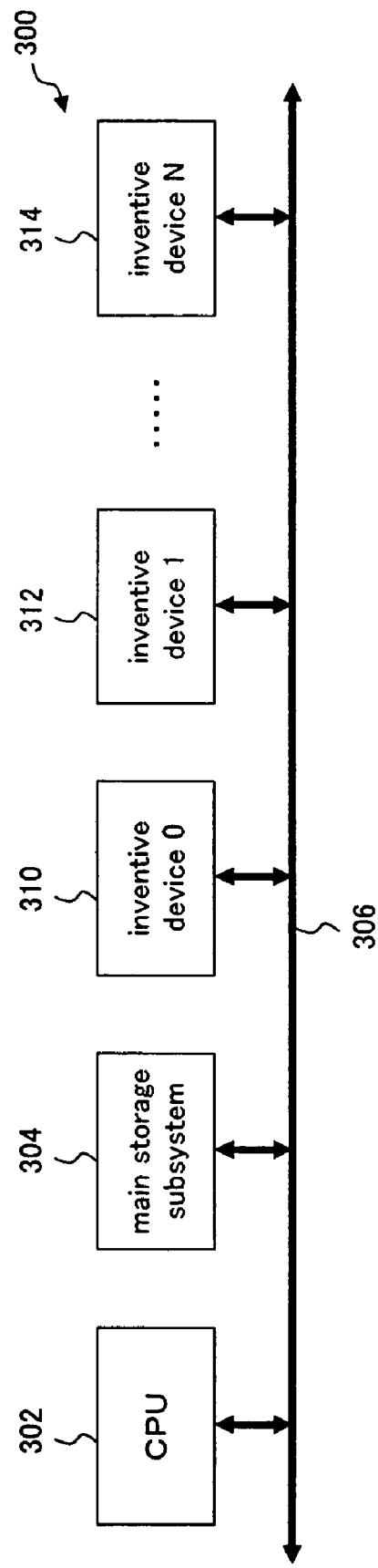
FIG. 22 is a block diagram showing a schematic configuration of a computer system having a semiconductor memory device (eleventh embodiment) of the present invention.

FIG. 22 shows a block configuration of a computer system 300 using the inventive devices 310 to 314. The computer system 300 includes a central processing unit (CPU) 302, a main storage subsystem 304, and one or plural inventive devices 310 to 314. The CPU 302 communicates with the main storage subsystem 304 and the inventive devices 310 to 314 via a user bus 306.

The inventive devices 310 to 314 provide a nonvolatile large-capacity data memory device which can be accessed at random to the computer system 300. The number of the inventive devices 310 to 314 is determined by a nonvolatile random-accessible memory capacity required by the computer system 300 and a single memory capacity of the inventive devices 310 to 314. The CPU 302 generates a read cycle and reads data stored in the inventive devices 310 to 314 via the user bus 306. The CPU 302 transfers a program command and a program data block to the inventive devices 310 to 314 via the user bus 306 and performs programming on the inventive devices 310 to 314.

Figure 23:
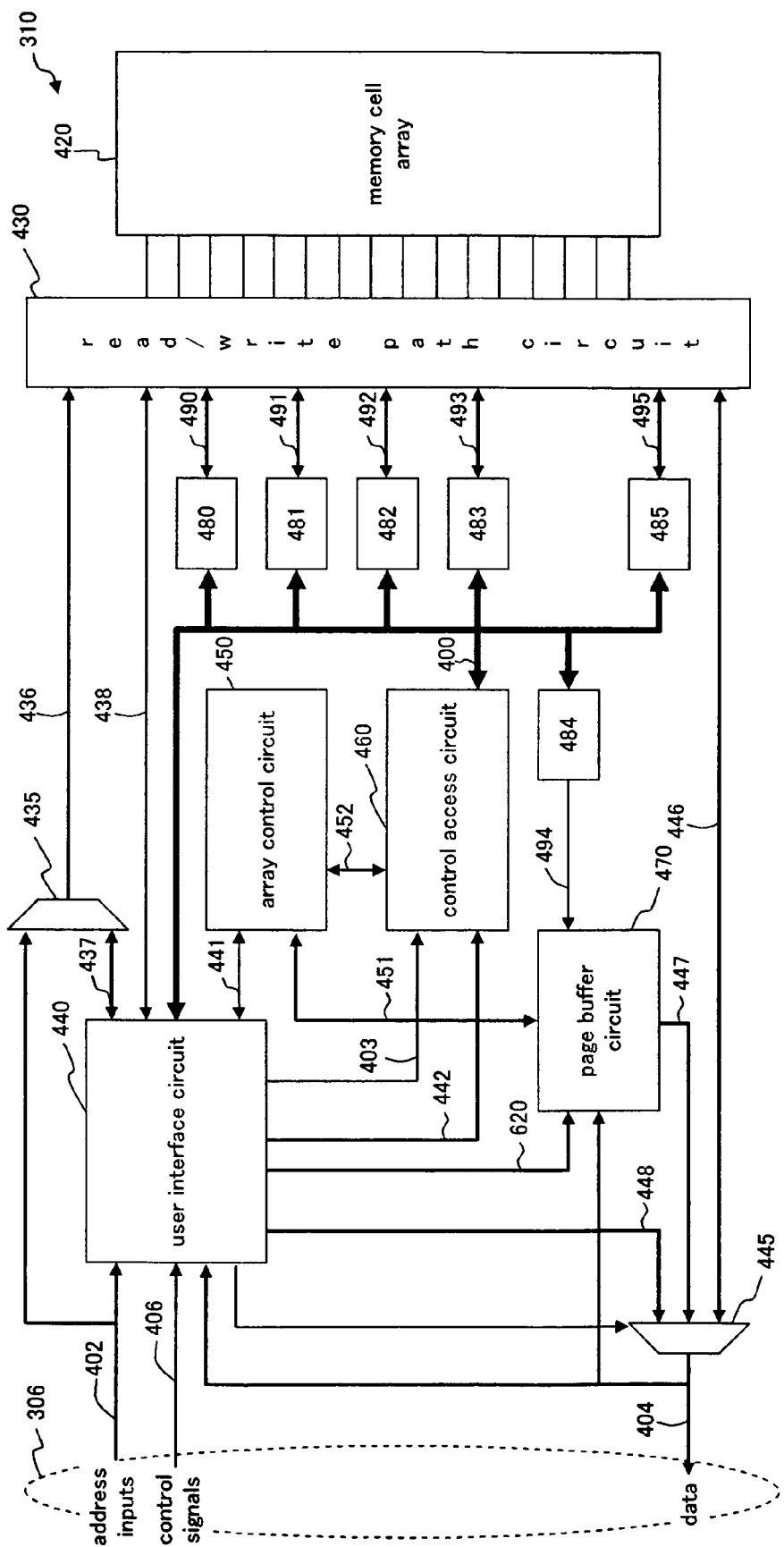
FIG. 23 is a block diagram showing a configuration example of the semiconductor memory device (eleventh embodiment) of the present invention.

FIG. 23 shows a block configuration of the inventive device 310. The inventive device 310 includes a memory cell array 420, a user interface circuit 440, an array control circuit 450, a page buffer circuit 470, control register circuits 480 to 485, and a read/write path circuit 430. The memory cell array 420 provides a nonvolatile large-capacity data memory device which can be accessed at random, and can be configured by using, for example, the array configuration of the memory cell array 521 shown in FIG. 20 in the tenth embodiment. As the memory cells configuring the memory cell array 420, the memory cells described in any of the first to eighth embodiments can be used. As an example, the memory cell array 420 is divided in 32 array blocks.

The inventive device 310 is connected to the user bus 306. The user bus 306 is configured by a user address bus 402, a user data bus 404 and a user control bus 406. The user interface circuit 440 receives data, a command and address information from a master device such as a microprocessor and stores the information into a buffer. Preferably, the buffer is configured by a plurality of buffers so that a plurality of requests can be received from the master device and a determining process can be performed by the user interface circuit 440. A high priority can be given to a specific command on the basis of the state of the array control circuit 450 and the specific command can be replaced with a command being presently executed by the array control circuit 450 so as to be subjected to urgent execution. The user interface circuit 440 further receives status information from the array control circuit 450 and can provide the information to the master device.

The user interface circuit 440 receives and processes an operation request sent via the user bus 306, thereby enabling the memory cell array 420 to be accessed via the user bus 306. When the user interface circuit 440 receives the operation request, the address, data and command information received from the user bus 306 are stored into the buffer provided in the user interface circuit 440. In the case where the operation request is an array control circuit operation such as a program or erase command, the command and data received by the user interface circuit 440 are transferred to the array control circuit 450 so as to execute the requested command via a queue bus 441. The address information is transferred to the read/write path circuit 430 via a multiplexer 435 by the user interface circuit 440, and the command is executed in the address sent via an address line 436. Reading operation is permitted when the array control circuit 450 is not operating. The user interface circuit 440 transfers a read address to the read/write path circuit 430 and sets an output multiplexer 445 so as to output the read data from the memory cell array 420.

The user interface circuit 440 and the array control circuit 450 share the page buffer 470 which can be accessed from both of the circuits 440 and 450. The page buffer 470 enables the inventive device 310 to perform various operations. For example, in order to store a sufficient amount of data, continuously program the data into the memory cell array 420 and, as a result, improve program throughput, the page buffer 470 can be used to buffer data to be programmed into the memory cell array 420.

As described above, the page buffer 470 can be accessed by both the user interface circuit 440 and the array control circuit 450. For example, the page buffer 470 is used to perform a high-speed programming operation to the memory cell array 420. Data is, preferably, stored in the page buffer 470 by the user interface circuit 440 for a subsequent array programming operation. A user command for programming data existing on the two page buffers into the memory cell array 420 can be queued through a queue structure of the user interface circuit 440 in a manner similar to other array control circuit commands. By executing the commands by using data stored in the page buffer 470, the operation of programming data into the memory cell array 420 is performed. Specifically, the user can load data of one page buffer, issue an array control circuit command using the data in the page buffer, and then load data in a second page buffer which is made valid by the user interface circuit 440 after the first array control circuit command is issued.

The page buffer 470 is configured, as a preferred embodiment, by an SRAM cell array of 128×19×2. The page buffer 470 has some operation modes and can be accessed by the user interface circuit 440 and the array control circuit 450. Depending on the operation mode, the page buffer 470 is configured as an 8-bit, 16-bit or 19-bit memory. The operation mode can control whether the page buffer 470 is configured by one continuous memory plane or two memory planes. Each plane can be simultaneously accessed by the circuits. In a mode other than the test mode, preferably, the page buffer 470 is divided into two memory planes. The 2-plane structure enables the array control circuit 450 perform a read/write access to the half of the memory and enables the user interface circuit 440 perform the read/write access to the other half of the memory. The accessible half is not fixed. Rather, the ownership of the planes can alternate. For example, the method can be used for the case where the user interface circuit 440 transfers data of one page to the array control circuit 450 to program data of the page to the memory cell array 420. First, the user interface circuit 440 accumulates data of one plane in the page buffer 470 and then issues a command (ump offset) to execute programming of the page to the array control circuit 450. When a proper command is received by using an internal logic and a control signal, the array control circuit 450 instructs a plane just loaded by the host CPU, and the user interface circuit 440 controls the other plane to which data is programmed. There are consequently two planes which can be accessed independently. Writing to the page buffers is pipeline-processed and the order is determined so as to continuously program data into the memory cell array 420 to improve the data throughput.

The page buffer 470 can be used by an algorithm of the array control circuit 450 for various purposes. For example, a multi-block erase algorithm (algorithm of erasing a plurality of array blocks) can store multi-block erase information by using the page buffer 470. As a result, an interruption during the multi-block erase operation can be provided. Further, the array control circuit 450 can use the page buffer 470 to store a jump offset for pipeline programming, data, and address information. The external user can use the page buffer 470 as a high-speed read/write memory via the user interface circuit 440. In a test mode, the array control circuit 450 can be instructed to execute an instruction stored in the page buffer 470. The page buffer 470 therefore functions as a storage of a microcode for the array control circuit 450. In the test mode, the page buffer 470 is, preferably, reconfigured to one continuous plane.

The array control circuit 450 controls various different components necessary for programming, erasing and verification (verification of the programming and erasing operations) of the memory cell array 420 via a central control bus 400. The array control circuit 450 is a dedicated reduced instruction set processor for executing programming, erasing and other operations on the memory cell array 420. The array control circuit 450 has an arithmetic and logic unit, a general register, a control store and a control sequencer. The array control circuit 450 uses information received via the queue bus 441 in order to access a proper location in a program memory for executing an instruction necessary to execute the operation. In order to apply a program/erase voltage to a memory cell in the memory cell array 420, the array control circuit 450 executes an implementation algorithm for ordering a memory cell voltage circuit in the read/write path circuit 430. The array control circuit 450 controls the memory cell voltage circuit and accesses the control register circuits 480 to 485 via the central control bus 400, thereby addressing the memory cell array 420.

The read/write path circuit 430 has a read path circuit and a write path circuit for accessing the memory cell array 420. More specifically, the read/write path circuit 430 has a program/erase load circuit for applying a program voltage or an erase voltage to a bit line in the memory cell array 420, particularly, to a bit line of a selected memory cell at the time of programming/erasing.

Each of the control register circuits 480 to 485 has a set of dedicated control registers and an attachment circuit for issuing a control signal to the read/write path circuit 430. Data is written/read to/from the dedicated control register via the central control bus 400.

In this embodiment, in order to access the control register circuits 480 to 485 via the central control bus 400, a control access circuit 460 activates both of the user interface circuit 440 and the array control circuit 450. In the normal mode of the inventive device 310, the array control circuit 450 controls the control access circuit 460 and accesses the control register circuits 480 to 485 via the central control bus 400.

In this embodiment, the array control circuit 450 transfers a program control signal and a register address together with corresponding program data to the control access circuit 460 via a bus 452, thereby writing the data into the dedicated control register. In order to write the data into the addressed dedicated control register, the control access circuit 460 generates a program cycle via the central control bus 400. The array control circuit 450 transfers register address and a read control signal to the control access circuit 460 via the bus 452 to read data in the dedicated control register. The control access circuit 460 generates a read cycle via the central control bus 400 to read data in the addressed dedicated control register.

For example, the control register circuit 480 has a dedicated control register, and a circuit for controlling a memory cell voltage circuit of the read/write path circuit 430 on the basis of a control signal group 490. The control register circuit 481 has a control register, and a circuit for controlling a special column access circuit (for accessing a bit line) in the read/write path circuit 430 on the basis of a control signal group 491. The control register circuit 482 has a set of read only registers for detecting and latching a status signal group 492 from the read/write path circuit 430. The control register circuit 483 has a control register, and a circuit for controlling a read path circuit of the read/write path circuit 430 on the basis of a control signal group 493. The control register circuit 484 has a register for controlling a test mode group of the page buffer 470. The control register circuit 485 has a register for controlling special test characteristics of the memory cell array 420 on the basis of a control signal group 495.

The user interface circuit 440 controls the input address multiplexer 435 for selecting an input address to the read/write path circuit 430. The selected input address 436 is either an address detected by an input buffer (not shown) on the user address bus 402 or an address 437 latched by the user interface circuit 440. The input address 436 is made invalid by programming the control register in the control register circuit 484.

The user interface circuit 440 controls the output data multiplexer 445 to select a source for transferring output data via the user data bus 404. Selected output data is memory cell array data 446 from the read/write path circuit 430, page buffer data 447 from the page buffer 470, or block status register (BSR) data 448 from a block status register group provided in the user interface circuit 440. That is, the device requesting for data can receive data from the memory cell array 420 like status information regarding the status of the inventive device 310.

Therefore, the CPU 302 reads data in the memory cell array 420 by transferring an address via the user address bus 402 while transmitting a read cycle via the user control bus 406. The user interface circuit 440 detects the read cycle and makes the input address multiplexer 435 transfer the address from the user address bus 402 to a row and column decoding circuit in the read/write path circuit 430. Further, the user interface circuit 440 makes the output data multiplexer 445 transfer read data addressed in the read/write path circuit 430 to the user data bus 404.

The CPU 302 generates a program cycle for transferring a program command and data to the user interface circuit 440 via the user bus 306, and programs data into the memory cell array 420. The user interface circuit 440 verifies the program command and queues the program command, an address and a data parameter into (the queue in) the array control circuit 450. The array control circuit 450 executes a programming operation by programming specified data into the memory cell array 420 in a specified address.

According to the circumstances, the CPU 302 generates a program cycle for transferring program data into the page buffer 470 via the user bus 306 and programs data into the memory cell array 420. The CPU 302 transfers a program command using the page buffer to the user interface circuit 440. The user interface circuit 440 verifies the program command using the page buffer and queues the program command using the page buffer to (the queue in) the array control circuit 450. The array control circuit 450 reads data from the page buffer 470 and programs the program data into the memory cell array 420, thereby executing the program command using the page buffer.

The page buffer 470 is configured by two static random access memory (SRAM) planes. The two SRAM planes are a plane 0 and a plane 1. The user interface circuit 440 distributes page buffer resources of the planes 0 and 1 to user commands processed by the array control circuit 450. The user interface circuit 440 also distributes the page buffer resources of the planes 0 and 1 to user accesses. In some cases, the page buffer resources in the planes 0 and 1 are referred to as limited resources.

The user interface circuit 440 has 32 block status registers (BSR). Each BSR corresponds to each of 32 divided array blocks in the memory cell array 420. The array control circuit 450 holds a status bit indicative of the status of each of the array blocks in the memory cell array 420 in a block status register. The CPU 302 reads data in the BSRs via the user bus 306.

The user interface circuit 440 has an arbitration function between the user or a microprocessor for generating a command and the array control circuit 450 for executing a selected command. For example, the user interface circuit 440 determines whether an operation requested by the user is valid or not in the present state of the array control circuit 450. The user interface circuit 440 receives a command and address information as an input via the user bus 306 and determines an operation to be executed by the array control circuit 450. Further, the user interface circuit 440 controls queuing of an address and data, a user access to the status register, and the output multiplexer 445.

Figure 24:
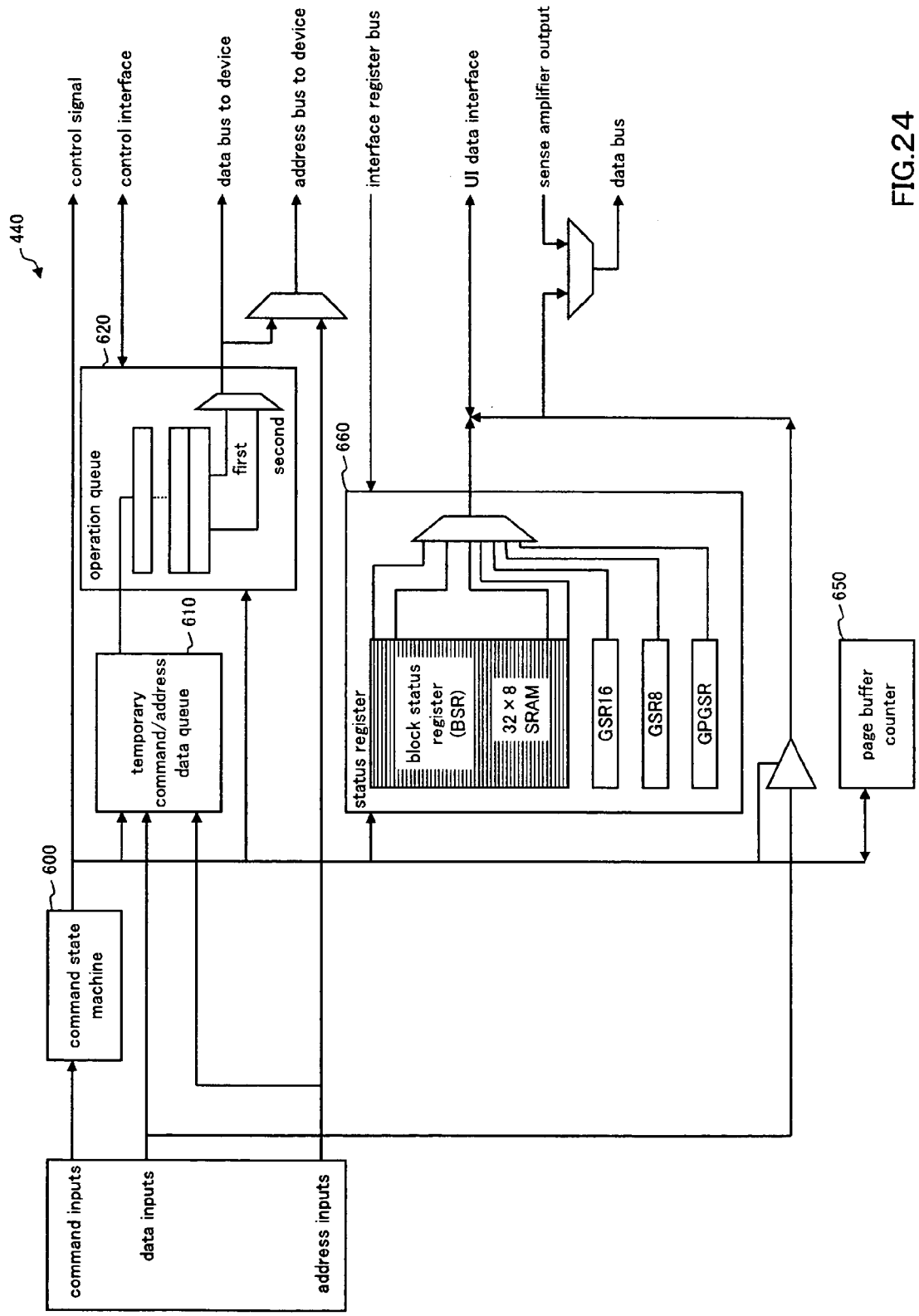
FIG. 24 is a block diagram showing a configuration of a user interface circuit of the semiconductor memory device (eleventh embodiment) of the present invention.

FIG. 24 shows a block configuration of the user interface circuit 440. Referring to FIG. 24, a command state machine 600 determines an operation to be executed on the basis of a command request submitted via the user bus 306 by the CPU 302. Types of the commands include an array operation as well as a status register, a test mode and a page buffer operation. The command state machine 600 knows a method of excluding the user from a right command sequence and a defective command sequence and a method of starting and interrupting the array control circuit 450 through an algorithm encoded in the circuit. In the case where an operation of a command is to be executed in the array control circuit 450, the command is transferred to the array control circuit 450. In the case where reading operation is executed, the command state machine 600 transmits an address to the read/write path circuit 430. The command state machine 600 controls data obtained as an output of the output data multiplexer 445 (see FIG. 23) and an input to the input address multiplexer 435 (see FIG. 23). The command state machine 600 also controls an access to a status register 660. The command state machine 600 also recognizes a user command input received via the user bus 306 and instructs a procedure of executing the user command input to another circuit part in the inventive device 310.

If a requested command is a command which is not executed by the array control circuit 450, such as an array read command or a status register read command, the user interface circuit 440 generates a control signal proper to execute the requested command. If the received command request is a command to be executed by the array control circuit 450, a command code representative value of the command request received by the user interface circuit 440 is used to generate an index to a jump table (not shown) of the array control circuit 450 in the user interface circuit 440. An offset vector depending on the received command, stored in the jump table, and mapped to the command code is sent to the array control circuit 450, and the array control circuit 450 uses the offset vector to address a code for an algorithm for executing the command. Preferably, in order to determine an actual program memory address to start execution of the command, the offset vector refers to one of the first 32 locations in the program memory. In this embodiment, up to 128 commands of four different types can be received by the user interface circuit 440 and processed.

In this embodiment, it is preferable to configure the jump table so that a plurality of commands are mapped to a single offset vector. Because of the dual-redundancy of the offset vector, the plurality of types of commands are discriminated from each other by hardware configurations to be employed, and the commands can be mapped to the algorithm of the same array control circuit 450. Therefore, a plurality of hardware configurations can be supported without changing the user interface circuit 440 or the array control circuit 450. With respect to this point, a command code converting mechanism generates a proper hardware control signal and a proper offset vector for communication with the array control circuit 450.

Preferably, the command code is received by the command state machine 600 in order to generate a hardware control signal. After that, the command is transferred to a temporary command/address data queue 610 including a jump table for converting the command code to an offset vector before it is output to an operation queue 620. The type of the hardware control signal to be generated depends on the configuration of the system (the inventive device 310). For example, in this embodiment, the hardware control signal is generated to specify whether the page buffer 470 is used or not, a page buffer used, and an operation of either 8 bits or 16 bits.

FIG. 25 shows two user commands as an example. Other than the two user commands, some command codes and the array control offset vectors are assigned for a custom algorithm executed by the array control circuit 450. In order to customize the inventive device 310, it is sufficient to simply load a code for executing the custom algorithm into the program memory in the array control circuit 450. Therefore, the inventive device 310 is customized so as to execute a command specified to a specific user application. Further, the command set has adaptability and it is possible to add a new command and to change an existing command function without changing the user interface circuit 440.

The command function can be easily changed only by correcting a program memory address stored in the first 32 locations in the program memory referred to for a different program location. Moreover, the function of the array control circuit 450 is not limited to the algorithm given to the inventive device 310 at the time of manufacturing. Specifically, the inventive device 310 provides an updatable program memory as a variable program memory in which an array control algorithm can be updated or adjusted or to which an array control algorithm can be added after manufacture. Preferably, the program memory is updated via a command which is predetermined for updating the program memory and is generated by the CPU (external user). The user interface circuit 440 accepts the command and makes the array control circuit 450 execute the algorithm for updating the program memory temporarily stored in the page buffer 470. In such a manner, the start address of the algorithm and the algorithm itself can be changed, erased or added. For example, the program memory can be updated to have a new algorithm received from the external user.

In the case where the command is a command to be executed by the array control circuit 450, the command, address and data information are provided to the temporary queue 610 so as to be subjected to processes of the user interface circuit 440. Particularly, once the command, address and data information are received by the temporary queue 610 and the command is converted to an offset vector, the information is transferred to the operation queue 620. When the array control command is provided to the command state machine 600, the command state machine 600 transfers the command, address and data information to the temporary queue 610 and, subsequently, the temporary queue 610 transfers the information to the operation queue 620. The temporary queue 610 holds the command until the operation queue 620 becomes ready to receive the command in one of queues operating. The transfer of information to the temporary queue 610 is synchronized with a program enable signal (clock) received via the user control bus 406. The operation queue 620 receives the command from the temporary queue 610 and sets the command into an operating queue which is driven synchronously with the clock of the array control circuit 450. When the command state machine 600 transfers information to the temporary queue 610, the command state machine 600 also sets a flag notifying the operation queue 620 of the fact that there is the command waiting to be set in an operating queue. Once the operation queue 620 moves the command from the temporary queue 610 to one of operating queues, the flag is reset. The flag is used as a queue full bit (a bit indicating that the queue is full) by the status register 660. The queue full bit is used to notify the inventive device 310 of inhibition of issuing of a command requiring execution of the array control circuit 450 until the bit is cleared to the external user.

Preferably, the operation queue 620 can queue up two operations. However, it is obvious that operations more than two can be queued up. A first queue indicates an operation to be executed or being executed. A second queue holds data for the next operation to be executed after completion of operation of the first queue. When execution of an operation existing in the first queue is completed by the array control circuit 450, the first operation is erased from the operation queue 620 so that the next operation can be executed by the array control circuit 450. In the case where a command to be executed exists in the temporary queue 610, the offset vector, data and address are transferred to the operation queue 620 for continuous execution. In a predetermined case, it is preferable to execute an operation existing in the second queue prior to completion of a first operation existing in the first queue. In order to execute an operation existing in the second queue prior to completion of an operation existing in the first queue, an innovative order converting process is executed between the first and second operations.

Upon receipt of a command to be executed by the array control circuit 450, to the array control circuit 450, the user interface circuit 440 issues an activate signal for a local oscillator in the array control circuit 450 which provides a clock signal for driving the array control circuit 450. Once the array control circuit 450 operates, the offset vector is transferred from the user interface circuit 440 to the array control circuit 450 to index the program memory. The address and data information stored in the operation queue 620 are provided directly to the read/write path circuit 430 or provided from the control register. Execution of an operation using the address and data information of the read/write path circuit 430 is controlled according to an instruction given by the algorithm executed from the program memory by the array control circuit 450.

Preferably, the operation queue 620 is configured by a state machine for receiving the offset vector and address and data information from the temporary queue 610 and queuing up the offset vector and related address and data information for an access by the array control circuit 450.

In this embodiment, in order to support the command queuing and the pipeline process to the user interface circuit 440, commands in three layers are queued up. For example, in the case where a received command requires an operation of the array control circuit 450 and is not a command being executed at present, the user interface circuit 440 loads a first queue in the operation queue 620 by data for operation and starts the operation of the array control circuit 450. Usually, the array control circuit 450 has command information in the front end queue (first queue) at the time of discarding, and the lower end queue can be used for another command generated via the user bus 306 through the command state machine 600 and the temporary queue 610. With the configuration, while the array control circuit 450 is executing the first command, the external user can issue a command valid for the array control operation or another user interface circuit 440. Upon receipt of the next command, the user interface circuit 440 notifies the array control circuit 450 of the fact that a new operation is set in a queue, and an array control algorithm being executed at present determines whether the operation is interrupted to process the queued operation by the array control circuit 450 or the operation being performed is finished first. Preferably, a criterion of determination whether the algorithm being executed at present by the array control circuit 450 is interrupted or not is stored in the logic executed by the algorithm. For example, an algorithm for erasing blocks (erasure on an array block unit basis) includes a code for instructing that a program command which is input next can interrupt execution of an erasing algorithm.

In the structure of the user interface circuit 440, a command can be pipeline processed in the operation queue 620. For example, a one-byte program or two-byte word program command can be pipeline processed. A byte/word program command and a single block erasing command can be pipeline processed with respect to different array blocks in the memory cell array 420. A single block erasing command and a command of programming data to another array block from a page buffer can be pipeline processed. A command of programming data from a page buffer to an array block and a command of erasing another array block can be pipeline processed in a manner similar to a special algorithm (not listed).

The user interface circuit 440 includes a plurality of status registers 660. Some of the status registers can be accessed for reading/writing by the array control circuit 450 and can be read by the user interface circuit 440. The other status registers can be accessed for reading/writing by the user interface circuit 440. Each of the status registers can be accessed for reading by the user interface circuit 440 so that information indicative of an operation execution state of the array control circuit 450 can be monitored or sent by the array control circuit 450 and can be monitored by the user interface circuit 440 and the external user. The external user can issue a command for accessing the status register at any time in order to determine the state of the array control circuit 450. For example, preferably, before a command is issued to the inventive device 310, the array control circuit 450 is in a state where a command to be issued is received as a valid command. The state of the array control circuit 450 can be determined by reading the data in the status register 660.

In the status register 660, preferably, three global status registers (GSR) and 32 block status registers (BSR) are provided. The global status register provides general information of the inventive device 310, but does not provide any information related to array blocks. On the other hand, the block status register (BSR) is used to hold a status of an operation being executed on an array block.

As described above, the array control circuit 450 is a programmable microcontroller to control internal modes of the inventive device 310. More specifically, the array control circuit 450 provides means for automatically and precisely controlling various algorithms including an algorithm of operations of programming/erasing memory cells in the memory cell array 420. The array control circuit 450 is accessed via the user interface circuit 440 for controlling start of operation of the array control circuit 450. The array control circuit 450 operates in a cycle of two clocks per operation as a reference. Preferably, a clock cycle for preparing execution of an operation N is generated during execution of a clock cycle of an operation N-1. In such a manner, an array operation is executed in one clock cycle and only delay occurs before execution of a first command. In one clock cycle, a command execution is divided into three phases. By the division, clock edges sufficient to generate an I/O bus cycle are provided in one clock cycle.

Figure 26:
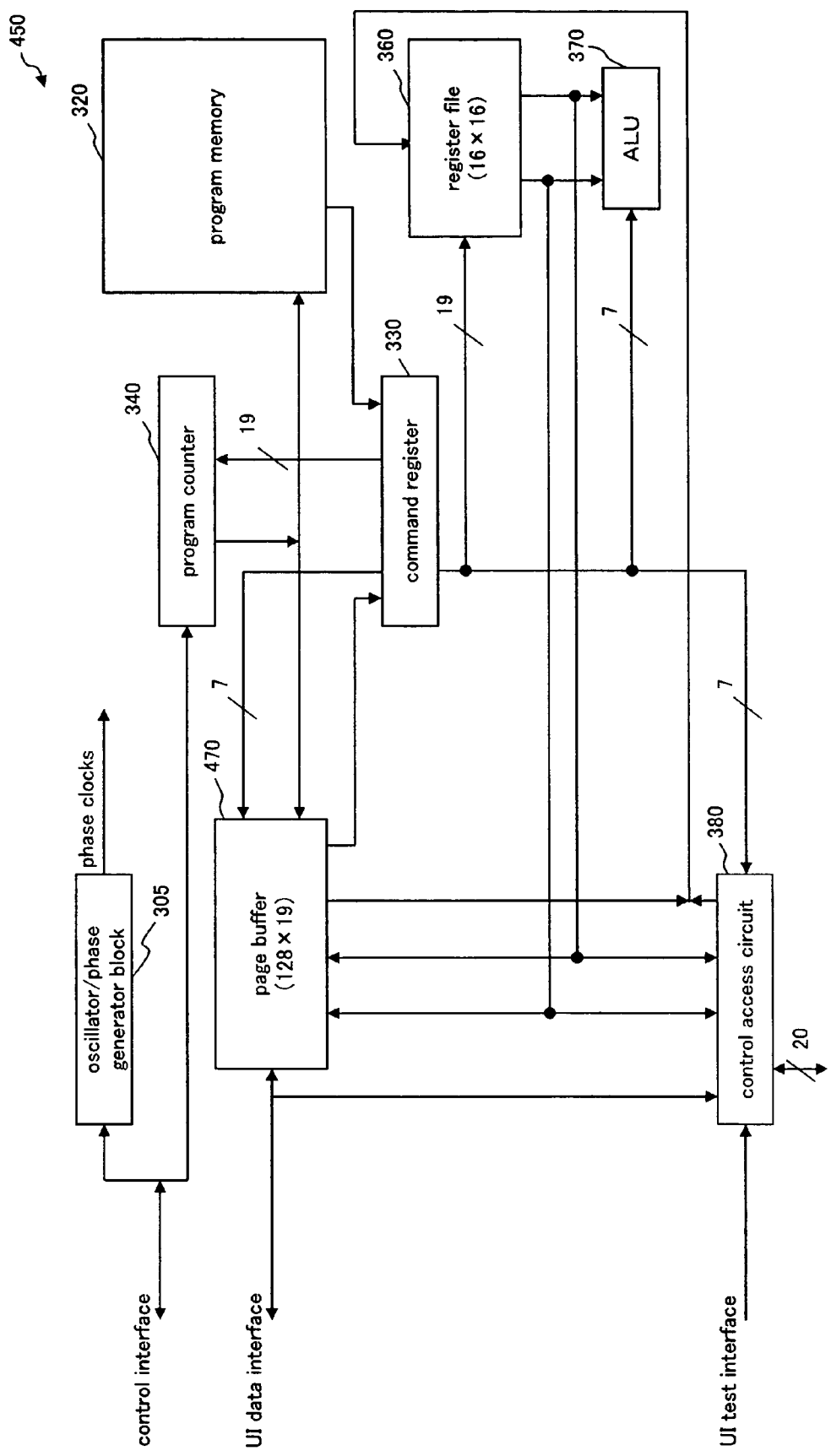
FIG. 26 is a block diagram showing a configuration of the array control circuit in the semiconductor memory device (eleventh embodiment) of the present invention.

Referring now to FIG. 26, the array control circuit 450 executes an algorithm stored in a nonvolatile memory region 320 configured by the memory cells (see the first to eighth embodiments) of the present invention. The algorithm is constructed by command words which are specifically a data transfer command, an arithmetic command, a branch command and a control command. The data transfer command relates to transfer of 8-bit or 16-bit data to/from a register file 360. The branch command permits programming of changing the flow of an algorithm through usage of a subroutine call and conditional/unconditional jump. The arithmetic command relates to an operation requiring an arithmetic logic unit (ALU) 370. The control command provides means for setting/clearing a flag and setting a pointer for an interrupting process routine.

A control access circuit 380 positioned between the user interface circuit 440 and the array control circuit 450 provides means for receiving a command by which the array control circuit 450 executes an algorithm and transmitting/receiving status information to/from the user interface circuit 440 and, finally, the external user. For example, in this embodiment, the user interface circuit 440 provides three signals CDRUNF, CDCMDRDY and CDSUSREQ. Herein, the signal CDRUNF notifies the array control circuit 450 of existence of an algorithm to be executed. The signal CDCMDRDY indicates that in addition to an algorithm being executed at present, at least one more algorithm is ready to be executed. The signal CDSUSREQ notifies the array control circuit 450 of existence of a request for interrupting and suspending array control execution. In response to the signal, the array control circuit 450 sends, to the user interface circuit 440, a signal FDRDY indicating whether or not the array control circuit 450 has a control on a device (the inventive device 310) and is executing the control, a signal FDNXTCMD indicating whether or not the array control circuit 450 is executing a command existing in a first queue or an interrupt command existing in a second queue, a signal FDOPDONE signal indicative of completion of an operation being performed at present, and a signal FDIDLE signal indicating that the operation is successfully interrupted and the external user can control the device (the inventive device 310) to execute an operation such as a reading operation.

As described above, the user interface circuit 440 is driven by a microprocessor bus signal and, on the other hand, the array control circuit 450 is driven by an oscillator provided in the inventive device 310. Specifically, an oscillator/phase generator block 305 generates three non-overlap clock pulses used as separate clock signals for the array control circuit 450. The oscillator/phase generator block 305 is activated by the user interface circuit 440 when a command from the user interface circuit 440 is to be executed.

The program memory 320 is accessed in accordance with a jump vector received from the user interface circuit 440 and a program address stored in the first 32 addresses in the program memory, and stores an algorithm to be executed by the array control circuit 450 to execute a requested function. An advantage realized by providing the programmable microcontroller is very large. An algorithm can be constructed in accordance with a request for an application provided by the inventive device 310. For example, a standard algorithm for programming and erasing processes is included in the program memory like the algorithm for the custom process of executing a process as a modification of the programming/erasing process and is accessed by issuing a corresponding command. Further, the user can correct the function of the array control circuit 450 by correcting the algorithm stored in the program memory via the command issued to the user interface circuit 440. This point is a point largely different from the conventional device requiring a change in hardware to change an algorithm. Preferably, the program memory is changed by the array control circuit 450 so as to be controlled by the user interface circuit 440. When the program memory itself is changed, a programming algorithm is loaded to the page buffer, and the array control circuit 450 refers to the page buffer for the algorithm for programming the program memory.

In order to execute the algorithm, the array control circuit 450 is embodied as a general processing structure and includes a command register 330 for storing a present command, a program counter 340, a call stack 345, an arithmetic logic unit (ALU) 370, and the register file 360 used as a scratch memory by the ALU 370 during execution.

The program counter 340 has a logic for maintaining a proper cycling of a command given to all of pointer storages and the array control circuit 450. Further, with the configuration, an innovative order converting and interrupting structure is provided. A basic operation of the program counter 340 is to decode the next command to be executed and instruct a following proper command. An address provided as an output of the program counter 340 is used to latch the next command from the program memory 320 for transfer to the command register 330 and execution by the ALU 370.

The program memory 320 receives the address determined by the program counter 340 and outputs a command to the command register 330 for latching a command output. In order to further improve the degree of freedom in the operation, the command register 330 can latch a command received via the page buffer 470. The command is executed by the ALU 370.

The register file 360 is configured as a 3-port SRAM and can be read from two ports while the array control circuit 450 programs data to the register file 360 through the third port. The two read ports and one program port operate independently of each other and, actually, can operate on the same memory location. The operation timing is such that a read operation occurs in the phase 1 of a clock and the programming operation occurs in the phase 3 of the clock. As a result, the phase 2 can be used as a calculation phase. Therefore, the register file 360 is read and updated in one clock cycle. The register file 360 holds the status of the array control circuit 450, particularly, a variable used during execution of an array control algorithm.

The register file 360 is divided in two sections. The first section as a main section holds a variable for an algorithm executed by the array 81. control circuit 450. The second section holds a variable for an interrupt algorithm. Therefore, when an interrupt is provided, the register file 360 can execute hardware order conversion of the status of the array control circuit 450 from the first section to the second section. All of operations are executed in the second section in the register file 360, which looks like the main section. All of variables held in the main section in the register file 360 are maintained but cannot be accessed during an interrupt. After completion of the interrupting process, the control on the main section restarts.

The configuration supports a program counter (PC) stack of four levels. Thus, an algorithm of programming data to the program memory 320 can be performed more in a module manner during operation. For example, a return command provides double functions together with the program counter stack. When data exists in the program counter stack, the return command provides a return from a called subroutine. When the program counter stack is empty, the command functions as an algorithm finishing command. It permits the user algorithm to be finished by the return command. As a result, the array control circuit 450 stops execution in the normal operation, and the user algorithm is called as if it is a subroutine in a test operation such as cycling.

TWELFTH EMBODIMENT

Figure 27:
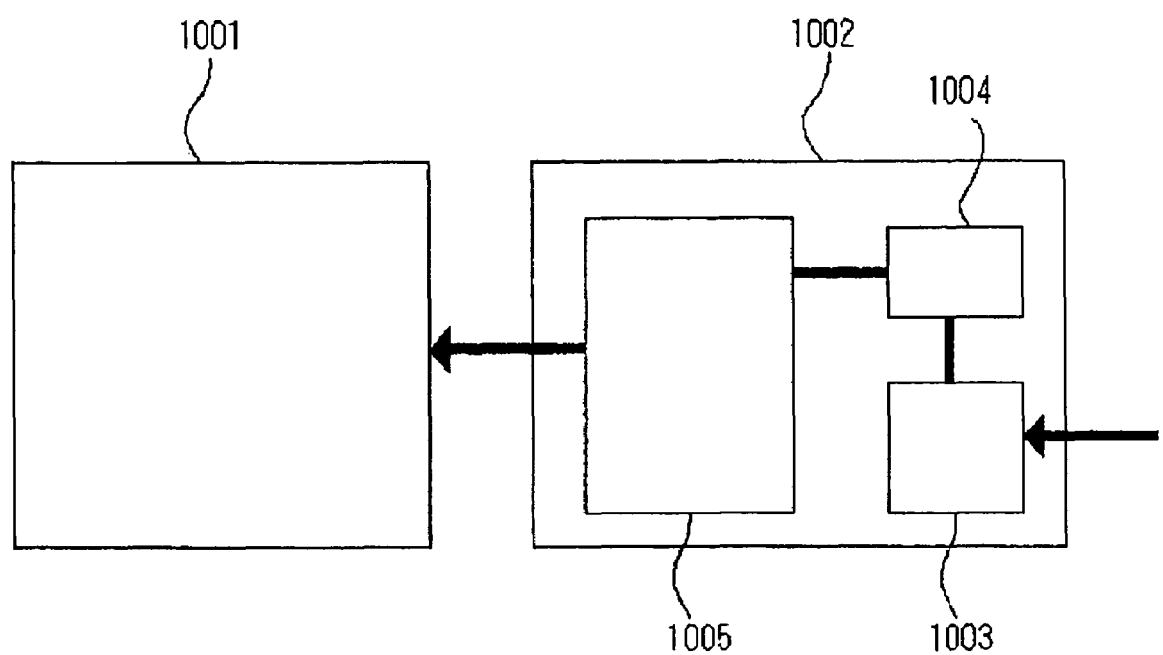
FIG. 27 is a schematic configuration diagram of a liquid crystal display (twelfth embodiment) in which the semiconductor memory device of the present invention is assembled.

As an application example of the semiconductor memory device, for example, as shown in FIG. 27, a rewritable nonvolatile memory for image adjustment of a liquid crystal panel can be mentioned.

A liquid crystal panel 1001 is driven by a liquid crystal driver 1002. In the liquid crystal driver 1002, a nonvolatile memory 1003, an SRAM 1004, and a liquid crystal driver circuit 1005 are provided. The nonvolatile memory 1003 is configured by the memory cell of the present invention, more preferably, the semiconductor memory device of any of the tenth to thirteenth embodiments. The nonvolatile memory 1003 can be rewritten from the outside.

Information stored in the nonvolatile memory 1003 is transferred to the SRAM 1004 at the time of turn-on of the power source of an apparatus. The liquid crystal driver circuit 1005 can read stored information from the SRAM 1004 as necessary. By providing the SRAM, high reading speed of stored information can be achieved.

The liquid crystal driver 1002 may be externally attached to the liquid crystal panel 1001 as shown in FIG. 27 or formed on the liquid crystal panel 1001.

In a liquid crystal panel, tones displayed by applying voltages in multiple grades to pixels are changed. The relation between the given voltage and the displayed tone varies according to products. Consequently, information for correcting variations in each product after completion of the product is stored and correction is made on the basis of the information, thereby enabling the picture qualities of products to be made uniform. It is therefore preferable to mount a rewritable nonvolatile memory for storing correction information. As the nonvolatile memory, it is preferable to use the memory cell of the present invention. Particularly, it is preferable to use the semiconductor memory device of the eleventh embodiment in which memory cells of the present invention are integrated.

By using the memory cell of the present invention as a nonvolatile memory for image adjustment of the liquid crystal panel, a process of simultaneously forming the memory cell and a circuit such as the liquid crystal driver is facilitated. Thus, the manufacturing cost can be reduced.

THIRTEENTH EMBODIMENT

Figure 28:
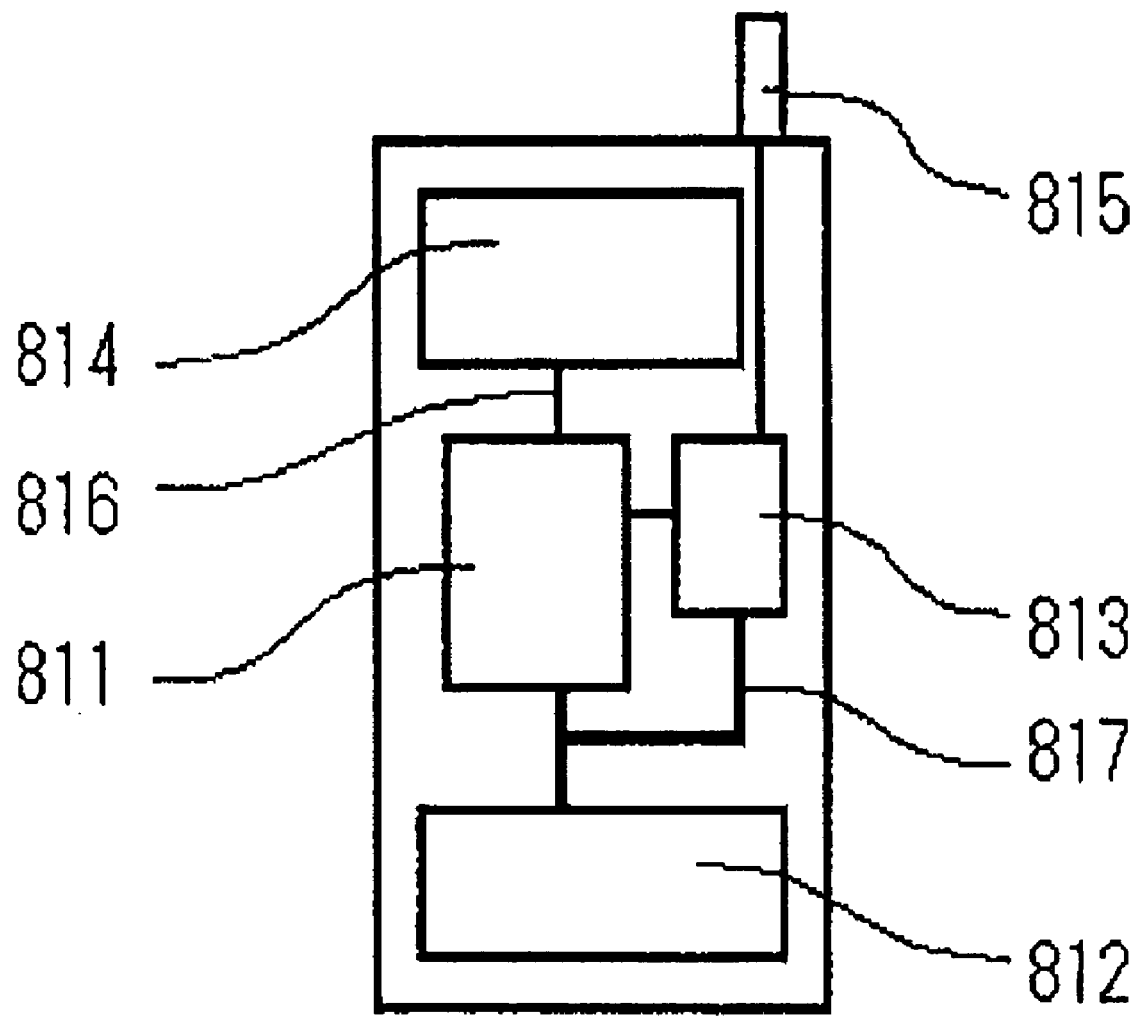
FIG. 28 is a schematic configuration diagram of a portable electronic apparatus (thirteenth embodiment) in which the semiconductor memory device of the present invention is assembled.
Figure 29:
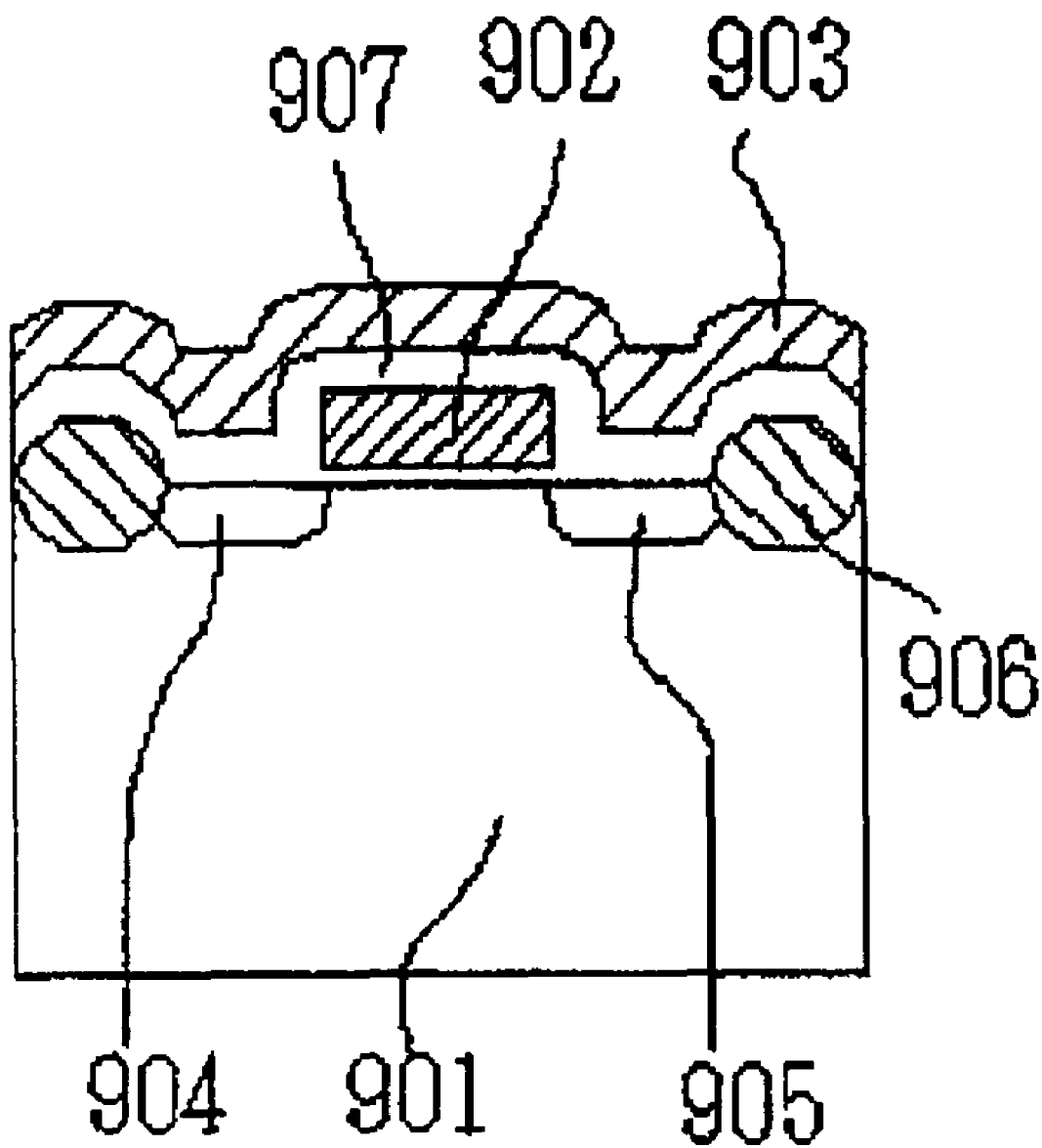
FIG. 29 is a schematic sectional view showing a main part of a conventional flash memory.

FIG. 28 shows a portable telephone as a portable electronic apparatus in which the semiconductor memory device is assembled.

The portable telephone is mainly configured by a control circuit 811, a battery 812, an RF (Radio Frequency) circuit 813, a display part 814, an antenna 815, a signal line 816, a power source line 817 and the like. In the control circuit 811, the semiconductor memory device of the present invention is assembled. The control circuit 811 is preferably an integrated circuit using cells having the same structure as a memory circuit cell and a logic circuit cell as described in the tenth embodiment. It facilitates fabrication of the integrated circuit, and the manufacturing-cost of the portable electronic apparatus can be particularly reduced.

By using the semiconductor memory device capable of performing high-speed reading operation and whose process of simultaneously mounting a memory part and a logic circuit part is easy for a portable electronic apparatus, the operation speed of the portable electronic apparatus is increased, and the manufacturing cost can be reduced. Thus, a cheap, high-reliability and high-performance portable electronic apparatus can be obtained.

The present invention can provide a semiconductor memory device having the high degree of freedom in use and application and realizing largely improved throughput of operations to be processed as a whole. Overhead of a microprocessor using the semiconductor memory device according to the present invention can be minimized, and there is no fear of erroneous operations and over-erasure of a memory cell array. Components of the semiconductor memory device according to the present invention cooperate with each other, thereby providing all of functions for operations of the memory cell array.

In the memory cell, a memory function of the memory functional element and a transistor operation function of the gate insulating film are separated from each other. Consequently, it is possible to suppress the short channel effect by thinning the gate insulating film without deteriorating the memory function.

Further, a value of current flowing between the diffusion regions changes by rewriting more largely than that in the case of an EEPROM. Therefore, it facilitates discrimination between the programming state and the erasing state of the semiconductor memory device, and the reliability can be improved.

Further, the memory cell can be formed by a process which is very compatible with a normal transistor forming process. Therefore, as compared with the case of using a conventional flash memory as a nonvolatile memory cell and configuring the semiconductor memory device by the nonvolatile memory cell and an amplifier which is usually made by a transistor, the number of masks and the number of processes can be dramatically reduced. Consequently, the yield in manufacturing of a chip on which both of the amplifier and the nonvolatile memory cell are formed can be improved, the manufacturing cost is reduced and, accordingly, a very-reliable, cheap semiconductor memory device can be obtained.

In the case where the gate electrodes in a pair of memory cells integrally function as a word line and the memory functional elements in the pair of memory cells are integrally shared on both sides of the gate electrode, wiring for connecting the gate electrodes can be omitted and the packing density of the semiconductor memory device can be improved. It is unnecessary to separate the memory functional elements for each memory cell, so that the manufacturing process can be simplified.

In the case where the memory functional element is formed so that at least a part thereof overlaps with a part of the diffusion region, reading speed of the semiconductor memory device can be increased sufficiently high.

When the memory functional element includes a film having the function of retaining charges and having a surface almost parallel with a surface of the gate insulating film, variations in the memory effect of the memory cell can be reduced and variations in the read current of the semiconductor memory device can be suppressed. Since a characteristic change in the memory cell which is storing information can be reduced, the information retaining characteristic of the semiconductor memory device can be improved.

When the film having the function of retaining charges is disposed almost parallel with a side face of the gate electrode, rewriting speed of the memory cell increases, so that the rewriting operation of the semiconductor memory device can be performed at high speed.

In the case where the memory functional element includes an insulating film for separating between the film having the function of retaining charges and the channel region or the semiconductor layer, and the insulating film is thinner than the gate insulating film and has a thickness of 0.8 nm or more, the voltage in the programming and erasing operations of the semiconductor memory device can be lowered or the programming and erasing operations can be performed at higher speed. Since the memory effect of the memory cell increases, the reading speed of the semiconductor memory device can be increased.

In the case where the memory functional element includes an insulating film for separating between the film having the function of retaining charges and the channel region or the semiconductor layer, and the insulating film is thicker than the gate insulating film and has a thickness of 20 nm or less, the retaining characteristic can be improved without deteriorating the short channel effect of the memory cell. Consequently, even when the packing density of the semiconductor memory device is increased, sufficient retaining characteristic performance can be obtained.

The display of the present invention has the semiconductor memory device. Consequently, the nonvolatile memory cell can be used for storing information for correcting display variations after a display panel is manufactured, and the picture qualities of products of the displays can be made uniform. Moreover, a process of simultaneously forming the memory cell and the logic circuit part is simple, so that the manufacturing cost can be suppressed and a cheap and very-reliable display can be obtained.

Since the electronic apparatus, particularly, the portable electronic apparatus of the present invention has the semiconductor memory device, the process of simultaneously forming the memory part and the logic circuit part becomes easy. The operating speed of the electronic apparatus can be improved, and the manufacturing cost can be reduced. Moreover, the cheap and reliable display can be obtained.

Although the present invention has been described in terms of preferred embodiments, it will be appreciated that various modifications and alterations might be made by those skilled in the art without departing from the spirit and scope of the invention. The invention should therefore be measured in terms of the claims which follow.

What is claimed is:

1. A semiconductor memory device comprising:
a memory cell array in which memory cells are arranged in a matrix; a user interface circuit for accepting a command issued by an external user; and
an array control circuit for executing an operation on the memory cell array, wherein
the user interface circuit includes a command queue having a storage circuit for storing therein the accepted command and a logic circuit for generating a program memory address,
the array control circuit is connected to the user interface circuit to receive the program memory address from the user interface circuit, and includes a microcontroller and a program memory,
the program memory can be programmed by the external user to construct a code which can be selectively executed by the microcontroller,
the program memory address specifies location of a code to be executed by the microcontroller in the program memory,
the microcontroller is configured to execute an operation corresponding to the code in the program memory onto the memory cell array,
the memory cell includes a gate electrode formed over a semiconductor layer via a gate insulating film, a channel region disposed below the gate electrode, diffusion regions disposed on both sides of the channel region and having a conductive type opposite to that of the channel region, and memory functional elements formed on both sides of the gate electrode and having the function of retaining charges,
the memory functional element is formed from at least one of an insulating film including an insulator having the function of retaining charges, an insulating film including at least one conductor or semiconductor dot, or an insulating film including a ferroelectric film of which inner charge is polarized by an electric field and in which the polarized state is held, and
the memory cell is configured so that a programming operation, to the selected one of the memory functional elements formed on both sides of the gate electrode, can be executed independently from the other unselected one by controlling a voltage applied to the diffusion regions and the gate electrode.

2. The semiconductor memory device according to claim 1, wherein the user interface circuit includes a command state machine for accepting the command to be executed, and
the command state machine activates the array control circuit to receive the program memory address for executing the command and the code.

3. The semiconductor memory device according to claim 1, wherein
the user interface circuit includes a jump table for specifying an offset vector into the program memory in the array control circuit for each of commands executed by the array control circuit, and
the offset vector instructs the location of the code to be executed in response to the command.

4. The semiconductor memory device according to claim 1, further comprising
at least one page buffer for receiving a code to be executed by the array control circuit in order to update the program memory and temporarily storing the code.

5. The semiconductor memory device according to claim 1, wherein
the commands include at least a command related to operation of programming/erasing data to/from the memory cell array.

6. The semiconductor memory device according to claim 1, wherein the memory functional element is formed so that at least a part thereof overlaps with a part of the diffusion region.

7. The semiconductor memory device according to claim 1, wherein
the memory functional element includes a film having the function of retaining charges, and
a surface of the film having the function of retaining charges is disposed almost parallel with a surface of the gate insulating film.

8. The semiconductor memory device according to claim 7, wherein
the film having the function of retaining charges is disposed almost parallel with a side face of the gate electrode.

9. The semiconductor memory device according to claim 7, wherein
the memory functional element includes an insulating film for separating between the film having the function of retaining charges and the channel region or the semiconductor layer, and
the insulating film is thinner than the gate insulating film and has a thickness of 0.8 nm or more.

10. The semiconductor memory device according to claim 7, wherein
the memory functional element includes an insulating film for separating between the film having the function of retaining charges and the channel region or the semiconductor layer, and
the insulating film is thicker than the gate insulating film and has a thickness of 20 nm or less.

11. A display comprising the semiconductor memory device according to claim 1.

12. A portable electronic apparatus comprising the semiconductor memory device according to claim 1.

* * * * *